(12) United States Patent
Masuyama et al.

(10) Patent No.: US 11,261,273 B2
(45) Date of Patent: Mar. 1, 2022

(54) RESIN, RESIST COMPOSITION AND METHOD FOR PRODUCING RESIST PATTERN

(71) Applicant: SUMITOMO CHEMICAL COMPANY, LIMITED, Tokyo (JP)

(72) Inventors: Tatsuro Masuyama, Osaka (JP); Satoshi Yamaguchi, Osaka (JP); Koji Ichikawa, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 191 days.

(21) Appl. No.: 16/465,230

(22) PCT Filed: Dec. 7, 2017

(86) PCT No.: PCT/JP2017/044030
§ 371 (c)(1),
(2) Date: May 30, 2019

(87) PCT Pub. No.: WO2018/110429
PCT Pub. Date: Jun. 21, 2018

(65) Prior Publication Data
US 2020/0010594 A1    Jan. 9, 2020

(30) Foreign Application Priority Data
Dec. 14, 2016    (JP) .............................. JP2016-242645

(51) Int. Cl.
*C08F 220/28* (2006.01)
*C08F 12/34* (2006.01)
(Continued)

(52) U.S. Cl.
CPC ............ *C08F 220/28* (2013.01); *C08F 12/34* (2013.01); *C08F 220/30* (2013.01);
(Continued)

(58) Field of Classification Search
CPC ............................ G03F 7/0045; C07C 381/12
See application file for complete search history.

(56) References Cited

U.S. PATENT DOCUMENTS 6,008,265 A     12/1999  Vallee et al.
9,221,742 B2*   12/2015  Ohashi .................. G03F 7/0045
(Continued)

FOREIGN PATENT DOCUMENTS

| | | |
|---|---|---|
| CN | 1376662 A | 10/2002 |
| JP | H10226707 A | 8/1998 |

(Continued)

OTHER PUBLICATIONS

Machine translation of JP 2000-128930 (no date).*
(Continued)

Primary Examiner — Amanda C. Walke
(74) Attorney, Agent, or Firm — Buchanan Ingersoll & Rooney PC

(57) ABSTRACT

Disclosed is a resin comprising a structural unit derived from a compound represented by formula (I') and a structural unit having an acid-labile group:

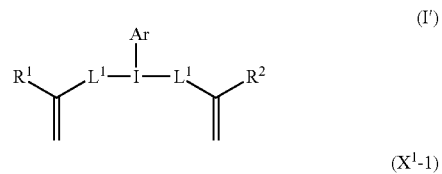

(I')

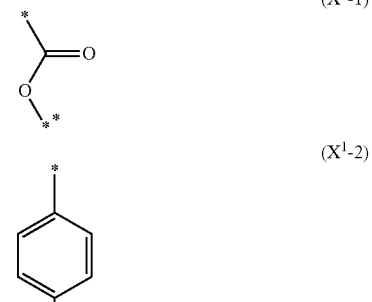

($X^1$-1)

($X^1$-2)

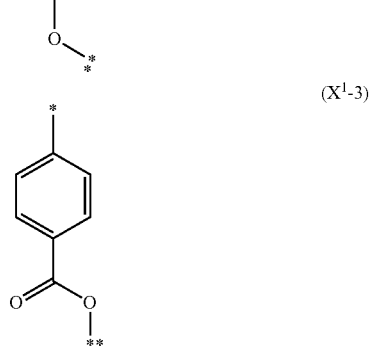

($X^1$-3)

($X^1$-4)

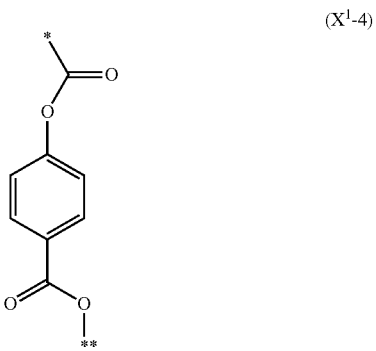

($X^1$-5)

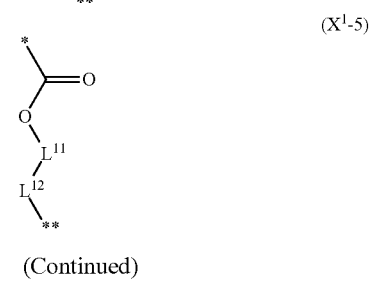

(Continued)

-continued

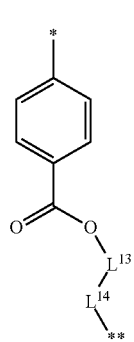
(X¹-6)

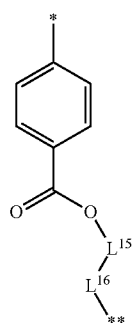

(X¹-7)

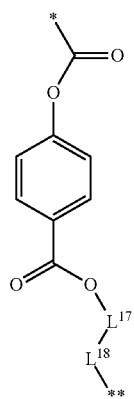

(X¹-8)

wherein $R^1$ and $R^2$ each independently represent an alkyl group which may have a halogen atom, a hydrogen atom or a halogen atom, Ar represents an aromatic hydrocarbon group which may have a substituent, $L^1$ represents a group represented by formula (X¹-1), etc., $L^{11}$, $L^{13}$, $L^{15}$ and $L^{17}$ each independently represent an alkanediyl group, $L^{12}$, $L^{14}$, $L^{16}$ and $L^{18}$ each independently represent —O—, —CO—, —CO—O—, —O—CO— or —O—CO—O—, and

* and  are bonds, and  represents a bond to an iodine atom.

12 Claims, No Drawings

(51) Int. Cl.
| | | |
|---|---|---|
| C08F 220/30 | (2006.01) | |
| C08F 220/38 | (2006.01) | |
| G03F 7/004 | (2006.01) | |
| G03F 7/039 | (2006.01) | |
| G03F 7/20 | (2006.01) | |

(52) U.S. Cl.
CPC .......... *C08F 220/38* (2013.01); *G03F 7/0045* (2013.01); *G03F 7/039* (2013.01); *G03F 7/20* (2013.01); *C08F 220/282* (2020.02); *C08F 220/283* (2020.02); *C08F 220/303* (2020.02); *C08F 220/305* (2020.02); *C08F 220/382* (2020.02)

(56) References Cited

U.S. PATENT DOCUMENTS

| | | | |
|---|---|---|---|
| 9,334,352 B2 * | 5/2016 | Someya | C08F 212/32 |
| 9,575,408 B2 * | 2/2017 | Ochiai | G03F 7/0046 |
| 9,605,347 B2 * | 3/2017 | Moon | C23C 16/56 |
| 9,879,035 B2 * | 1/2018 | Kwack | C09D 133/10 |
| 2010/0203446 A1 | 8/2010 | Ichikawa et al. | |
| 2012/0136131 A1 | 5/2012 | Goto et al. | |
| 2014/0141373 A1 * | 5/2014 | Utsumi | G03F 7/0397 |
| | | | 430/281.1 |
| 2015/0248052 A1 | 9/2015 | Masuyama et al. | |

FOREIGN PATENT DOCUMENTS

| | | | | |
|---|---|---|---|---|
| JP | 2000128930 A | * | 5/2000 | |
| JP | 2003113131 A | | 4/2003 | |
| JP | 2004037789 A | * | 2/2004 | |
| JP | 2004-091613 A | | 3/2004 | |
| JP | 2011256357 A | | 12/2011 | |
| JP | 2012017399 A | | 1/2012 | |
| JP | 2015180928 A | | 10/2015 | |
| WO | WO-2010101033 A1 | * | 9/2010 | C08F 12/32 |
| WO | 2010140372 A1 | | 12/2010 | |

OTHER PUBLICATIONS

Guo et al., "Gold-Catalyzed, Iodine(III)-Mediated Direct Acyloxylation of the Unactivated C(sp3)—H Bonds of Methyl Sulfides", European Journal of Organic Chemistry, Wiley-VCH Verlag GmbH & Co. KGaA, Weinheim, 2016, No. 25, pp. 4260-4264.

Han et al., "Carboxylic Acids as Latent Initiators of Radical Polymerization Carried Out in the Presence of Hypervalent Iodine Compounds: Synthesis of Branched and Transiently Crosslinked Polymers", Polymer Chemistry, The Royal Society of Chemistry, 2012, vol. 3, No. 7, pp. 1910-1917.

CAS : 1393687-20-1.

International Search Report (PCT/ISA/210) with translation and Written Opinion (PCT/ISA/237) dated Mar. 6, 2018, by the Japanese Patent Office as the International Searching Authority for International Application No. PCT/JP2017/044030.

Extended European Search Report dated Aug. 10, 2020, by the European Patent Office in corresponding European Application No. 17879787.4. (5 pages).

Examination Report dated Mar. 15, 2021, by the Taiwanese Patent Office in corresponding Taiwanese Patent Application No. 106143350 and an English translation of the Report. (7 pages).

Notice of Reasons for Refusal dated Aug. 27, 2021, by the Japanese Patent Office in corresponding Japanese Patent Application No. 2017-232872, and an English translation of the Notice. (6 pages).

* cited by examiner

RESIN, RESIST COMPOSITION AND METHOD FOR PRODUCING RESIST PATTERN

TECHNICAL FIELD

The present invention relates to a resin, a resist composition containing the resin, a method for producing a resist pattern using the resist composition and the like.

BACKGROUND ART

Patent Document 1 mentions a compound of the following structural formula, a resin including a structural unit having an acid-labile group, and a resist composition comprising an acid generator.

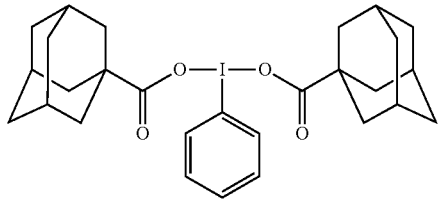

PRIOR ART DOCUMENT

Patent Document

Patent Document 1: JP 2015-180928 A

DISCLOSURE OF THE INVENTION

Problems to be Solved by the Invention

There has been required a composition capable of obtaining a resist pattern with satisfactory line edge roughness (LER).

Means or Solving the Problems

The present invention includes the following inventions.
[1] A resin comprising a structural unit derived from a compound represented by formula (I'):

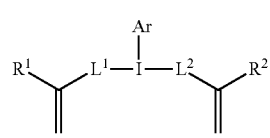
(I')

wherein, in formula (I'),
$R^1$ and $R^2$ each independently represent an alkyl group having 1 to 6 carbon atoms which may have a halogen atom, a hydrogen atom or a halogen atom,
Ar represents an aromatic hydrocarbon group having 6 to 24 carbon atoms which may have a substituent, and
$L^1$ and $L^2$ each independently represent a group represented by any one of formula ($X^1$-1) to formula ($X^1$-8):

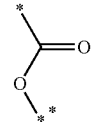
($X^1$-1)

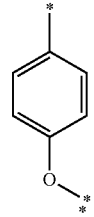
($X^1$-2)

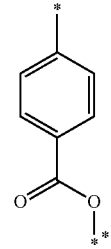
($X^1$-3)

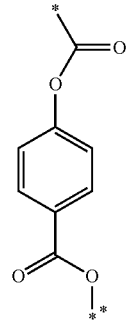
($X^1$-4)

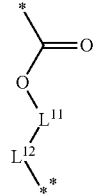
($X^1$-5)

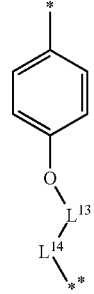
($X^1$-6)

-continued

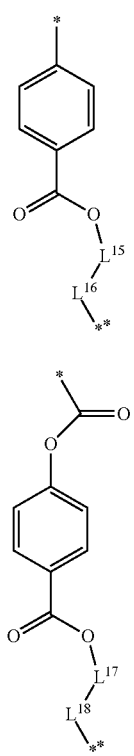

(X¹-7)

(X¹-8)

(wherein, in formula (X¹-5) to formula (X¹-8), $L^{11}$, $L^{13}$, $L^{15}$ and $L^{17}$ each independently represent an alkanediyl group having 1 to 6 carbon atoms, $L^{12}$, $L^{14}$, $L^{16}$ and $L^{18}$ each independently represent —O—, —CO—, —CO—O—, —O—CO— or —O—CO—O—, and

* and  are bonds, and  represents a bond to an iodine atom).

[2] The resin according to [1], further comprising a structural unit having an acid-labile group.

[3] The resin according to [2], further comprising a structural unit which is decomposed upon exposure to radiation to generate an acid.

[4] A resist composition comprising the resin according to any one of [1] to [3] and an acid generator.

[5] The resist composition comprising the resin according to [3].

[6] The resist composition according to [4] or [5], further comprising a salt generating an acid having an acidity lower than that of an acid generated from the acid generator.

[7] A method for producing a resist pattern, which comprises:

(1) a step of applying the resist composition according to [4] or [5] on a substrate, (2) a step of drying the applied composition to form a composition layer, (3) a step of exposing the composition layer, (4) a step of heating the exposed composition layer, and (5) a step of developing the heated composition layer.

Effects of the Invention

It is possible to form a resist pattern with satisfactory line edge roughness (LER) from a resist composition including a resin of the present invention.

MODE FOR CARRYING OUT THE INVENTION

In the present description, "(meth)acrylate" each means "at least one of acrylate and methacrylate". Descriptions such as "(meth)acrylic acid" and "(meth)acryloyl" also have the same meanings.

Unless otherwise specified, like "aliphatic hydrocarbon group", groups capable of having a linear structure, a branched structure and/or a cyclic structure include all of these forms. "Aromatic hydrocarbon group" also includes a group in which a hydrocarbon group is bonded to an aromatic ring. When stereoisomers exist, all stereoisomers are included.

In the present description, "solid component of the resist composition" means the total amount of components in which the below-mentioned solvent (E) is removed from the total amount of the resist composition.

[Resin (A)]

A resin of the present invention includes a structural unit derived from a compound represented by formula (I') (hereinafter sometimes referred to as compound (I')) (hereinafter sometimes referred to as "structural unit (I)"). Hereinafter, the resin including a structural unit derived from the compound (I') is referred to as "resin (A)":

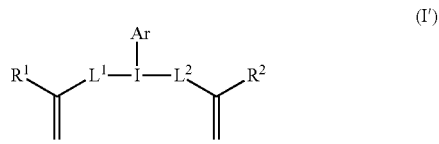

(I')

wherein, in formula (I'), $R^1$ and $R^2$ each independently represent an alkyl group having 1 to 6 carbon atoms which may have a halogen atom, a hydrogen atom or a halogen atom, Ar represents an aromatic hydrocarbon group having 6 to 24 carbon atoms which may have a substituent, and $L^1$ and $L^2$ each independently represent a group represented by any one of formula (X¹-1) to formula (X¹-8):

(X¹-1)

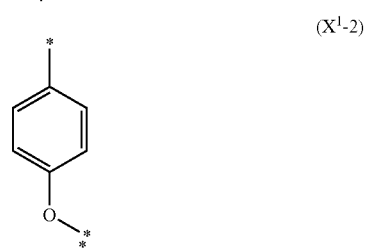

(X¹-2)

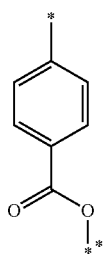 (X¹-3)

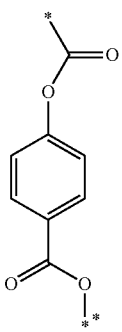 (X¹-4)

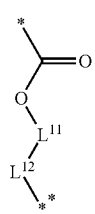 (X¹-5)

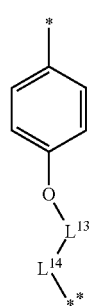 (X¹-6)

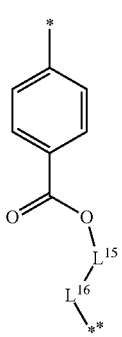 (X¹-7)

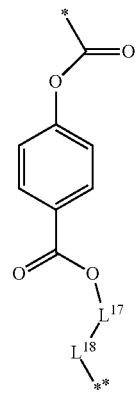 (X¹-8)

(wherein, in formula (X¹-5) to formula (X¹-8), $L^{11}$, $L^{13}$, $L^{15}$ and $L^{17}$ each independently represent an alkanediyl group having 1 to 6 carbon atoms, $L^{12}$, $L^{14}$, $L^{16}$ and $L^{18}$ each independently represent —O—, —CO—, —CO—O—, —O—CO— or —O—CO—O—, and

* and  are bonds, and  represents a bond to an iodine atom).

Examples of the alkyl group of $R^1$ and $R^2$ include a methyl group, an ethyl group, an n-propyl group, an isopropyl group, an n-butyl group, a sec-butyl group, a tert-butyl group, an n-pentyl group and an n-hexyl group, and the alkyl group is preferably an alkyl group having 1 to 4 carbon atoms, and more preferably a methyl group and an ethyl group.

Examples of the halogen atom of $R^1$ and $R^2$ include a fluorine atom, a chlorine atom, a bromine atom and an iodine atom.

Examples of the alkyl group having a halogen atom of $R^1$ and $R^2$ include a trifluoromethyl group, a perfluoroethyl group, a perfluoropropyl group, a perfluoroisopropyl group, a perfluorobutyl group, a perfluorosec-butyl group, a perfluorotert-butyl group, a perfluoropentyl group, a perfluorohexyl group, a perchloromethyl group, a perbromomethyl group and a periodomethyl group.

$R^1$ and $R^2$ are preferably a hydrogen atom or a methyl group.

Examples of the aromatic hydrocarbon group of Ar include aryl groups such as a phenyl group, a 1-naphthyl group, a 2-naphthyl group, an anthnyl group, a biphenyl group, an anthryl group, a phenanthryl group and a binaphthyl group; alkyl-aryl groups such as a dimethylphenyl group and an ethylphenyl group; and cycloalkyl-aryl groups such as a 4-cyclohexylphenyl group. The aromatic hydrocarbon group preferably has 6 to 14 carbon atoms, and more preferably 6 to 10 carbon atoms.

Examples of the substituent include a hydroxy group, a nitro group, a halogen atom, a cyano group, an alkoxy group having 1 to 12 carbon atoms or a carboxyl group. Of these substituents, a hydroxy group, a nitro group, a halogen atom, a cyano group or an alkoxy group having 1 to 12 carbon atoms is preferable.

Examples of the halogen atom include a fluorine atom, a chlorine atom, a bromine atom, an iodine atom and the like.

Examples of the alkoxy group having 1 to 12 carbon atoms include a methoxy group, an ethoxy group, a propoxy group, a butoxy group, a pentyloxy group, a hexyloxy group, an octyloxy group, a 2-ethylhexyloxy group, a nonyloxy group, a decyloxy group, an undecyloxy group, a dodecyloxy group and the like.

Ar is preferably a phenyl group which may have a substituent, more preferably a phenyl group which may have a hydroxy group, a nitro group, a halogen atom, a cyano group, an alkyl group having 1 to 12 carbon atoms, an alicyclic hydrocarbon group having 3 to 12 carbon atoms or an alkoxy group having 1 to 12 carbon atoms, still more preferably a phenyl group which may have a hydroxy group, a nitro group, a halogen atom, a cyano group, an alkyl group having 1 to 12 carbon atoms or an alkoxy group having 1 to 12 carbon atoms, and yet more preferably a phenyl group which may have an alkoxy group having 1 to 12 carbon atoms.

Examples of the alkyl group having 1 to 12 carbon atoms include a methyl group, an ethyl group, a propyl group, an isopropyl group, a butyl group, a sec-butyl group, a tert-butyl group, a pentyl group, a hexyl group, an octyl group, a 2-ethylhexyl group, a nonyl group and the like.

Examples of the alicyclic hydrocarbon group having 3 to 12 carbon atoms include the following groups and a cyclohexylcyclohexyl group. * represents a bond to the ring.

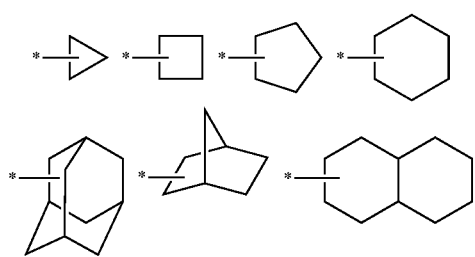

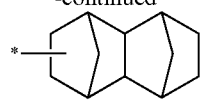
-continued
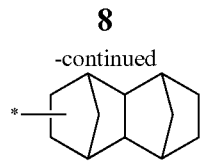

Examples of the alkanediyl group of $L^{11}$, $L^{13}$, $L^{15}$ and $L^{17}$ include a methylene group, an ethylene group, a propane-1,3-diyl group, a propane-1,2-diyl group, a butane-1,4-diyl group, a pentane-1,5-diyl group, a hexane-1,6-diyl group, a butane-1,3-diyl group, a 2-methylpropane-1,3-diyl group, a 2-methylpropane-1,2-diyl group, a pentane-1,4-diyl group and a 2-methylbutane-1,4-diyl group.

Of these, $L^1$ is preferably a group represented by formula ($X^1$-1) or a group represented by formula ($X^1$-4), and more preferably a group represented by formula ($X^1$-1).

The compound (I') is particularly preferably a compound represented by formula (I) in which $L^1$ and $L^2$ are a group represented by formula ($X^1$-1) (hereinafter sometimes referred to as compound (I)):

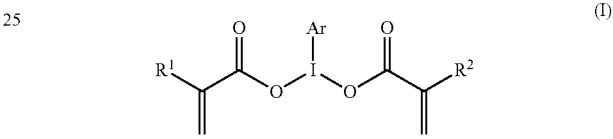
(I)

wherein, in formula (I), $R^1$, $R^2$ and Ar are the same as defined above.

Examples of the compound (I') include compounds represented by the following formulas.

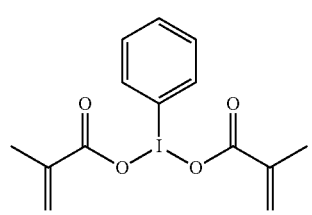
(I-1)

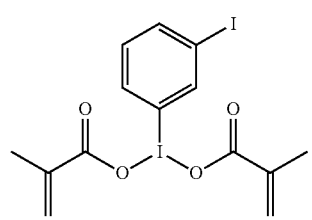
(I-2)

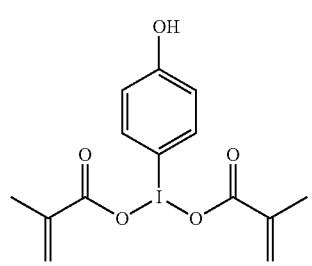
(I-3)

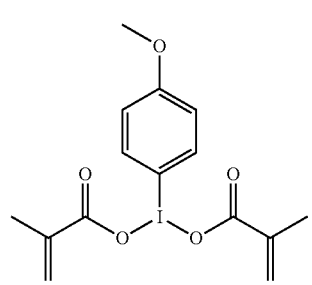
(I-4)

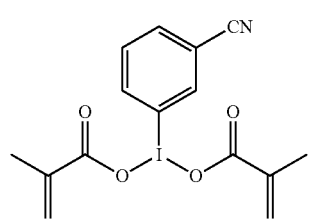
(I-5)

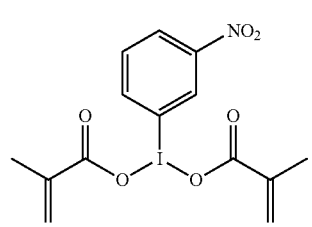
(I-6)

-continued
(I-7)
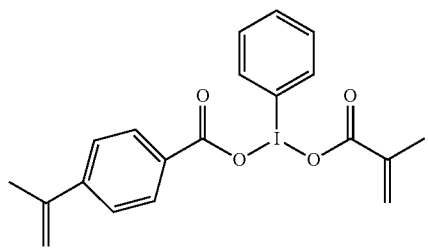
(I-8)
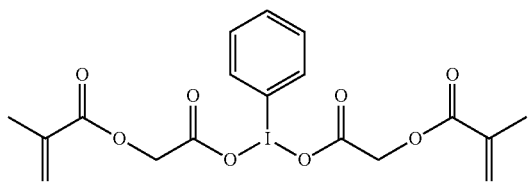
(I-9)
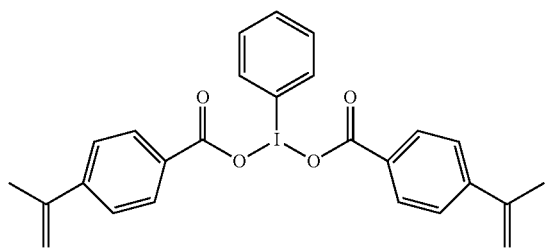
(I-10)
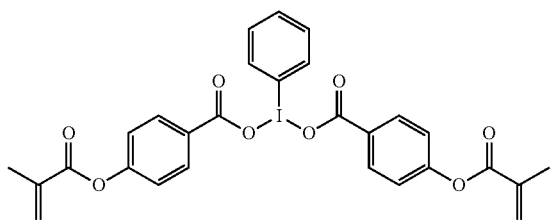
(I-11)
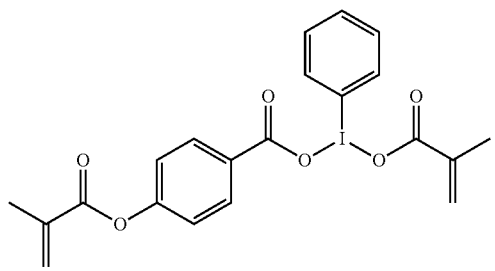
(I-12)
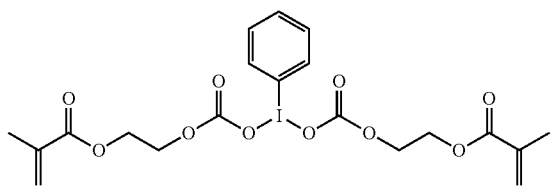
(I-13)
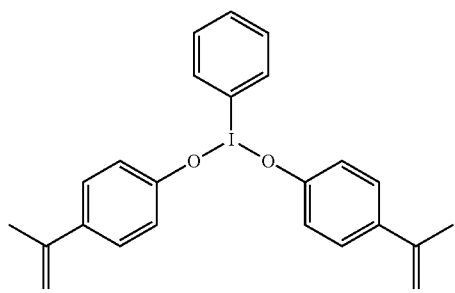
(I-14)
(I-15)
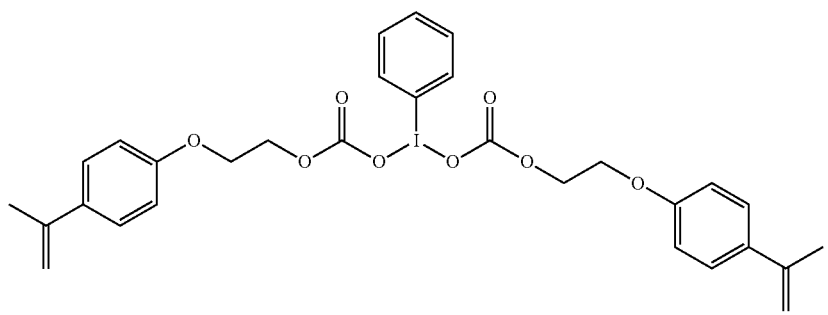

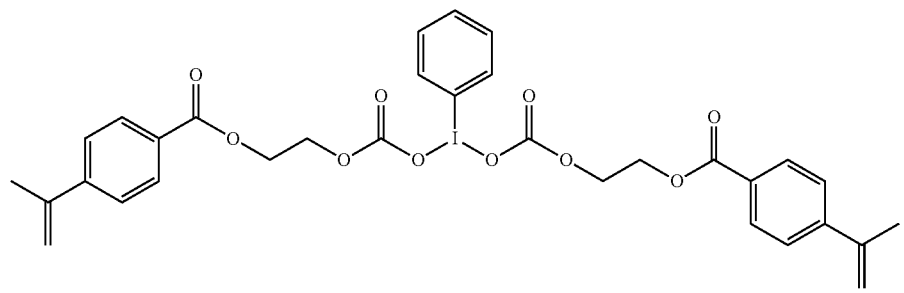

(I-16)

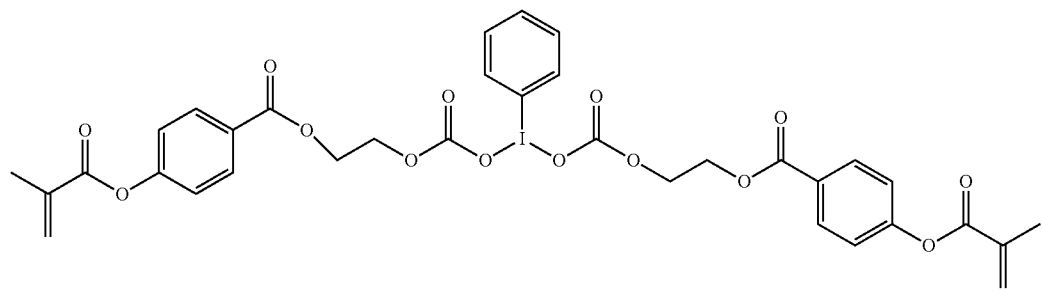

(I-17)

It is also possible to exemplify, as specific examples of the compound (I'), compounds represented by formula (I-1) to formula (I-17) in which both or either of methyl groups corresponding to $R^1$ and $R^2$ are substituted with a hydrogen atom.

<Method for Producing Compound (I')>

The compound (I') can be obtained by reacting a compound represented by formula (I-a), a compound represented by formula (I-b1) and a compound represented by formula (I-b2) in a solvent:

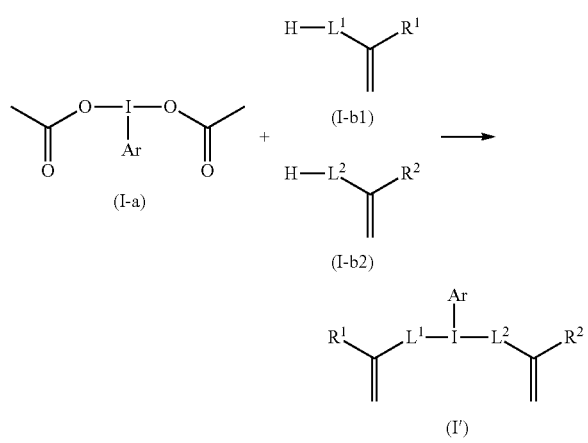

wherein $R^1$, $R^2$, $L^1$, $L^2$ and Ar are the same as defined above.

Examples of the solvent include chloroform, monochlorobenzene, tetrahydrofuran and toluene.

The reaction temperature is usually 10° C. to 80° C., and the reaction time is usually 0.5 to 24 hours.

The compound represented by formula (I-a) includes compounds represented by the following formulas and is easily available on the market.

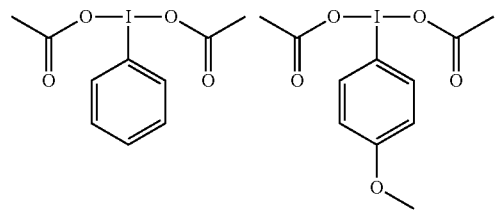

The compounds represented by formula (I-b1) and formula (I-b2) include compounds represented by the following formulas and are easily available on the market.

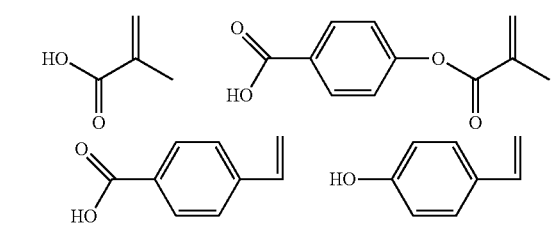

In the resin of the present invention (A), a structural unit derived from the compound (I') may be included may be included alone, or two or more structural units may be included. The content of the structural unit derived from the compound (I') is usually 0.5 to 10 mol %, preferably 1 to 8 mol %, more preferably 1.5 to 5 mol %, and still more preferably 2 to 4 mol %, based on the based on all the structural units of the resin.

It is preferable that the resin (A) includes, in addition to the structural unit derived from the compound (I'), a structural unit having an acid-labile group (hereinafter sometimes referred to as "structural unit (a1)"). The "acid-labile group" means a group having a leaving group which is eliminated by contact with an acid, thus converting into a group having hydrophilicity (e.g., a functional group having a hydroxy group or a carboxy group).

<Structural Unit (a1)>

The structural unit (a1) is derived from a monomer having an acid-labile group (hereinafter sometimes referred to as "monomer (a1)").

The acid-labile group contained in the resin (A) is preferably a group represented by formula (1) and/or formula (2):

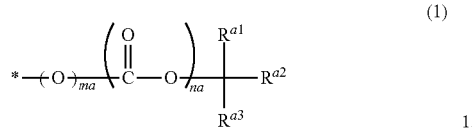
(1)

wherein, in formula (1), $R^{a1}$ to $R^{a3}$ each independently represent an alkyl group having 1 to 8 carbon atoms, an alicyclic hydrocarbon group having 3 to 20 carbon atoms or groups obtained by combining these groups, or $R^{a1}$ and $R^{a2}$ are bonded each other to form a divalent alicyclic hydrocarbon group having 3 to 20 carbon atoms together with carbon atoms to which $R^{a1}$ and $R^{a2}$ are bonded, ma and na each independently represent 0 or 1, and at least one of ma and na represents 1, and

* represents a bond:

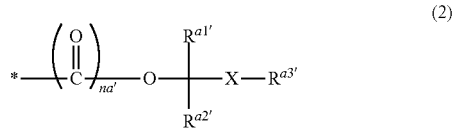
(2)

wherein, in formula (2), $R^{a1'}$ and $R^{a2'}$ each independently represent a hydrogen atom or a hydrocarbon group having 1 to 12 carbon atoms, $R^{a3'}$ represents a hydrocarbon group having 1 to 20 carbon atoms, or $R^{a2'}$ and $R^{a3'}$ are bonded each other to form a divalent heterocyclic group having 3 to 20 carbon atoms together with carbon atoms and X to which $R^{a2'}$ and $R^{a3'}$ are bonded, and —$CH_2$— included in the hydrocarbon group and the divalent heterocyclic group may be replaced by —O— or —S—, X represents an oxygen atom or a sulfur atom, na' represents 0 or 1, and

* represents a bond.

Examples of the alkyl group of $R^{a1}$ to $R^{a3}$ include a methyl group, an ethyl group, a propyl group, an n-butyl group, an n-pentyl group, an n-hexyl group, an n-heptyl group, an n-octyl group and the like.

The alicyclic hydrocarbon group of $R^{a1}$ to $R^{a3}$ may be any one of monocyclic, polycyclic and spiro ring, or may be either saturated or unsaturated. Examples of the monocyclic alicyclic hydrocarbon group include cycloalkyl groups such as a cyclopentyl group, a cyclohexyl group, a cycloheptyl group, a cyclooctyl group, a methylcyclohexyl group, a dimethylcyclohexyl group and a methylnorbornyl group. Examples of the polycyclic alicyclic hydrocarbon group include a decahydronaphthyl group, an adamantyl group, a norbornyl group, an adamantylcyclohexyl group and the following groups (* represents a bond). The number of carbon atoms of the alicyclic hydrocarbon group of $R^{a1}$ to $R^{a3}$ is preferably 3 to 16.

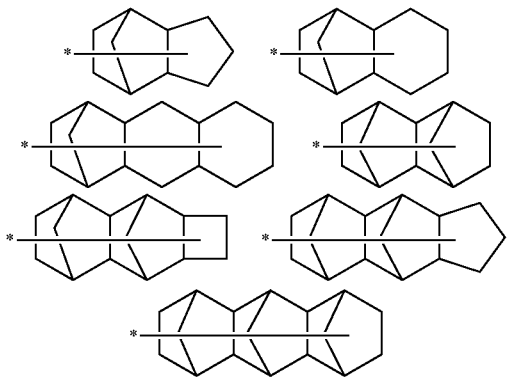

The group obtained by combining an alkyl group with an alicyclic hydrocarbon group includes, for example, cycloalkyl-alkyl groups such as a cyclohexylmethyl group, an adamantylmethyl group, an adamantyldimethyl group and a norbornylethyl group.

When $R^{a1}$ and $R^{a2}$ are bonded each other to form a divalent alicyclic hydrocarbon group, examples of —C($R^{a1}$)($R^{a2}$)($R^{a3}$) include the following rings. The divalent alicyclic hydrocarbon group preferably has 3 to 12 carbon atoms.

* represents a bond to —O—.

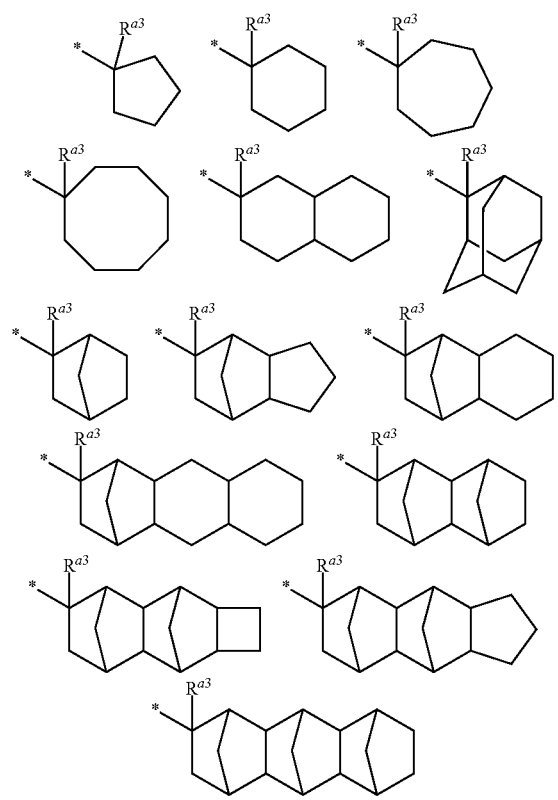

Examples of the hydrocarbon group of $R^{a1'}$ to $R^{a3'}$ include an alkyl group, an alicyclic hydrocarbon group, an aromatic hydrocarbon group and groups obtained by combining these groups.

Examples of the alkyl group and the alicyclic hydrocarbon group include those which are the same as mentioned above.

Examples of the aromatic hydrocarbon group include aryl groups such as a phenyl group, a naphthyl group, an anthryl group, a biphenyl group and a phenanthryl group; alkyl-aryl groups such as a tolyl group, a xylyl group, a cumenyl group, a mesityl group, a p-tert-butylphenyl group, a 2,6-diethylphenyl group and a 2-methyl-6-ethylphenyl group; and cycloalkyl-aryl groups such as a p-adamantylphenyl group.

Examples of the group obtained by combining an alkyl group, an alicyclic hydrocarbon group and an aromatic hydrocarbon group include a cycloalkyl-alkyl group (an adamantylmethyl group, an adamantylethyl group, a cyclohexylmethyl group, a cyclopentylmethyl group), an aralkyl group (e.g., a phenylmethyl group, a 1-phenylethyl group, a 2-phenylethyl group, a 1-phenyl-1-propyl group, a 1-phenyl-2-propyl group, a 2-phenyl-2-propyl group, a 3-phenyl-1-propyl group, a 4-phenyl-1-butyl group, a 5-phenyl-1-pentyl group, a 6-phenyl-1-hexyl group, etc.) and the like.

When $R^{a2'}$ and $R^{a3'}$ are bonded each other to form a divalent heterocyclic group together with carbon atoms and X to which $R^{a2'}$ and $R^{a3'}$ are bonded, examples of —C($R^{a1'}$)($R^{a3'}$)—X—$R^{a2'}$ include the following groups. * represents a bond.

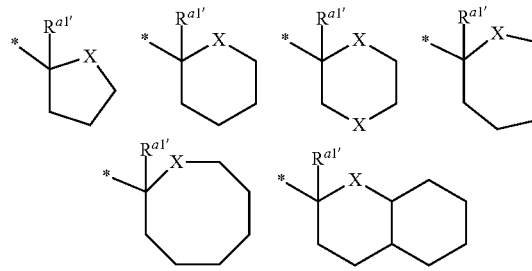

Of $R^{a1'}$ and $R^{a2'}$, at least one is preferably a hydrogen atom.

na' is preferably 0.

Examples of the group represented by formula (1) include a 1,1-dialkylalkoxycarbonyl group (in formula (1), $R^{a1}$ to $R^{a3}$ are an alkyl group, ma=0, na=1, preferably a tert-butoxycarbonyl group), a 2-alkyladamanthan-2-yloxycarbonyl group (in formula (1), $R^{a1}$, $R^{a2}$ and carbon atoms to which $R^{a1}$ and $R^{a2}$ are bonded are an adamantyl group, $R^{a3}$ is an alkyl group, ma=0, na=1) and 1-(adamanthan-1-yl)-1-alkylalkoxycarbonyl group (in formula (1), $R^{a1}$ and $R^{a2}$ are an alkyl group, $R^{a3}$ is an adamantyl group, ma=0, na=1) and the like, and the following groups. * represents a bond.

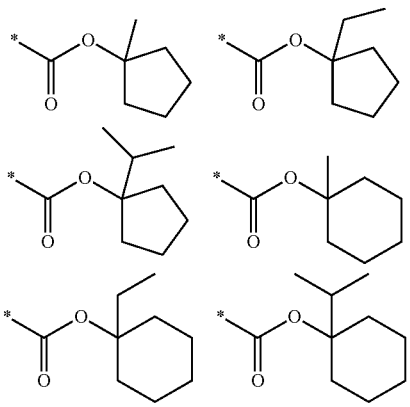

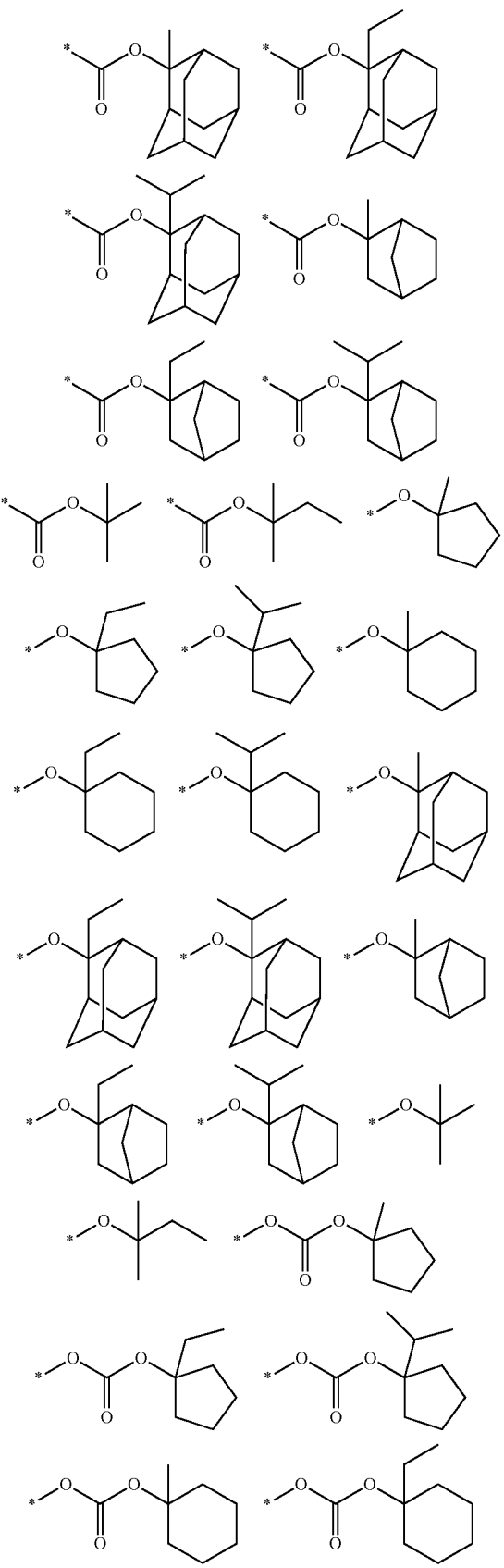

-continued

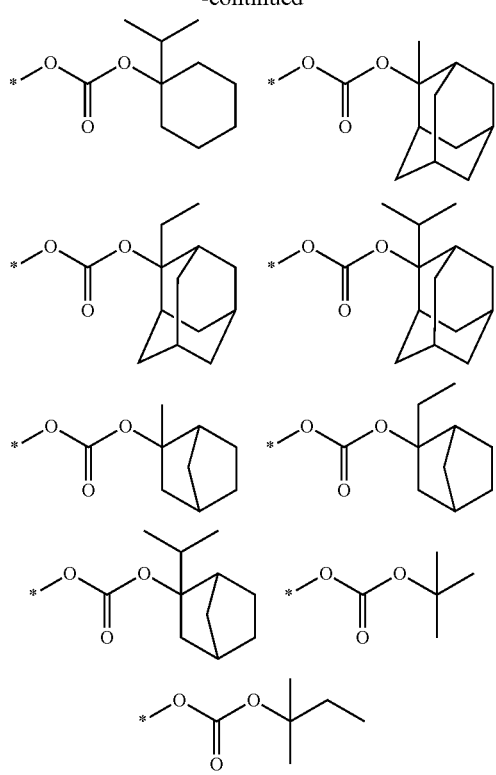

Specific examples of the group represented by formula (2) include the following groups. * represents a bond.

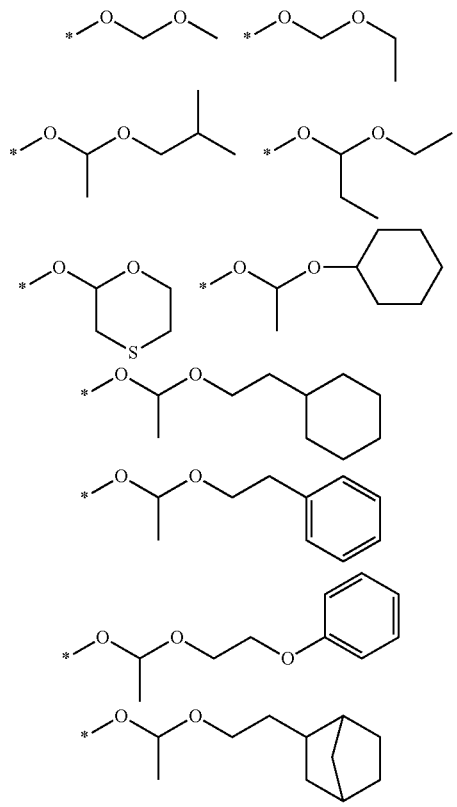

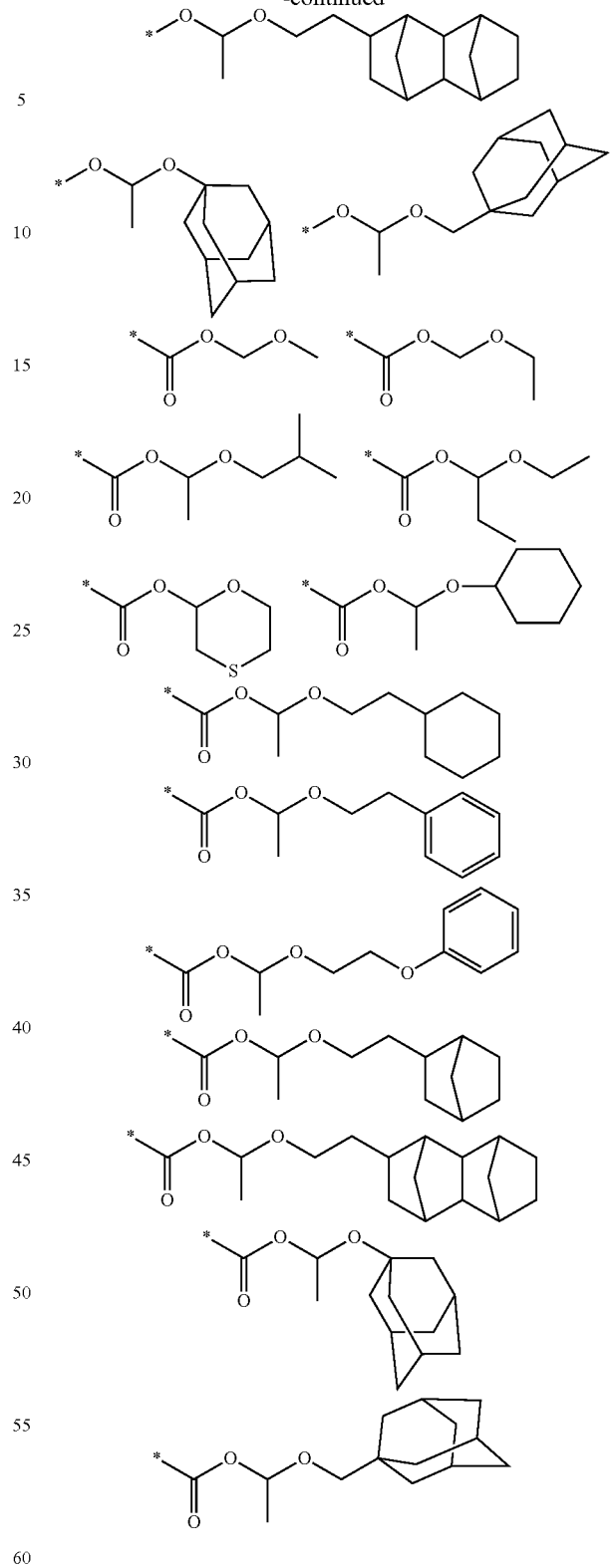

The monomer (a1) is preferably a monomer having an acid-labile group and an ethylenic unsaturated bond, and more preferably a (meth)acrylic monomer having an acid-labile group.

Of the (meth)acrylic monomers having an acid-labile group, those having an alicyclic hydrocarbon group having 5 to 20 carbon atoms are preferably exemplified. When a resin (A) including a structural unit derived from a monomer (a1) having a bulky structure such as an alicyclic hydrocarbon group is used in a resist composition, it is possible to improve the resolution of a resist pattern.

The structural unit derived from a (meth)acrylic monomer having a group represented by formula (1) is preferably a structural unit represented by formula (a1-0) (hereinafter sometimes referred to as structural unit (a1-0)), a structural unit represented by formula (a1-1) (hereinafter sometimes referred to as structural unit (a1-1)) or a structural unit represented by formula (a1-2) (hereinafter sometimes referred to as structural unit (a1-2)). These structural units may be used alone, or two or more structural units may be used in combination.

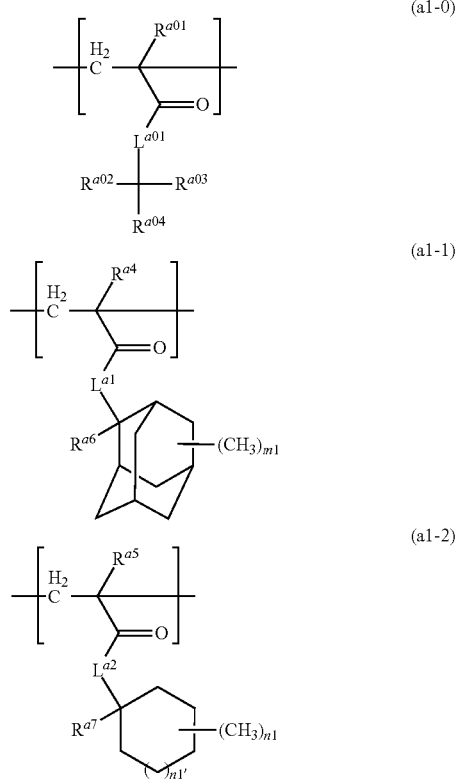

In formula (a1-0), formula (a1-1) and formula (a1-2), $L^{a01}$, $L^{a1}$ and $L^{a2}$ each independently represent —O— or *—O—$(CH_2)_{k1}$—CO—O—, k1 represents an integer of 1 to 7, and * represents a bond to —CO—, $R^{a01}$, $R^{a4}$ and $R^{a5}$ each independently represent a hydrogen atom or a methyl group, $R^{a02}$, $R^{a03}$ and $R^{a04}$ each independently represent an alkyl group having 1 to 8 carbon atoms, an alicyclic hydrocarbon group having 3 to 18 carbon atoms or groups obtained by combining these groups, $R^{a6}$ and $R^{a7}$ each independently represent an alkyl group having 1 to 8 carbon atoms, an alicyclic hydrocarbon group having 3 to 18 carbon atoms or groups obtained by combining these groups, m1 represents an integer of 0 to 14, n1 represents an integer of 0 to 10, and n1' represents an integer of 0 to 3.

$R^{a01}$, $R^{a4}$ and $R^{a5}$ are preferably a methyl group.

$L^{a01}$, $L^{a1}$ and $L^{a2}$ are preferably an oxygen atom or *—O—$(CH_2)_{k01}$—CO—O— (in which k01 is preferably an integer of 1 to 4, and more preferably 1), and more preferably an oxygen atom.

Examples of the alkyl group, the alicyclic hydrocarbon group and groups obtained by combining these groups in $R^{a02}$, $R^{a03}$ and $R^{a04}$ include the same groups as mentioned for $R^{a1}$ to $R^{a3}$ of formula (1).

The number of the carbon atoms of the alkyl group in $R^{a6}$ and $R^{a7}$ is preferably 1 to 6, more preferably a methyl group, an ethyl group or an isopropyl group, and still more preferably an ethyl group or an isopropyl group.

The number of carbon atoms of the alkyl group of $R^{a02}$, $R^{a03}$, $R^{a04}$, $R^{a6}$ and $R^{a7}$ is preferably 1 to 6, more preferably a methyl group or an ethyl group, and still more preferably a methyl group.

The number of carbon atoms of the alicyclic hydrocarbon group of $R^{a02}$, $R^{a03}$, $R^{a04}$, $R^{a6}$ and $R^{a7}$ is preferably 3 to 8, and more preferably 3 to 6.

The total number of carbon atoms of the group obtained by combining the alkyl group with the alicyclic hydrocarbon group is preferably 18 or less.

$R^{a02}$ and $R^{a03}$ are preferably an alkyl group having 1 to 6 carbon atoms, and more preferably a methyl group or an ethyl group.

$R^{a04}$ is preferably an alkyl group having 1 to 6 carbon atoms or an alicyclic hydrocarbon group having 5 to 12 carbon atoms, and more preferably a methyl group, an ethyl group, a cyclohexyl group or an adamantyl group.

m1 is preferably an integer of 0 to 3, and more preferably 0 or 1.

n1 is preferably an integer of 0 to 3, and more preferably 0 or 1.

n1' is preferably 0 or 1.

The structural unit (a1-0) includes, for example, a structural unit represented by any one of formula (a1-0-1) to formula (a1-0-12) and a structural unit in which a methyl group corresponding to $R^{a01}$ is substituted with a hydrogen atom and is preferably a structural unit represented by any one of formula (a1-0-1) to formula (a1-0-10).

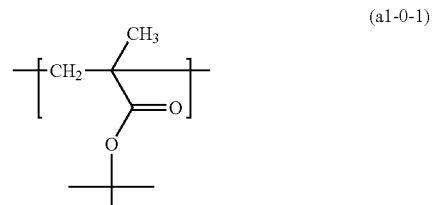

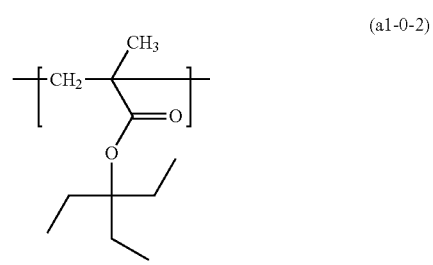

(a1-0-3) 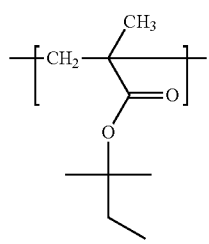
(a1-0-4) 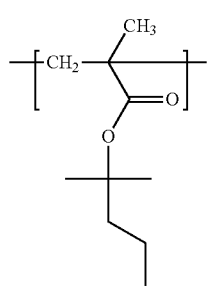
(a1-0-5) 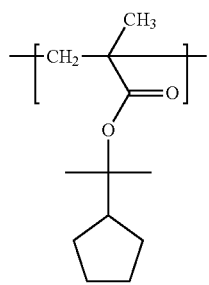
(a1-0-6) 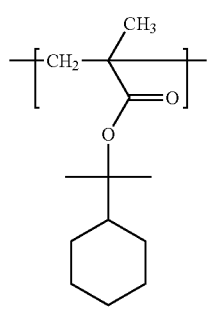
(a1-0-7) 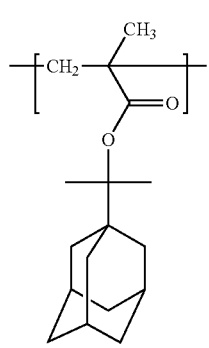
(a1-0-8) 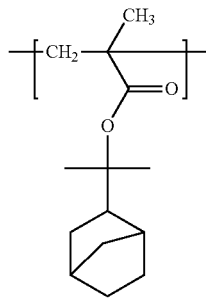
(a1-0-9) 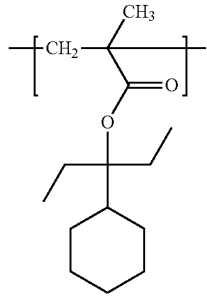
(a1-0-10) 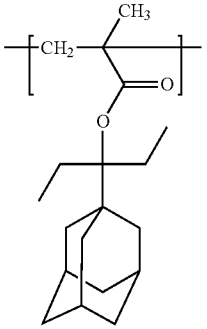
(a1-0-11) 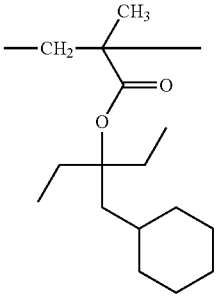
(a1-0-12) 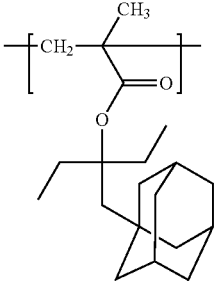
The monomer from which the structural unit (a1-1) is derived includes, for example, monomers mentioned in JP 2010-204646 A. Of these monomers, a structural unit represented by any one of formula (a1-1-1) to formula (a1-1-4)

and a structural unit in which a methyl group corresponding to $R^{a4}$ is substituted with a hydrogen atom are preferable, and a structural unit represented by any one of formula (a1-1-1) to formula (a1-4) is more preferable.

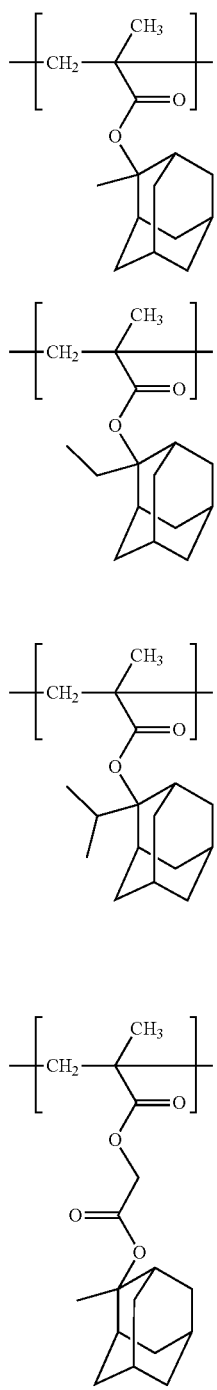

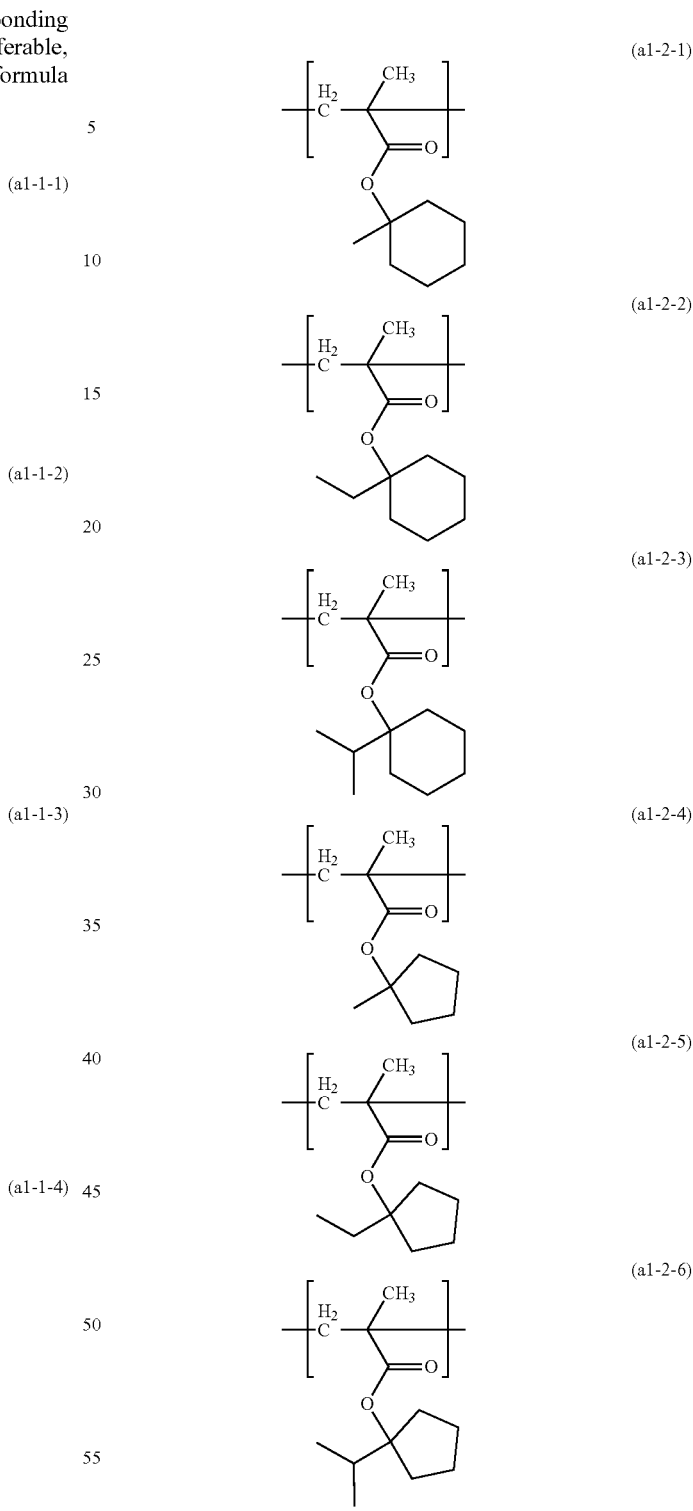

Examples of the structural unit (a1-2) include a structural unit represented by any one of formula (a1-2-1) to formula (a1-2-6) and a structural unit in which a methyl group corresponding to $R^{a5}$ is substituted with a hydrogen atom, and structural units represented by formula (a1-2-2), formula (a1-2-5) and formula (a1-2-6) are preferable.

When the resin (A) includes a structural unit (a1-0) and/or a structural unit (a1-1) and/or a structural unit (a1-2), the total content thereof is usually 10 to 95 mol %, preferably 15 to 90 mol %, and more preferably 20 to 85 mol %, based on all structural units of the resin (A).

The structural unit derived from a (meth)acrylic monomer having a group represented by formula (2) also includes a structural unit represented by formula (a1-5) (hereinafter sometimes referred to as "structural unit (a1-5)").

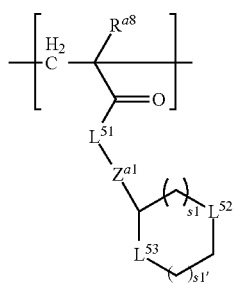
(a1-5)

In formula (a1-5),
$R^{a8}$ represents an alkyl group having 1 to 6 carbon atoms which may have a halogen atom, a hydrogen atom or a halogen atom, $Z^{a1}$ represents a single bond or *—$(CH_2)_{h3}$—CO-$L^{54}$-, h3 represents an integer of 1 to 4, and * represents a bond to $L^{51}$, $L^{51}$, $L^{52}$, $L^{53}$ and $L^{54}$ each independently represent —O— or —S—, s1 represents an integer of 1 to 3, and
s1' represents an integer of 0 to 3.

The halogen atom includes a fluorine atom and a chlorine atom and is preferably a fluorine atom.

Examples of the alkyl group having 1 to 6 carbon atoms which may have a halogen atom include a methyl group, an ethyl group, a propyl group, a butyl group, a pentyl group, a hexyl group, a heptyl group, an octyl group, a fluoromethyl group and a trifluoromethyl group.

In formula (a1-5), $R^{a8}$ is preferably a hydrogen atom, a methyl group or a trifluoromethyl group,
$L^{51}$ is preferably an oxygen atom,
one of $L^{52}$ and $L^{53}$ is preferably —O— and the other one is preferably —S—,
s1 is preferably 1,
s1' is preferably an integer of 0 to 2, and
$Z^{a1}$ is preferably a single bond or *—$CH_2$—CO—O—.

The monomer from which the structural unit (a1-5) is derived includes, for example, monomers mentioned in JP 2010-61117 A. Of these monomers, structural units represented by formula (a1-5-1) to formula (a1-5-4) are preferable, and structural units represented by formula (a1-5-1) or formula (a1-5-2) are more preferable.

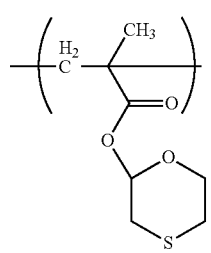
(a1-5-1)

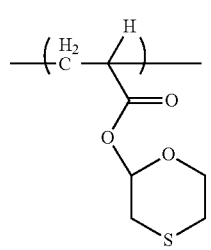
(a1-5-2)

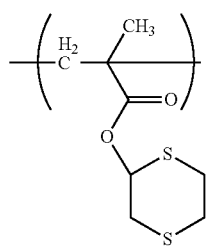
(a1-5-3)

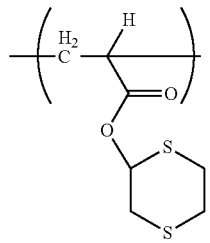
(a1-5-4)

When the resin (A) includes the structural unit (a1-5), the content is preferably 1 to 50 mol %, more preferably 3 to 45 mol %, still more preferably 5 to 40 mol %, based on all structural units of the resin (A).

The structural unit (a1) also includes the following structural units.

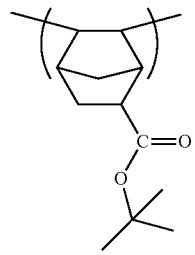
(a1-3-1)

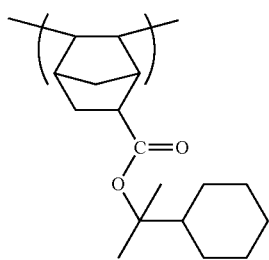
(a1-3-2)

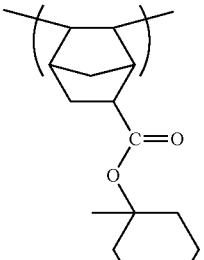
(a1-3-3)

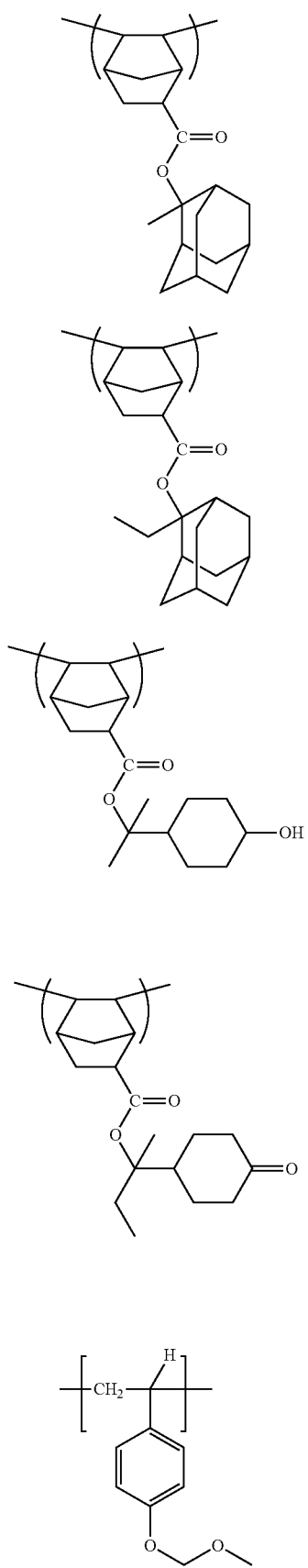

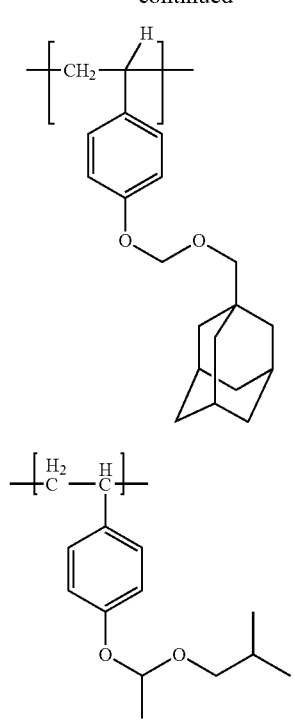

(a1-4-7)

(a1-4-8)

When the resin (A) includes the above-mentioned structural units, the content is preferably 10 to 95 mol %, more preferably 15 to 90 mol %, still more preferably 20 to 85 mol %, based on all structural units of the resin (A).

<Structural Unit(s)>

The resin (A) may further include a structural unit having no acid-labile group mentioned later (hereinafter sometimes referred to as "structural unit(s)"), a structural unit having a halogen atom (hereinafter sometimes referred to as "structural unit (a4)"), a structural unit (a5) having a non-leaving hydrocarbon group and structural units derived from other known monomers. Of these, the resin (A) includes a structural unit(s). The structural unit(s) is derived from a monomer having no acid-labile group mentioned later (hereinafter sometimes referred to as "monomer(s)"). It is possible to use, as the monomer(s), a monomer having no acid-labile group known in the resist field.

The structural unit(s) is preferably a structural unit having a hydroxy group or a lactone ring and having no acid-labile group. The structural unit(s) usually has no halogen atom in the side chain. When a resin including a structural unit having a hydroxy group and having no acid-labile group (hereinafter sometimes referred to as "structural unit (a2)") and/or a structural unit having a lactone ring and having no acid-labile group (hereinafter sometimes referred to as "structural unit (a3)") is used in the resist composition of the present invention, it is possible to improve the resolution of a resist pattern and the adhesion to a substrate.

<Structural Unit (a2)>

The hydroxy group possessed by the structural unit (a2) may be either an alcoholic hydroxy group or a phenolic hydroxy group.

When a resist pattern is produced from the resist composition of the present invention, in case an exposure source is high energy rays such as KrF excimer laser (248 nm), electron beam or extreme ultraviolet light (EUV), it is preferable to use a structural unit (a2) having a phenolic hydroxy group. In case the exposure source is ArF excimer laser (193 nm) or the like, a structural unit (a2) having an alcoholic hydroxy group is preferable. The structural unit (a2) may be included alone, or two or more structural units may be included.

Examples of the structural unit (a2) having a phenolic hydroxy group include a structural unit represented by formula (a2-A) (hereinafter sometimes referred to as "structural unit (a2-A)"):

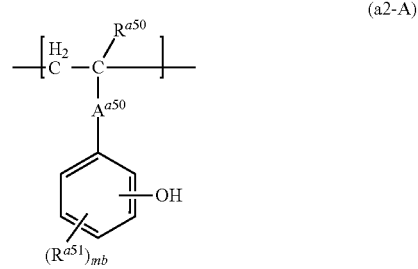

(a2-A)

wherein, in formula (a2-A), $R^{a50}$ represents a hydrogen atom, a halogen atom or an alkyl group having 1 to 6 carbon atoms which may have a halogen atom, $R^{a51}$ represents a halogen atom, a hydroxy group, an alkyl group having 1 to 6 carbon atoms, an alkoxy group having 1 to 6 carbon atoms, an acyl group having 2 to 4 carbon atoms, an acyloxy group having 2 to 4 carbon atoms, an acryloyloxy group or a methacryloyloxy group, $A^{a50}$ represents a single bond or *—$X^{a51}$-($A^{a52}$-$X^{a52}$)$_{na}$—, and * represents a bond to carbon atoms to which —$R^{a50}$ is bonded, $A^{a52}$ represents an alkanediyl group having 1 to 6 carbon atoms, $X^{a51}$ and $X^{a52}$ each independently represent —O—, —CO—O— or —O—CO—, na represents 0 or 1, and mb represents an integer of 0 to 4, and when mb is an integer of 2 or more, a plurality of $R^{a51}$ may be the same or different from each other.

Examples of the halogen atom in $R^{a50}$ include a fluorine atom, a chlorine atom and a bromine atom.

Examples of the alkyl group having 1 to 6 carbon atoms which may have a halogen atom in $R^{a50}$ include a trifluoromethyl group, a difluoromethyl group, a methyl group, a perfluoroethyl group, a 1,1,1-trifluoroethyl group, a 1,1,2,2-tetrafluoroethyl group, an ethyl group, a perfluoropropyl group, a 1,1,1,2,2-pentafluoropropyl group, a propyl group, a perfluorobutyl group, a 1,1,2,2,3,3,4,4-octafluorobutyl group, a butyl group, a perfluoropentyl group, a 1,1,1,2,2,3,3,4,4-nonafluoropentyl group, an n-pentyl group, an n-hexyl group and an n-perfluorohexyl group.

$R^{a50}$ is preferably a hydrogen atom or an alkyl group having 1 to 4 carbon atoms.

Examples of the alkyl group of $R^{a51}$ include a methyl group, an ethyl group, an n-propyl group, an isopropyl group, an n-butyl group, a sec-butyl group, a tert-butyl group, an n-pentyl group and an n-hexyl group.

Examples of the alkoxy group of $R^{a51}$ include a methoxy group, an ethoxy group, an n-propoxy group, an isopropoxy group, an n-butoxy group, a sec-butoxy group and a tert-butoxy group. An alkoxy group having 1 to 4 carbon atoms is preferable, a methoxy group or an ethoxy group is more preferable, and a methoxy group is still more preferable.

Examples of the acyl group in $R^{a51}$ include an acetyl group, a propionyl group and a butyryl group.

Examples of the acyloxy group in $R^{a51}$ include an acetyloxy group, a propionyloxy group and a butyryloxy group.

$R^{a51}$ is preferably a methyl group.

Examples of *—$X^{a51}$-($A^{a52}$-$X^{a52}$)$_{na}$— include *—O—, *—CO—O—, *—O—CO—, *—CO—O-$A^{a52}$-CO—O—, *—O—CO-$A^{a52}$-O—, *—O-$A^{a52}$-CO—O—, *—CO—O-$A^{a52}$-O—CO— and *—O—CO-$A^{a52}$-O—CO—. Of these, *—CO—O—, *—CO—O-$A^{a52}$-CO—O— or *—O-$A^{a52}$-CO—O— is preferable.

Examples of the alkanediyl group include a methylene group, an ethylene group, a propane-1,3-diyl group, a propane-1,2-diyl group, a butane-1,4-diyl group, a pentane-1,5-diyl group, a hexane-1,6-diyl group, a butane-1,3-diyl group, a 2-methylpropane-1,3-diyl group, a 2-methylpropane-1,2-diyl group, a pentane-1,4-diyl group and a 2-methylbutane-1,4-diyl group.

$A^{a52}$ is preferably a methylene group or an ethylene group.

$A^{a50}$ is preferably a single bond, *—CO—O— or *—CO—O-$A^{a52}$-CO—O—, more preferably a single bond, *—CO—O— or *—CO—O—CH$_2$—CO—O—, and still more preferably a single bond or *—CO—O—.

mb is preferably 0, 1 or 2, more preferably 0 or 1, and particularly preferably 0.

The hydroxyl group is preferably bonded to the o-position or the p-position of a benzene ring, and more preferably the p-position.

Examples of the structural unit (a2-A) include structural units represented by formula (a2-2-1) to formula (a2-2-8). The structural unit (a2-A) is preferably a structural unit represented by formula (a2-2-1), a structural unit represented by formula (a2-2-1), a structural unit represented by formula (a2-2-5), and a structural unit represented formula (a2-2-6).

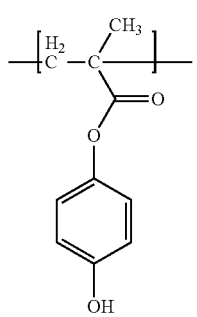

(a2-2-1)

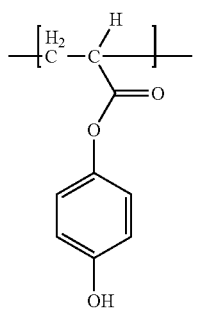

(a2-2-2)

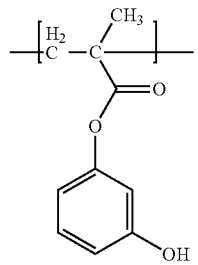

(a2-2-3)

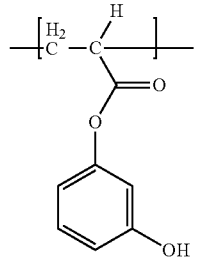

(a2-2-4)

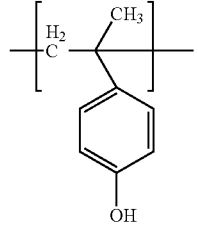

(a2-2-5)

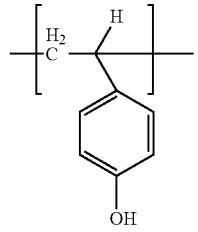

(a2-2-6)

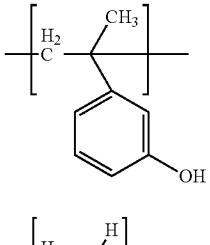

(a2-2-7)

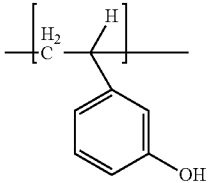

(a2-2-8)

Examples of the monomer from which the structural unit (a2-A) is derived include monomers mentioned in JP 2010-204634 A and JP 2012-12577 A.

When the structural unit (a2-A) is included in the resin (A), the content of the structural unit (a2-A) is preferably 5 to 80 mol %, more preferably 10 to 70 mol %, and still more preferably 15 to 65 mol %, based on all structural units.

Examples of the structural unit (a2) having an alcoholic hydroxy group include a structural unit represented by formula (a2-1) (hereinafter sometimes referred to as "structural unit (a2-1)").

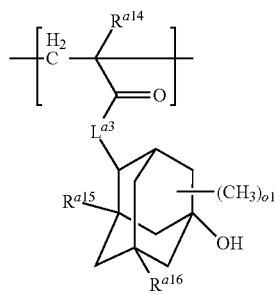
(a2-1)

In formula (a2-1),
$L^{a3}$ represents —O— or *—O—$(CH_2)_{k2}$—CO—O—,
k2 represents an integer of 1 to 7, and * represents a bond to —CO—,
$R^{a14}$ represents a hydrogen atom or a methyl group,
$R^{a15}$ and $R^{a16}$ each independently represent a hydrogen atom, a methyl group or a hydroxy group, and
o1 represents an integer of 0 to 10.
In formula (a2-1), $L^{a3}$ is preferably —O— or —O—$(CH_2)_{f1}$—CO—O— (f1 is an integer of 1 to 4), and more preferably —O—,
$R^{a14}$ is preferably a methyl group,
$R^{a15}$ is preferably a hydrogen atom,
$R^{a16}$ is preferably a hydrogen atom or a hydroxy group, and
o1 is preferably an integer of 0 to 3, and more preferably 0 or 1.

The structural unit (a2-1) includes, for example, structural units derived from the monomers mentioned in JP 2010-204646 A. A structural unit represented by any one of formula (a2-1-1) to formula (a2-1-6) is preferable.

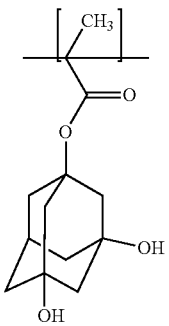
(a2-1-1)

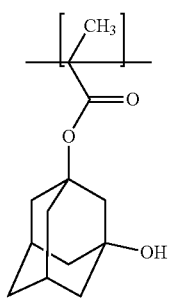
(a2-1-2)

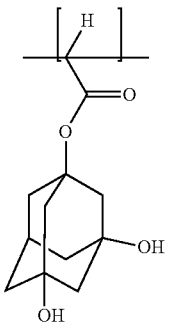
(a2-1-3)

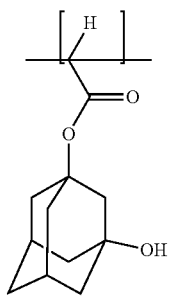
(a2-1-4)

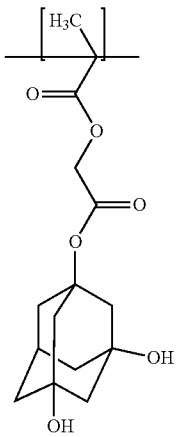
(a2-1-5)

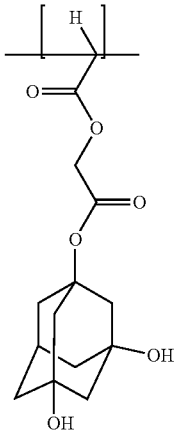
(a2-1-6)

When the resin (A) includes the structural unit (a2-1), the content is usually 1 to 45 mol %, preferably 1 to 40 mol %, more preferably 1 to 35 mol %, still more preferably 2 to 20 mol %, and yet more preferably 2 to 10 mol %, based on all structural units of the resin (A).

<Structural Unit (a3)>

The lactone ring possessed by the structural unit (a3) may be a monocyclic ring such as a β-propiolactone ring, a γ-butyrolactone ring or a δ-valerolactone ring, or a condensed ring of a monocyclic lactone ring and the other ring. Preferably, a γ-butyrolactone ring, an adamantanelactone ring or a bridged ring including a γ-butyrolactone ring structure is exemplified.

The structural unit (a3) is preferably a structural unit represented by formula (a3-1), formula (a3-2), formula (a3-3) or formula (a3-4). These structural units may be included alone, or two or more structural units may be included:

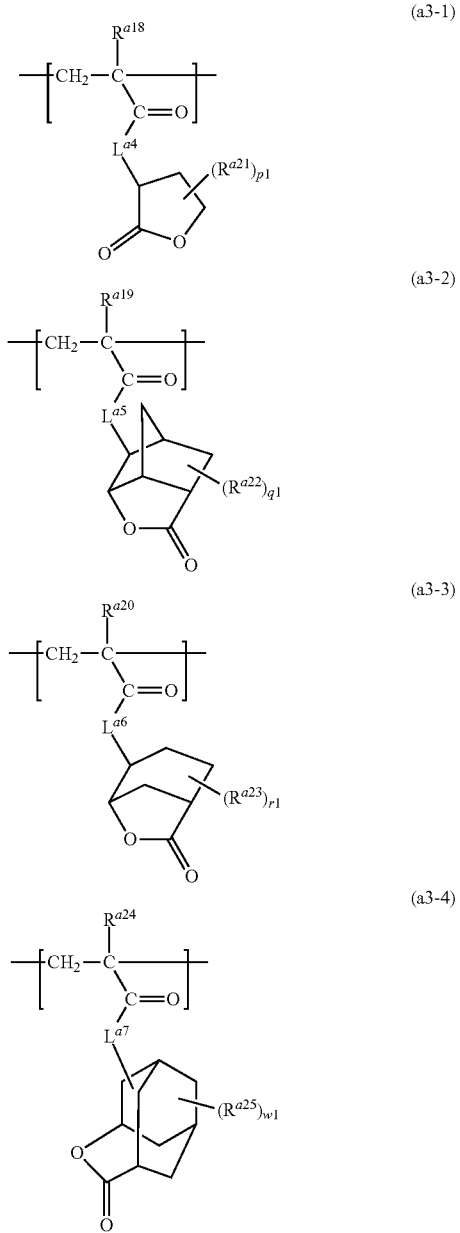

wherein, in formula (a3-1), formula (a3-2), formula (a3-3) and formula (a3-4), $L^{a4}$, $L^{a5}$ and $L^{a6}$ represent —O— or a group represented by *—O—$(CH_2)_{k3}$—CO—O— (k3 represents an integer of 1 to 7), $L^{a7}$ represents —O—, *—O-$L^{a8}$-O—, *—O-$L^{a8}$-CO—O—, *—O-$L^{a8}$-CO—O-$L^{a9}$-CO—O— or *—O-$L^{a8}$-O—CO-$L^{a9}$-O—, $L^{a8}$ and $L^{a9}$ each independently represent an alkanediyl group having 1 to 6 carbon atoms,

* represents a bond to a carbonyl group, $R^{a18}$, $R^{a19}$ and $R^{a20}$ represent a hydrogen atom or a methyl group, $R^{a24}$ represents an alkyl group having 1 to 6 carbon atoms which may have a halogen atom, a hydrogen atom or a halogen atom, $R^{a21}$ represents an aliphatic hydrocarbon group having 1 to 4 carbon atoms, $R^{a22}$, $R^{a23}$ and $R^{a25}$ represent a carboxy group, a cyano group or an aliphatic hydrocarbon group having 1 to 4 carbon atoms, p1 represents an integer of 0 to 5, q1 represents an integer of 0 to 3, r1 represents an integer of 0 to 3, w1 represents an integer of 0 to 8, and when p1, q1, r1 and/or w1 is/are 2 or more, a plurality of $R^{a21}$, $R^{a22}$, $R^{a23}$ and/or $R^{a25}$ may be the same or different from each other.

Examples of the aliphatic hydrocarbon group of $R^{a21}$, $R^{a22}$, $R^{a23}$ and $R^{a25}$ include alkyl groups such as a methyl group, an ethyl group, an n-propyl group, an isopropyl group, an n-butyl group, a sec-butyl group and a tert-butyl group.

Examples of the halogen atom of $R^{a24}$ include a fluorine atom, a chlorine atom, a bromine atom and an iodine atom.

Examples of the alkyl group of $R^{a24}$ include a methyl group, an ethyl group, an n-propyl group, an isopropyl group, an n-butyl group, a sec-butyl group, a tert-butyl group, an n-pentyl group and an n-hexyl group and the like, and the alkyl group is preferably an alkyl group having 1 to 4 carbon atoms, and more preferably a methyl group or an ethyl group.

Examples of the alkyl group having a halogen atom of $R^{a24}$ include a trifluoromethyl group, a perfluoroethyl group, a perfluoropropyl group, a perfluoroisopropyl group, a perfluorobutyl group, a perfluorosec-butyl group, a perfluoro-tert-butyl group, a perfluoropentyl group, a perfluorohexyl group, a trichloromethyl group, a tribromomethyl group, a triiodomethyl group and the like.

Examples of the alkanediyl group of $L^{a8}$ and $L^{a9}$ include a methylene group, an ethylene group, a propane-1,3-diyl group, a propane-1,2-diyl group, a butane-1,4-diyl group, a pentane-1,5-diyl group, a hexane-1,6-diyl group, a butane-1,3-diyl group, a 2-methylpropane-1,3-diyl group, a 2-methylpropane-1,2-diyl group, a pentane-1,4-diyl group and a 2-methylbutane-1,4-diyl group and the like.

In formula (a3-1) to formula (a3-3), preferably, $L^{a4}$ to $L^{a6}$ are each independently —O— or a group represented by *—O—$(CH_2)_{k3}$—CO—O— in which k3 is an integer of 1 to 4, more preferably —O— and *—O—$CH_2$—CO—O—, and still more preferably an oxygen atom, $R^{a18}$ to $R^{a21}$ are preferably a methyl group, preferably, $R^{a22}$ and $R^{a23}$ are each independently a carboxy group, a cyano group or a methyl group, and preferably, p1, q1, r1 and w1 are each independently an integer of 0 to 2, and more preferably 0 or 1.

In formula (a3-4), $R^{a24}$ is preferably a hydrogen atom or an alkyl group having 1 to 4 carbon atoms, more preferably a hydrogen atom, a methyl group or an ethyl group, and still more preferably a hydrogen atom or a methyl group, $R^{a25}$ is preferably a carboxy group, a cyano group or a methyl group, $L^{a7}$ is preferably —O— or *—O-$L^{a8}$-CO—O—, and more preferably —O—, —O—$CH_2$—CO—O— or —O—$C_2H_4$—CO—O—.

Particularly, formula (a3-4) is preferably formula (a3-4)':

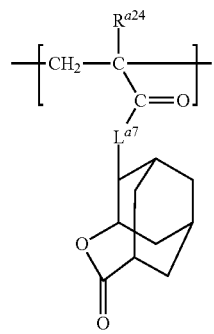

(a3-4)' wherein $R^{a24}$ and $L^{a7}$ are the same as defined above.

Examples of the monomer from which the structural unit (a3) is derived include monomers mentioned in JP 2010-204646 A and monomers mentioned in JP 2000-122294 A and the mentioned in JP 2012-41274 A. The structural unit (a3) is preferably a structural unit represented by any one of formula (a3-1-1) to formula (a3-1-4), formula (a3-2-1) to formula (a3-2-4), formula (a3-3-1) to formula (a3-3-4) and formula (a3-4-1) to formula (a3-4-12).

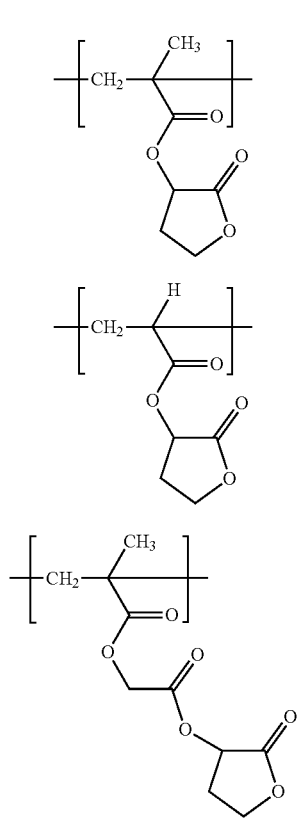

(a3-1-1)

(a3-1-2)

(a3-1-3)

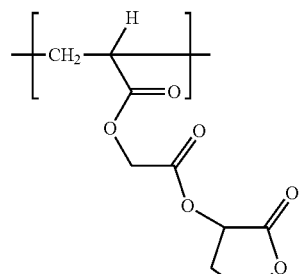

(a3-1-4)

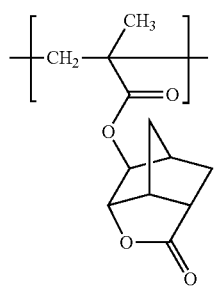

(a3-2-1)

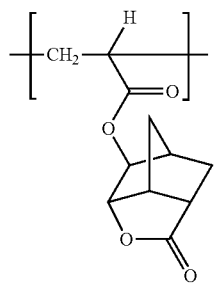

(a3-2-2)

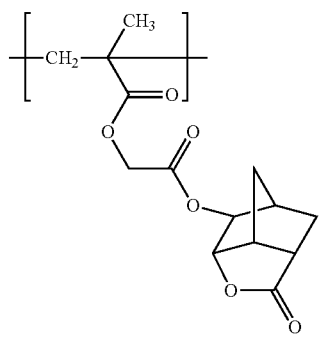

(a3-2-3)

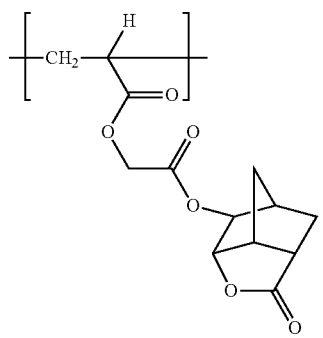

(a3-2-4)

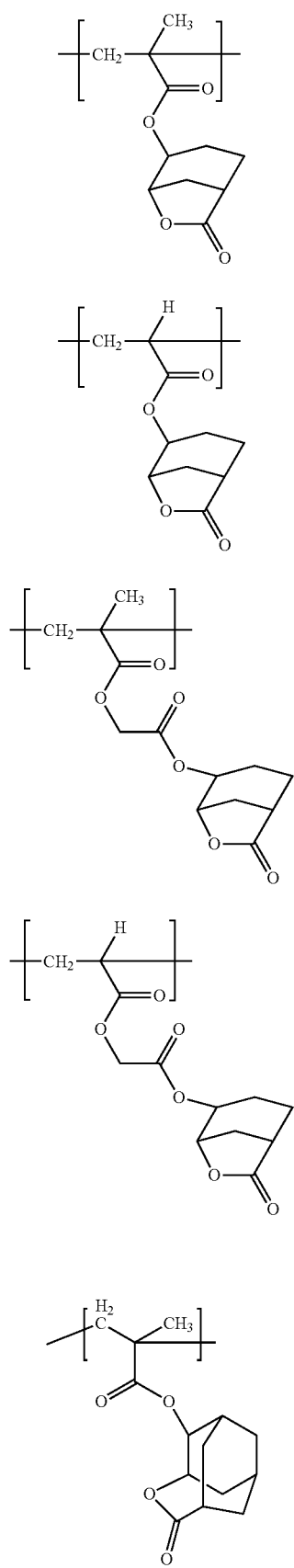
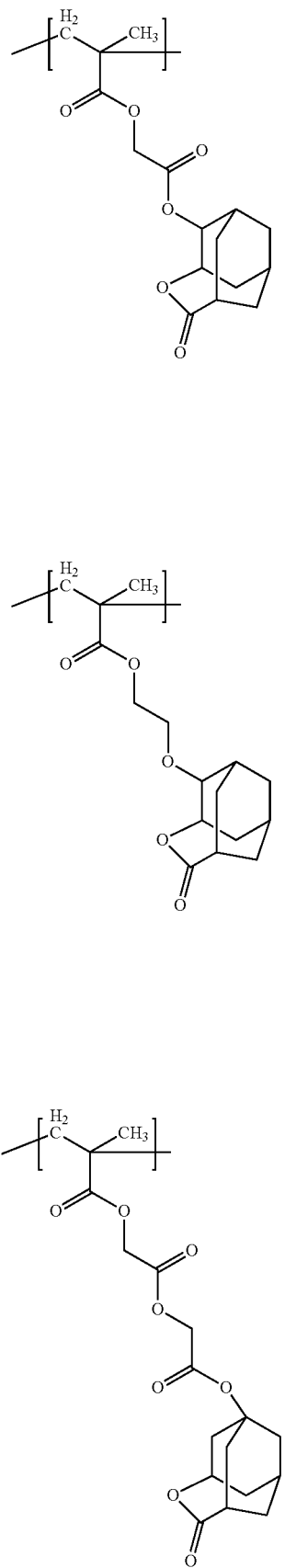

(a3-4-5)
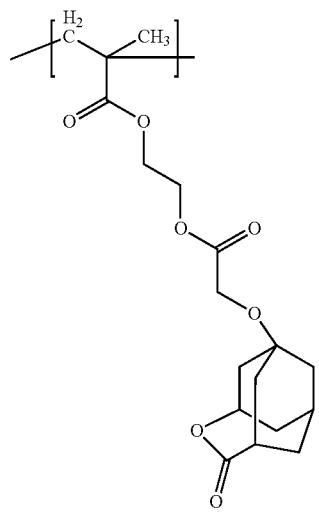
(a3-4-6)
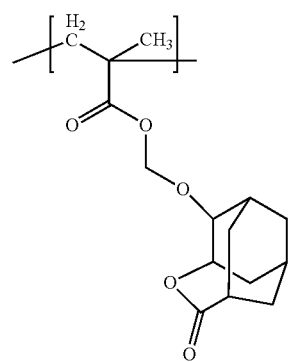
(a3-4-7)
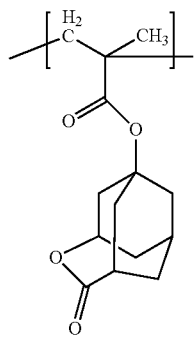
(a3-4-8)
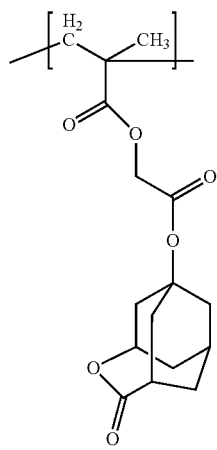
(a3-4-9)
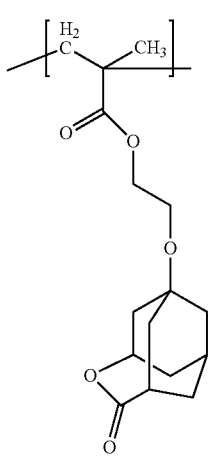
(a3-4-10)
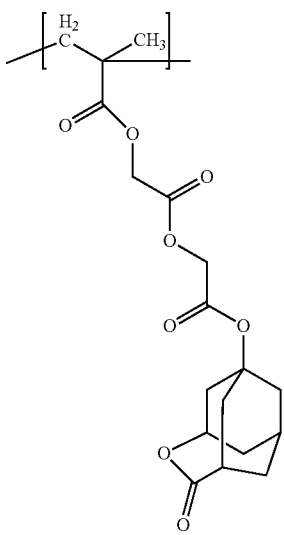
(a3-4-11)
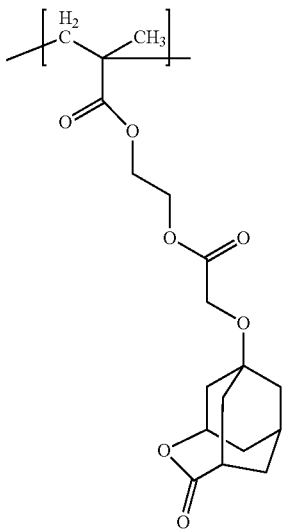

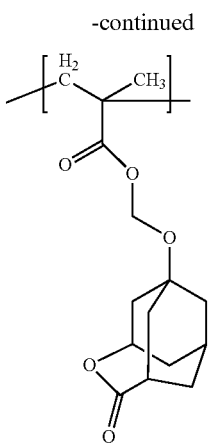

(a3-4-12)

It is possible to exemplify, as specific examples of the structural unit (a3-4), a compound in which a methyl group corresponding to $R^{a24}$ is substituted with a hydrogen atom in the structural units represented by formula (a3-4-1) to formula (a3-4-12).

When the resin (A) includes the structural unit (a3), the total content is usually 5 to 70 mol %, preferably 10 to 65 mol %, and more preferably 10 to 60 mol %, based on all structural units of the resin (A).

Each content of the structural unit (a3-1), the structural unit (a3-2), the structural unit (a3-3) and the structural unit (a3-4) is preferably 5 to 60 mol %, more preferably 5 to 50 mol %, and still more preferably 10 to 50 mol %, based on all structural units of the resin (A).

<Structural Unit (a4)>

The structural unit (a4) is preferably a structural unit having a fluorine atom. Examples of the structural unit (a4) include a structural unit represented by formula (a4-0):

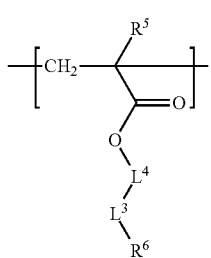

(a4-0)

wherein, in formula (a4-0), $R^5$ represents a hydrogen atom or a methyl group, $L^4$ represents a single bond or an aliphatic saturated hydrocarbon group having 1 to 4 carbon atoms, $L^3$ represents a perfluoroalkanediyl group having 1 to 8 carbon atoms or a perfluorocycloalkanediyl group having 3 to 12 carbon atoms, and $R^6$ represents a hydrogen atom or a fluorine atom.

Examples of the aliphatic saturated hydrocarbon group of $L^4$ include linear alkanediyl groups such as a methylene group, an ethylene group, a propane-1,3-diyl group and a butane-1,4-diyl group; and branched alkanediyl groups such as an ethane-1,1-diyl group, a propane-1,2-diyl group, a butane-1,3-diyl group, a 2-methylpropane-1,3-diyl group and a 2-methylpropane-1,2-diyl group.

Examples of the perfluoroalkanediyl group of $L^3$ include a difluoromethylene group, a perfluoroethylene group, a perfluoropropane-1,1-diyl group, a perfluoropropane-1,3-diyl group, a perfluoropropane-1,2-diyl group, a perfluoropropane-2,2-diyl group, a perfluorobutane-1,4-diyl group, a perfluorobutane-2,2-diyl group, a perfluorobutane-1,2-diyl group, a perfluoropentane-1,5-diyl group, a perfluoropentane-2,2-diyl group, a perfluoropentane-3,3-diyl group, a perfluorohexane-1,6-diyl group, a perfluorohexane-2,2-diyl group, a perfluorohexane-3,3-diyl group, a perfluoroheptane-1,7-diyl group, a perfluoroheptane-2,2-diyl group, a perfluoroheptane-3,4-diyl group, a perfluoroheptane-4,4-diyl group, a perfluorooctane-1,8-diyl group, a perfluorooctane-2,2-diyl group, a perfluorooctane-3,3-diyl group, a perfluorooctane-4,4-diyl group and the like.

Examples of the perfluorocycloalkanediyl group of $L^3$ include a perfluorocyclohexanediyl group, a perfluorocyclopentanediyl group, a perfluorocycloheptanediyl group, a perfluoroadamantanediyl group and the like.

$L^4$ is preferably a single bond, a methylene group or an ethylene group, and more preferably a single bond or a methylene group.

$L^3$ is preferably a perfluoroalkanediyl group having 1 to 6 carbon atoms, and more preferably a perfluoroalkanediyl group having 1 to 3 carbon atoms.

Examples of the structural unit (a4-0) include the following structural units, and structural units in which a methyl group corresponding to $R^5$ in the following structural units is substituted with a hydrogen atom:

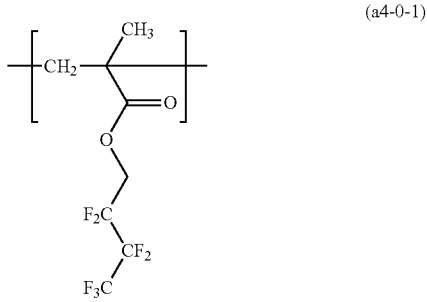

(a4-0-1)

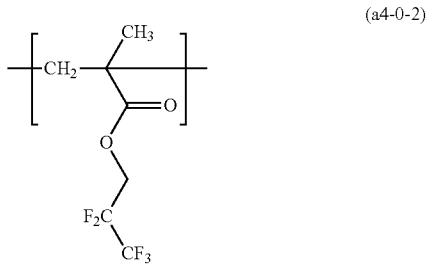

(a4-0-2)

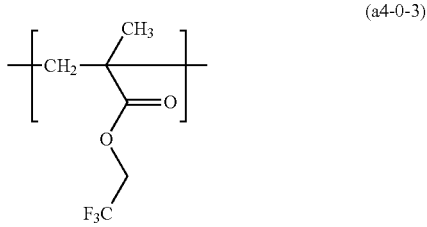

(a4-0-3)

-continued
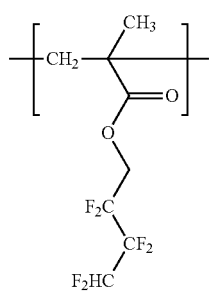
(a4-0-4)
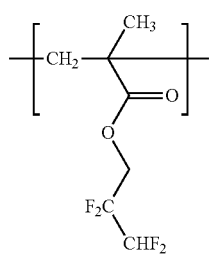
(a4-0-5)
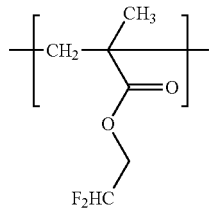
(a4-0-6)
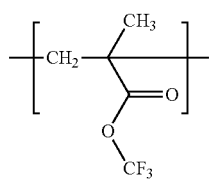
(a4-0-7)
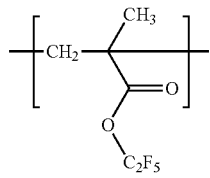
(a4-0-8)
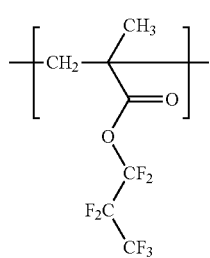
(a4-0-9)
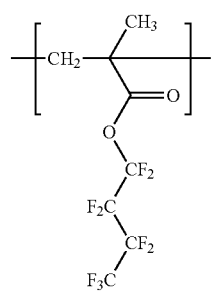
(a4-0-10)
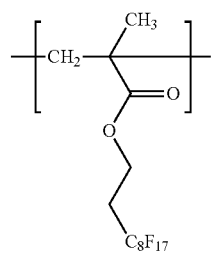
(a4-0-11)
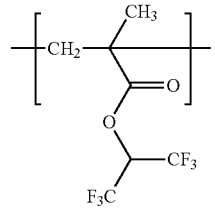
(a4-0-12)
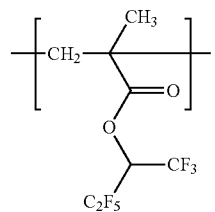
(a4-0-13)
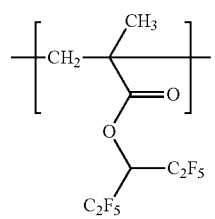
(a4-0-14)
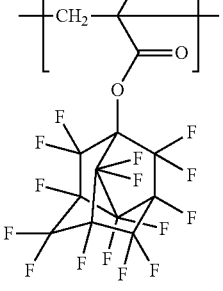
(a4-0-15)

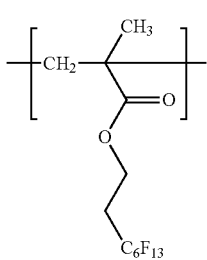

(a4-0-16)

Examples of the structural unit (a4) also include a structural unit represented by formula (a4-1):

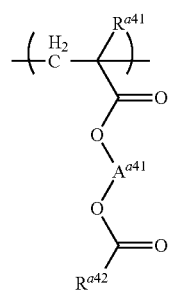

(a4-1)

wherein, in formula (a4-1), $R^{a41}$ represents a hydrogen atom or a methyl group, $R^{a42}$ represents a hydrocarbon group having 1 to 20 carbon atoms which may have a substituent, and —$CH_2$— included in the saturated hydrocarbon group may be replaced by —O— or —CO—, $A^{a41}$ represents an alkanediyl group having 1 to 6 carbon atoms which may have a substituent or a group represented by formula (a-g1), in which at least one of $A^{a41}$ and $R^{a42}$ has, as a substituent, a halogen atom (preferably a fluorine atom):

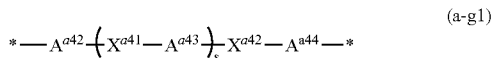

(a-g1)

wherein, in formula (a-g1), s represents 0 or 1, $A^{a42}$ and $A^{a44}$ each independently represent a divalent saturated hydrocarbon group having 1 to 5 carbon atoms which may have a substituent, $A^{a43}$ represents a single bond or a divalent saturated hydrocarbon group having 1 to 5 carbon atoms which may have a substituent, $X^{a41}$ and $X^{a42}$ each independently represent —O—, —CO—, —CO—O— or —O—CO—, in which the total number of carbon atoms of $A^{a42}$, $A^{a43}$, $A^{a44}$, $X^{a41}$ and $X^{a42}$ is 7 or less, and

* is a bond and * at the right side is a bond to —O—CO—$R^{a42}$.

Examples of the hydrocarbon group in $R^{a42}$ include a chain and cyclic saturated hydrocarbon group.

Examples of the chain and cyclic saturated hydrocarbon group include a linear or branched alkyl group and a monocyclic or a polycyclic alicyclic hydrocarbon group, and a saturated hydrocarbon group formed by combining an alkyl group and an alicyclic hydrocarbon group.

Examples of the chain saturated hydrocarbon group include a methyl group, an ethyl group, an n-propyl group, an n-butyl group, an n-pentyl group, an n-hexyl group, an n-heptyl group, an n-octyl group, an n-decyl group, an n-dodecyl group, an n-pentadecyl group, an n-hexadecyl group, an n-heptadecyl group and an n-octadecyl group.

Examples of the cyclic saturated hydrocarbon group include cycloalkyl groups such as a cyclopentyl group, a cyclohexyl group, a cycloheptyl group and a cyclooctyl group, a methylcyclohexyl group, a dimethylcyclohexyl group and a methylnorbornyl group; and polycyclic alicyclic hydrocarbon groups such as a decahydronaphthyl group, an adamantyl group, a norbornyl group, an adamantylcyclohexyl group and the following groups (* represents a bond).

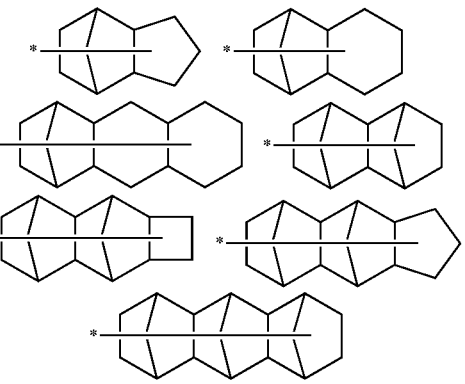

$R^{a42}$ may have a halogen atom or a group represented by formula (a-g3) as the substituent. Examples of the halogen atom include a fluorine atom, a chlorine atom, a bromine atom and an iodine atom, and a fluorine atom is preferable.

(a-g3)

wherein, in formula (a-g3), $X^{a43}$ represents an oxygen atom, a carbonyl group, a carbonyloxy group or an oxycarbonyl group, $A^{a45}$ represents a saturated hydrocarbon group having 1 to 17 carbon atoms which has at least one halogen atom and * represents a bond.

Examples of the saturated hydrocarbon group of $A^{a45}$ include groups which are the same as those exemplified for $R^{a42}$.

$R^{a42}$ is preferably a saturated hydrocarbon group which may have a halogen atom, and more preferably an alkyl group having a halogen atom and/or a saturated hydrocarbon group having a group represented by formula (a-g3).

When $R^{a42}$ is a saturated hydrocarbon group having a halogen atom, the saturated hydrocarbon group is preferably a saturated hydrocarbon group having a fluorine atom, more preferably a perfluoroalkyl group or a perfluorocycloalkyl group, still more preferably a perfluoroalkyl group having 1 to 6 carbon atoms, and particularly preferably a perfluoroalkyl group having 1 to 3 carbon atoms. Examples of the perfluoroalkyl group include a perfluoromethyl group, a perfluoroethyl group, a perfluoropropyl group, a perfluorobutyl group, a perfluoropentyl group, a perfluorohexyl group, a perfluoroheptyl group and a perfluorooctyl group. Examples of the perfluorocycloalkyl group include a perfluorocyclohexyl group and the like.

When $R^{a42}$ is a saturated hydrocarbon group having a group represented by formula (a-g3), the total number of carbon atoms of the saturated hydrocarbon group is preferably 15 or less, and more preferably 12 or less, including the number of carbon atoms included in the group represented by formula (a-g3). When having the group represented by formula (a-g3) as the substituent, the number thereof is preferably 1.

The saturated hydrocarbon group having a group represented by formula (a-g3) is more preferably a group represented by formula (a-g2):

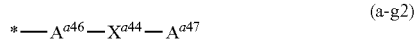

(a-g2)

wherein, in formula (a-g2), $A^{a46}$ represents a saturated hydrocarbon group having 1 to 17 carbon atoms which may have a halogen atom, $X^{a44}$ represents a carbonyloxy group or an oxycarbonyl group, $A^{a47}$ represents a saturated hydrocarbon group having 1 to 17 carbon atoms which may have a halogen atom, the total number of carbon atoms of $A^{a46}$, $A^{a47}$ and $X^{a44}$ is 18 or less, and at least one of $A^{a46}$ and $A^{a47}$ has at least one halogen atom, and

* represents a bond to a carbonyl group.

The number of carbon atoms of the saturated hydrocarbon group of $A^{a46}$ is preferably 1 to 6, and more preferably 1 to 3.

The number of carbon atoms of the saturated hydrocarbon group of $A^{a47}$ is preferably 4 to 15, and more preferably 5 to 12, and $A^{a47}$ is still more preferably a cyclohexyl group or an adamantyl group.

More preferable structure of a partial structure represented by $*-A^{a46}-X^{a44}-A^{a47}$ (* is a bond to a carbonyl group) is the following structures.

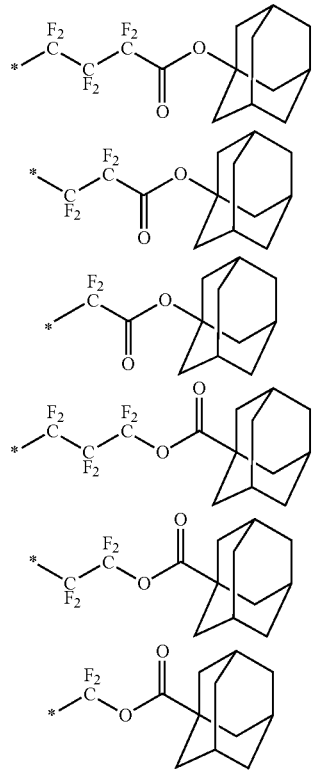

Examples of the alkanediyl group of $A^{a41}$ include linear alkanediyl groups such as a methylene group, an ethylene group, a propane-1,3-diyl group, a butane-1,4-diyl group, a pentane-1,5-diyl group and a hexane-1,6-diyl group; and branched alkanediyl groups such as a propane-1,2-diyl group, a butane-1,3-diyl group, a 2-methylpropane-1,2-diyl group, a 1-methylbutane-1,4-diyl group and a 2-methylbutane-1,4-diyl group.

Examples of the substituent in the alkanediyl group of $A^{a41}$ include a hydroxy group and an alkoxy group having 1 to 6 carbon atoms.

$A^{a41}$ is preferably an alkanediyl group having 1 to 4 carbon atoms, more preferably an alkanediyl group having 2 to 4 carbon atoms, and still more preferably an ethylene group.

The saturated hydrocarbon group of $A^{a42}$, $A^{a43}$ and $A^{a44}$ in the group represented by formula (a-g1) is preferably a chain and cyclic saturated hydrocarbon group, and groups formed by combining these groups. Examples of the saturated hydrocarbon group include a linear or branched alkyl group and a monocyclic alicyclic hydrocarbon group, and a saturated hydrocarbon group formed by combining an alkyl group and an alicyclic hydrocarbon group. Specific examples thereof include a methylene group, an ethylene group, a propane-1,3-diyl group, a propane-1,2-diyl group, a butane-1,4-diyl group, a 1-methylpropane-1,3-diyl group, a 2-methylpropane-1,3-diyl group, a 2-methylpropane-1,2-diyl group and the like.

Examples of the substituent of the saturated hydrocarbon group of $A^{a42}$, $A^{a43}$ and $A^{a44}$ include a hydroxy group and an alkoxy group having 1 to 6 carbon atoms.

s is preferably 0.

Examples of the group represented by formula (a-g1) in which $X^{a42}$ represents an oxygen atom, a carbonyl group, a carbonyloxy group or an oxycarbonyl group include the following groups. In the following exemplification, * and  each represent a bond, and  is a bond to $-O-CO-R^{a42}$.

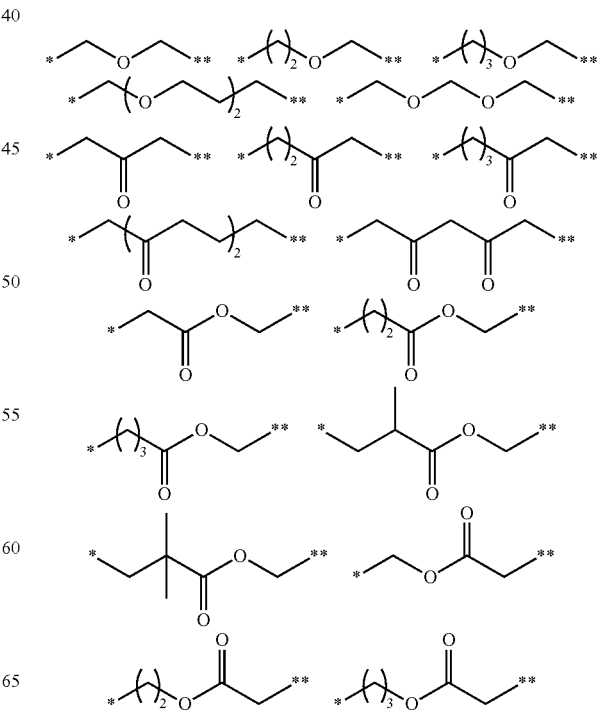

-continued
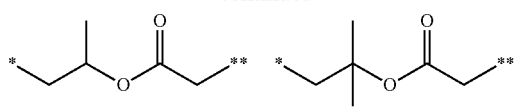
Examples of the structural unit represented by formula (a4-1) include the following structural units, and structural units in which a methyl group corresponding to $R^{a41}$ in the following structural units is substituted with a hydrogen atom.
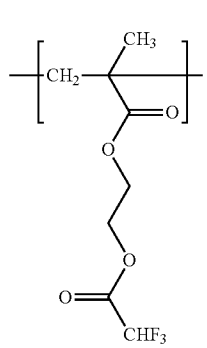
(a4-1-1)
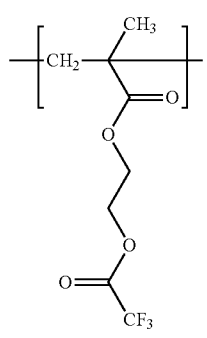
(a4-1-2)
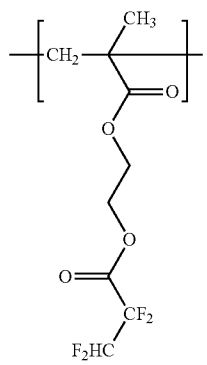
(a4-1-3)
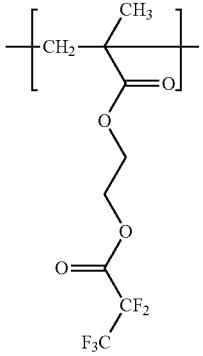
(a4-1-4)
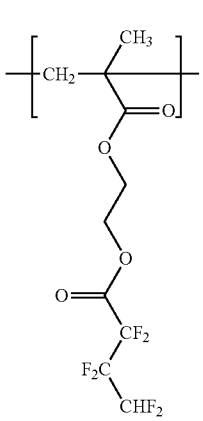
(a4-1-5)
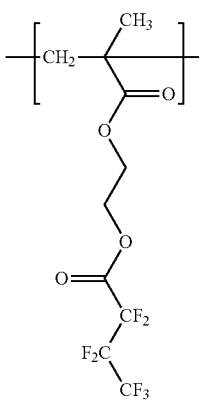
(a4-1-6)
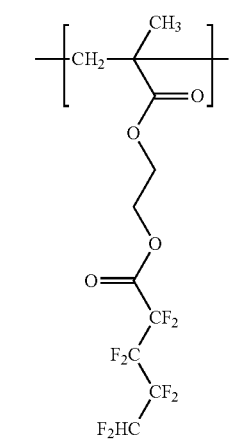
(a4-1-7)

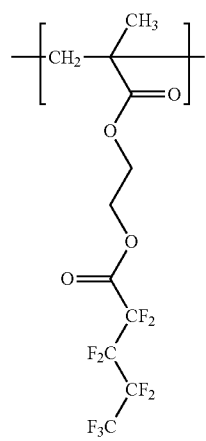
(a4-1-8)
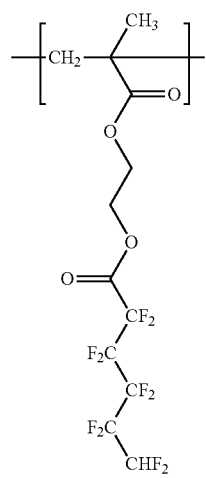
(a4-1-9)
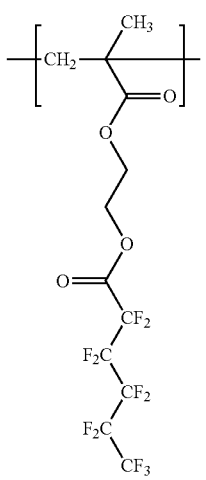
(a4-1-10)
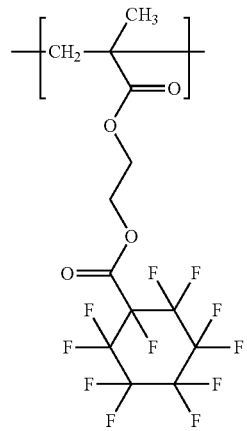
(a4-1-11)
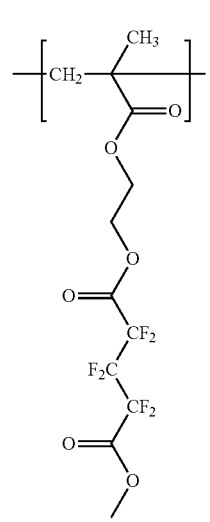
(a4-1'-1)
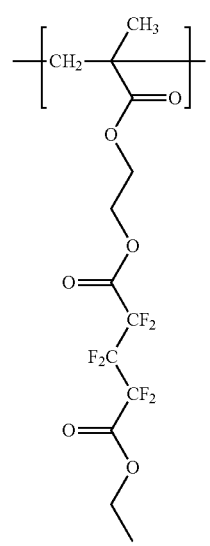
(a4-1'-2)

(a4-1'-3)
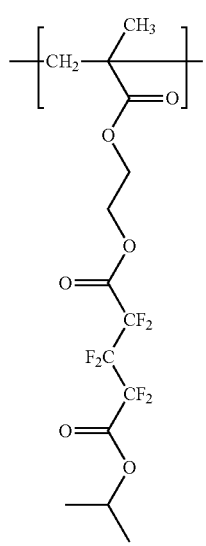
(a4-1'-4)
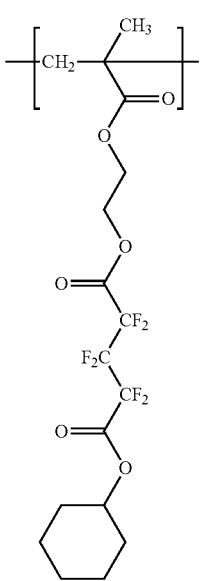
(a4-1'-5)
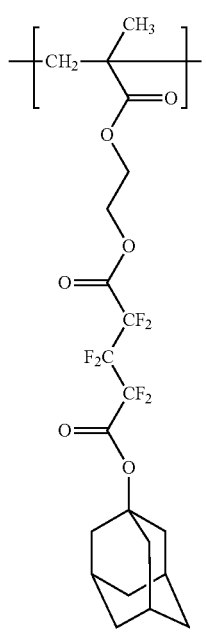
(a4-1'-6)
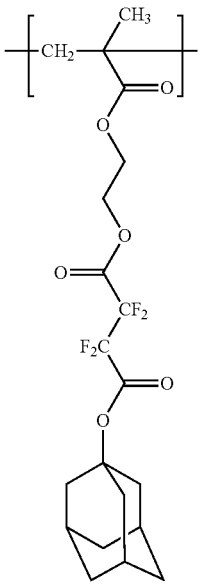

(a4-1'-7)
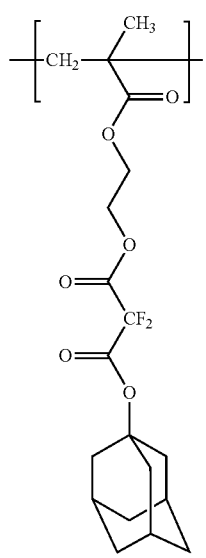
(a4-1'-8)
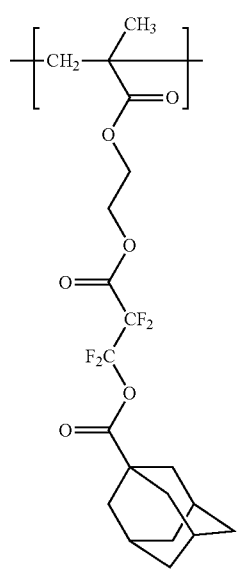
(a4-1'-9)
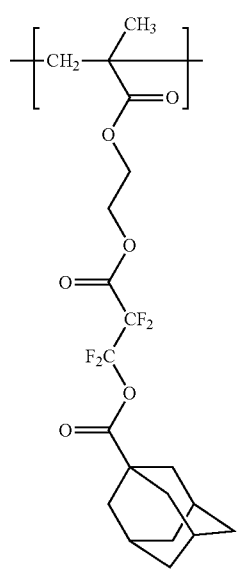
(a4-1'-10)
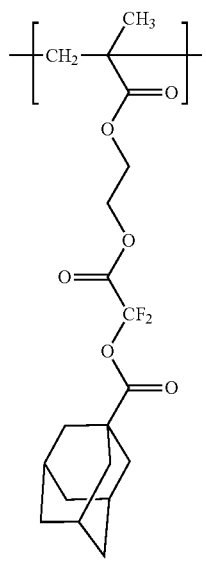
(a4-1'-11)
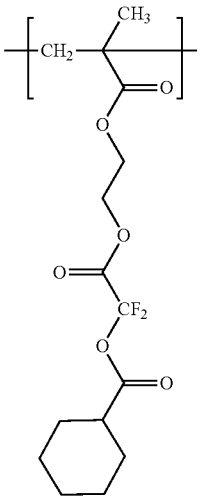

Examples of the structural unit (a4) also include a structural unit represented by formula (a4-4):

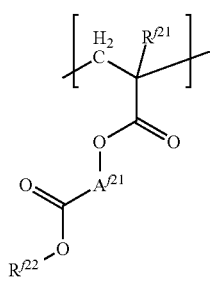

(a4-4)

wherein, in formula (a4-4), $R'^{21}$ represents a hydrogen atom or a methyl group, $A'^{21}$ represents $—(CH_2)_{j1}—$, $—(CH_2)_{j2}—O—(CH_2)_{j3}—$ or $—(CH_2)_{j4}—CO—O—(CH_2)_{j5}—$, j1 to j5 each independently represent an integer of 1 to 6, and $R'^{22}$ represents a hydrocarbon group having 1 to 10 carbon atoms having a fluorine atom.

The hydrocarbon group having a fluorine atom of $R'^{22}$ includes a chain and cyclic aliphatic hydrocarbon group and aromatic hydrocarbon group, and groups formed by combining these groups. The aliphatic hydrocarbon group is preferably an alkyl group (linear or branched) or an alicyclic hydrocarbon group.

Examples of the alkyl group include a methyl group, an ethyl group, an n-propyl group, an isopropyl group, an n-butyl group, a sec-butyl group, a tert-butyl group, an n-pentyl group, an n-hexyl group, an n-octyl group and a 2-ethylhexyl group.

The alicyclic hydrocarbon group may be either monocyclic or polycyclic. Examples of the monocyclic alicyclic hydrocarbon group include cycloalkyl groups such as a cyclopropyl group, a cyclobutyl group, a cyclopentyl group, a cyclohexyl group, a methylcyclohexyl group, a dimethylcyclohexyl group, a cycloheptyl group, a cyclooctyl group, a cycloheptyl group and a cyclodecyl group. Examples of the polycyclic alicyclic hydrocarbon group include a decahydronaphthyl group, an adamantyl group, a 2-alkyladamanthan-2-yl group, a 1-(adamanthan-1-yl)alkan-1-yl group, a norbornyl group, a methylnorbornyl group and an isobornyl group.

Examples of the hydrocarbon group having a fluorine atom of $R'^{22}$ include an alkyl group having a fluorine atom, an alicyclic hydrocarbon group having a fluorine atom and the like.

Examples of the alkyl group having a fluorine atom include fluorinated alkyl groups such as a difluoromethyl group, a trifluoromethyl group, a 1,1-difluoroethyl group, a 2,2-difluoroethyl group, a 2,2,2-trifluoroethyl group, a perfluoroethyl group, a 1,1,2,2-tetrafluoropropyl group, a 1,1,2,2,3,3-hexafluoropropyl group, a perfluoroethylmethyl group, a 1-(trifluoromethyl)-1,2,2,2-tetrafluoroethyl group, a 1-(trifluoromethyl)-2,2,2-trifluoroethyl group, a perfluoropropyl group, a 1,1,2,2-tetrafluorobutyl group, a 1,1,2,2,3,3-hexafluorobutyl group, a 1,1,2,2,3,3,4,4-octafluorobutyl group, a perfluorobutyl group, a 1,1-bis(trifluoro)methyl-2,2,2-trifluoroethyl group, a 2-(perfluoropropyl)ethyl group, a 1,1,2,2,3,3,4,4-octafluoropentyl group, a perfluoropentyl group, a 1,1,2,2,3,3,4,4,5,5-decafluoropentyl group, a 1,1-bis(trifluoromethyl)-2,2,3,3,3-pentafluoropropyl group, a 2-(perfluorobutyl)ethyl group, a 1,1,2,2,3,3,4,4,5,5-decafluorohexyl group, a 1,1,2,2,3,3,4,4,5,5,6,6-dodecafluorohexyl group, a perfluoropentylmethyl group and a perfluorohexyl group.

Examples of the alicyclic hydrocarbon group having a fluorine atom include fluorinated cycloalkyl groups such as a perfluorocyclohexyl group and a perfluoroadamantyl group.

$R'^{22}$ is preferably an alkyl group having 1 to 10 carbon atoms which has a fluorine atom, or an alicyclic hydrocarbon group having 1 to 10 carbon atoms which has a fluorine atom, more preferably an alkyl group having 1 to 10 carbon atoms which has a fluorine atom, and still more preferably an alkyl group having 1 to 6 carbon atoms which has a fluorine atom.

In formula (a4-4), $A'^{21}$ is preferably $—(CH_2)_{j1}—$, more preferably an ethylene group or a methylene group, and still more preferably a methylene group.

Examples of the structural unit represented by formula (a4-4) include the following structural units, and structural units in which a methyl group corresponding to $R'^{21}$ is substituted with a hydrogen atom in the structural units represented by the following formulas.

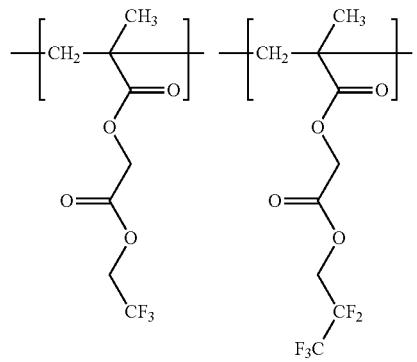

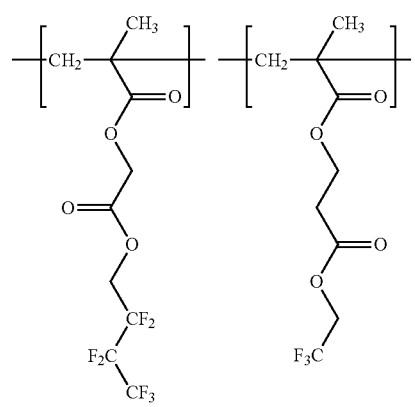

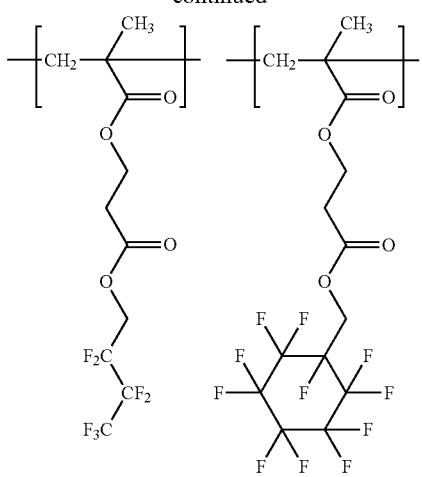
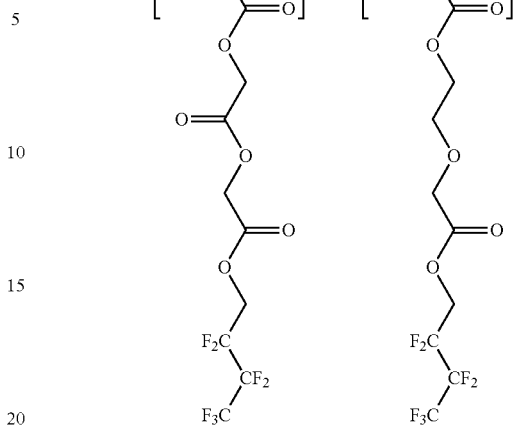
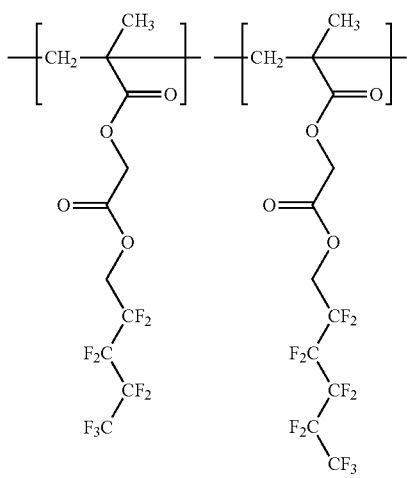
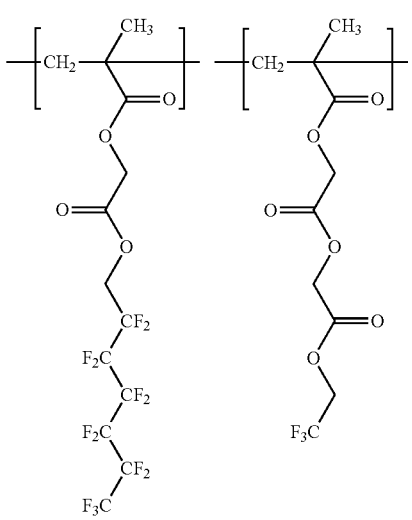

When the resin (A) includes the structural unit (a4), the content is preferably 1 to 20 mol %, more preferably 2 to 15 mol %, and still more preferably 3 to 10 mol %, based on all structural units of the resin (A).

<Structural Unit (a5)>

Examples of a non-leaving hydrocarbon group possessed by the structural unit (a5) include groups having a linear, branched or cyclic hydrocarbon group. Of these, the structural unit (a5) is preferably a structural unit having an alicyclic hydrocarbon group.

The structural unit (a5) includes, for example, a structural unit represented by formula (a5-1):

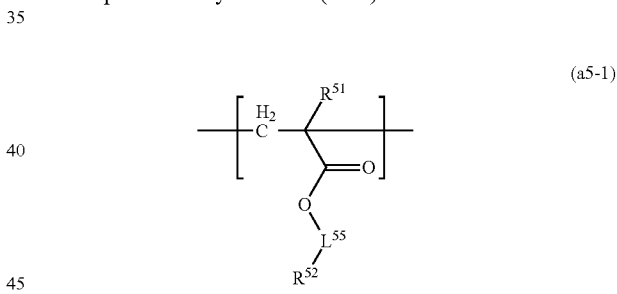

(a5-1)

wherein, in formula (a5-1), $R^{51}$ represents a hydrogen atom or a methyl group, $R^{52}$ represents an alicyclic hydrocarbon group having 3 to 18 carbon atoms, and a hydrogen atom included in the alicyclic hydrocarbon group may be replaced by an aliphatic hydrocarbon group having 1 to 8 carbon atoms, and a hydrogen atom bonded to a carbon atom existing at a bonding site to $L^{55}$ is not substituted with an aliphatic hydrocarbon group having 1 to 8 carbon atoms, and $L^{55}$ represents a single bond or a divalent saturated hydrocarbon group having 1 to 18 carbon atoms, and a methylene group included in the saturated hydrocarbon group may be substituted with an oxygen atom or a carbonyl group.

The alicyclic hydrocarbon group of $R^{52}$ may be either monocyclic or polycyclic. The monocyclic alicyclic hydrocarbon group includes, for example, a cyclopropyl group, a cyclobutyl group, a cyclopentyl group and a cyclohexyl group. The polycyclic alicyclic hydrocarbon group includes, for example, an adamantyl group and a norbornyl group.

The aliphatic hydrocarbon group having 1 to 8 carbon atoms includes, for example, alkyl groups such as a methyl group, an ethyl group, an n-propyl group, an isopropyl group, an n-butyl group, a sec-butyl group, a tert-butyl group, a pentyl group, a hexyl group, an octyl group and a 2-ethylhexyl group. Examples of the alicyclic hydrocarbon group having a substituent includes a 3-hydroxyadamantyl group and the like.

$R^{52}$ is preferably an unsubstituted alicyclic hydrocarbon group having 3 to 18 carbon atoms, and more preferably an adamantyl group, a norbornyl group or a cyclohexyl group.

Examples of the divalent saturated hydrocarbon group of $L^{55}$ include a divalent aliphatic hydrocarbon group and a divalent alicyclic saturated hydrocarbon group, and a divalent aliphatic saturated hydrocarbon group is preferable.

The divalent aliphatic saturated hydrocarbon group includes, for example, alkanediyl groups such as a methylene group, an ethylene group, a propanediyl group, a butanediyl group and a pentanediyl group.

The divalent alicyclic saturated hydrocarbon group may be either monocyclic or polycyclic. Examples of the monocyclic alicyclic saturated hydrocarbon group include cycloalkanediyl groups such as a cyclopentanediyl group and a cyclohexanediyl group. Examples of the polycyclic divalent alicyclic saturated hydrocarbon group include an adamantanediyl group and a norbornanediyl group.

Examples of the group in which a methylene group included in the saturated hydrocarbon group is substituted with an oxygen atom or a carbonyl group include groups represented by formula (L1-1) to formula (L1-4). In the following formulas, * represents a bond to an oxygen atom.

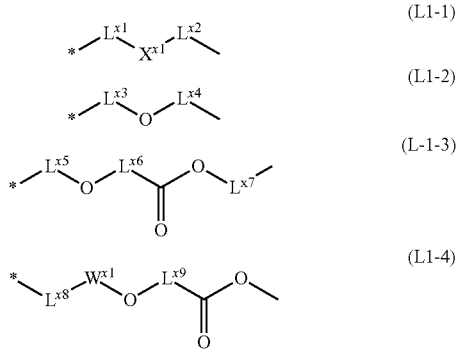

In formula (L1-1), $X^{x1}$ represents a carbonyloxy group or an oxycarbonyl group, $L^{x1}$ represents a divalent aliphatic saturated hydrocarbon group having 1 to 16 carbon atoms, $L^{x2}$ represents a single bond or a divalent aliphatic saturated hydrocarbon group having 1 to 15 carbon atoms, and the total number of carbon atoms of $L^{x1}$ and $L^{x2}$ is 16 or less.

In formula (L1-2), $L^{x3}$ represents a divalent aliphatic saturated hydrocarbon group having 1 to 17 carbon atoms, $L^{x4}$ represents a single bond or a divalent aliphatic saturated hydrocarbon group having 1 to 16 carbon atoms, and the total number of carbon atoms of $L^{x3}$ and $L^{x4}$ is 17 or less.

In formula (L1-3), $L^{x5}$ represents a divalent aliphatic saturated hydrocarbon group having 1 to 15 carbon atoms, $L^{x6}$ and $L^{x7}$ each independently represent a single bond or a divalent aliphatic saturated hydrocarbon group having 1 to 14 carbon atoms, and the total number of carbon atoms of $L^{x5}$, $L^{x6}$ and $L^{x7}$ is 15 or less.

In formula (L1-4), $L^{x8}$ and $L^{x9}$ represents a single bond or a divalent aliphatic saturated hydrocarbon group having 1 to 12 carbon atoms, $W^{x1}$ represents a divalent alicyclic saturated hydrocarbon group having 3 to 15 carbon atoms, and the total number of carbon atoms of $L^{x8}$, $L^{x9}$ and $W^{x1}$ is 15 or less.

$L^{x1}$ is preferably a divalent aliphatic saturated hydrocarbon group having 1 to 8 carbon atoms, and more preferably a methylene group or an ethylene group.

$L^{x2}$ is preferably a single bond or a divalent aliphatic saturated hydrocarbon group having 1 to 8 carbon atoms, and more preferably a single bond.

$L^{x3}$ is preferably an aliphatic saturated hydrocarbon group having 1 to 8 carbon atoms.

$L^{x4}$ is preferably a single bond or a divalent aliphatic saturated hydrocarbon group having 1 to 8 carbon atoms.

$L^{x5}$ is preferably a divalent aliphatic saturated hydrocarbon group having 1 to 8 carbon atoms, and more preferably a methylene group or an ethylene group.

$L^{x6}$ is preferably a single bond or a divalent aliphatic saturated hydrocarbon group having 1 to 8 carbon atoms, and more preferably a methylene group or an ethylene group.

$L^{x7}$ is preferably a single bond or a divalent aliphatic saturated hydrocarbon group having 1 to 8 carbon atoms.

$L^{x8}$ is preferably a single bond or a divalent aliphatic saturated hydrocarbon group having 1 to 8 carbon atoms, and more preferably a single bond or a methylene group.

$L^{x9}$ is preferably a single bond or a divalent aliphatic saturated hydrocarbon group having 1 to 8 carbon atoms, and more preferably a single bond or a methylene group.

$W^{x1}$ is preferably a divalent alicyclic saturated hydrocarbon group having 3 to 10 carbon atoms, and more preferably a cyclohexanediyl group or an adamantanediyl group.

The group represented by formula (L1-1) includes, for example, the following divalent groups.

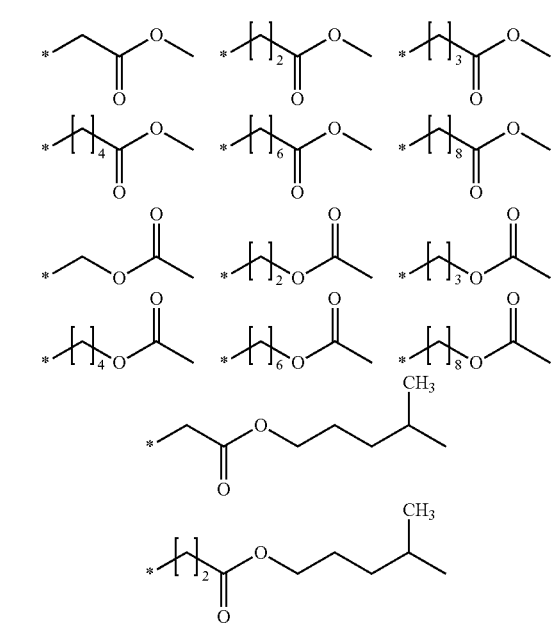

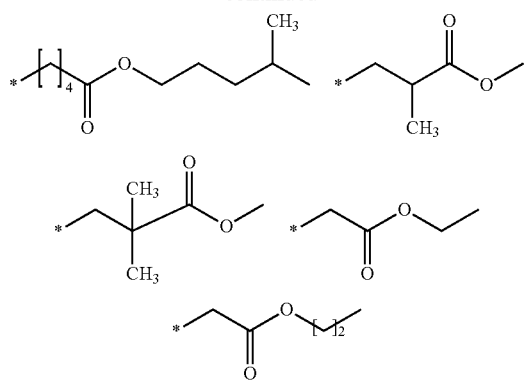

The group represented by formula (L1-2) includes, for example, the following divalent groups.

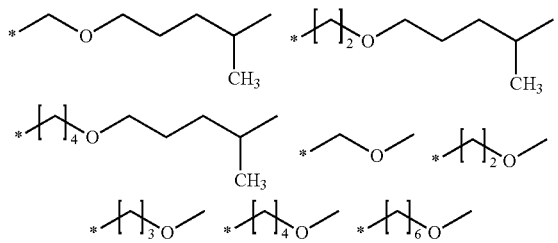

The group represented by formula (L1-3) includes, for example, the following divalent groups.

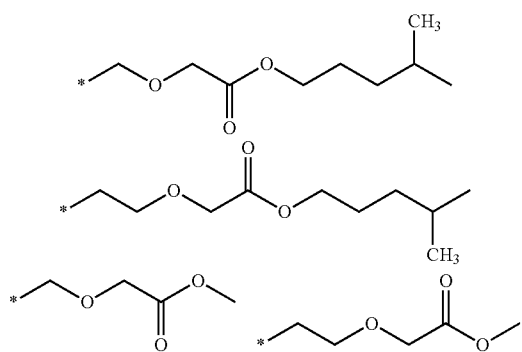

The group represented by formula (L1-4) includes, for example, the following divalent groups.

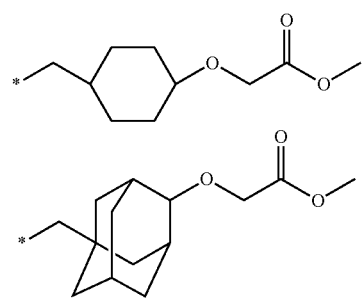

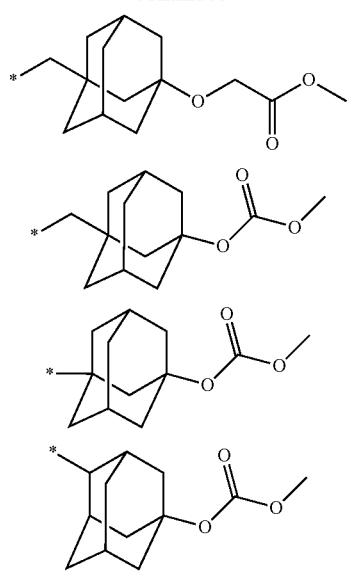

$L^{55}$ is preferably a single bond or a group represented by formula (L1-1).

Examples of the structural unit (a5-1) include the following structural units and structural units in which a methyl group corresponding to $R^{51}$ in the following structural units is substituted with a hydrogen atom.

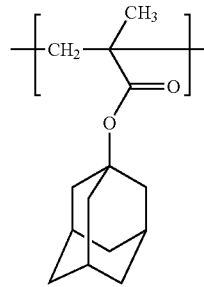
(a5-1-1)

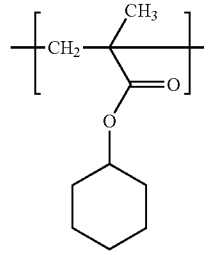
(a5-1-2)

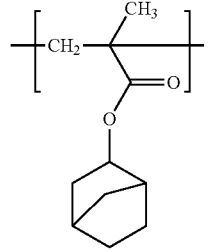
(a5-1-3)

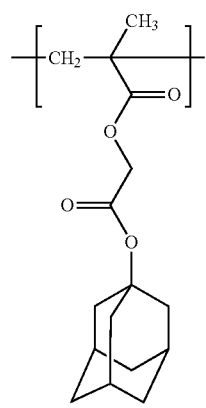
(a5-1-4)
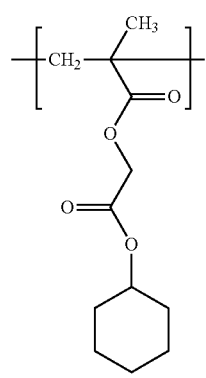
(a5-1-5)
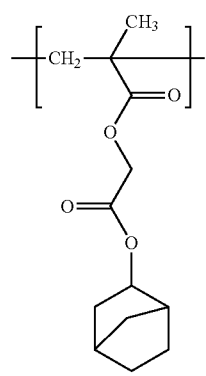
(a5-1-6)
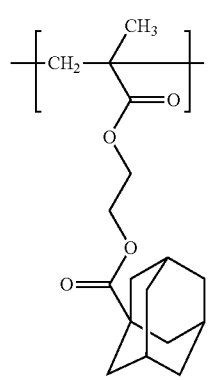
(a5-1-7)
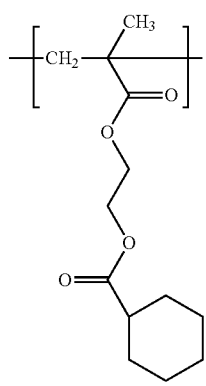
(a5-1-8)
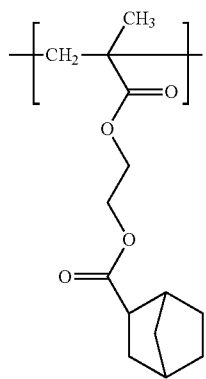
(a5-1-9)
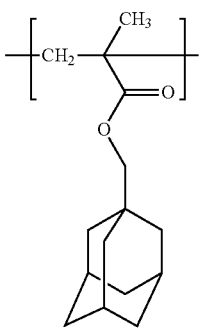
(a5-1-10)
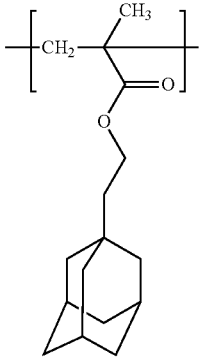
(a5-1-11)

(a5-1-12) 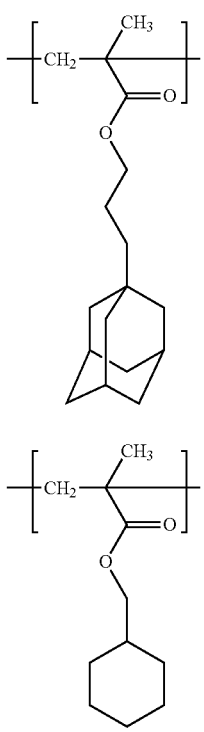

(a5-1-13) 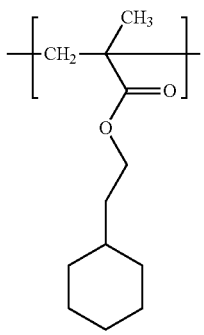

(a5-1-14) 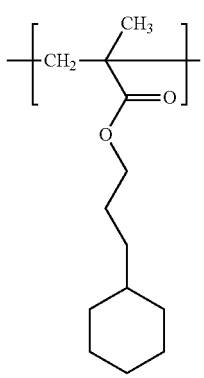

(a5-1-15)

(a5-1-16) 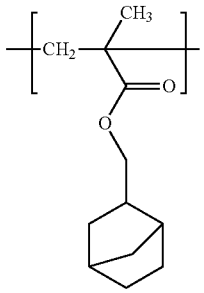

(a5-1-17) 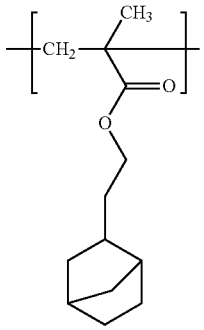

(a5-1-18) 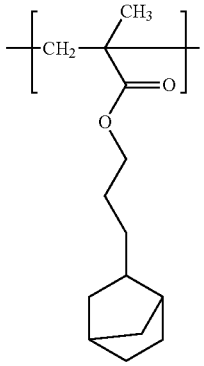

When the resin (A) includes the structural unit (a5), the content is preferably 1 to 30 mol %, more preferably 2 to 20 mol %, and still more preferably 3 to 15 mol %, based on all structural units of the resin (A).

<Structural Unit (II)>

The resin (A) may further include a structural unit which is decomposed upon exposure to radiation to generate an acid (hereinafter sometimes referred to as "structural unit (II)"). Specific examples of the structural unit (II) include the structural units having a group represented by formula (III-1) or formula (III-2) mentioned in JP 2016-79235 A, and a structural unit having a sulfonate group or a carboxylate group and an organic cation in a side chain or a structural unit having a sulfonio group and an organic anion in a side chain are preferable.

The structural unit having a sulfonate group or a carboxylate group in a side chain is preferably a structural unit represented by formula (II-2-A'):

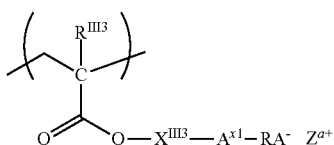

(II-2-A')

wherein, in formula (II-2-A'), $X^{III3}$ represents a divalent saturated hydrocarbon group having 1 to 18 carbon atoms, —CH$_2$— included in the saturated hydrocarbon group may be replaced by —O—, —S— or —CO—, and a hydrogen atom included in the saturated hydrocarbon group may be replaced by a halogen atom, an alkyl group having 1 to 6 carbon atoms which may have a halogen atom, or a hydroxy group, $A^{x1}$ represents an alkanediyl group having 1 to 8 carbon atoms, and a hydrogen atom included in the alkanediyl group may be substituted with a fluorine atom or a perfluoroalkyl group having 1 to 6 carbon atoms, $RA^-$ represents a sulfonate group or a carboxylate group, $R^{III3}$ represents a hydrogen atom, a halogen atom or an alkyl group having 1 to 6 carbon atoms which may have a halogen atom, and $Z^{a+}$ represents an organic cation.

Examples of the halogen atom represented by $R^{III3}$ include a fluorine atom, a chlorine atom, a bromine atom and an iodine atom.

Examples of the alkyl group having 1 to 6 carbon atoms which may have a halogen atom represented by $R^{III3}$ include those which are the same as the alkyl group having 1 to 6 carbon atoms which may have a halogen atom represented by $R^{a8}$.

Examples of the alkanediyl group having 1 to 8 carbon atoms represented by $A^{x1}$ include a methylene group, an ethylene group, a propane-1,3-diyl group, a butane-1,4-diyl group, a pentane-1,5-diyl group, a hexane-1,6-diyl group, an ethane-1,1-diyl group, a propane-1,1-diyl group, a propane-1,2-diyl group, a propane-2,2-diyl group, a pentane-2,4-diyl group, a 2-methylpropane-1,3-diyl group, a 2-methylpropane-1,2-diyl group, a pentane-1,4-diyl group, a 2-methylbutane-1,4-diyl group and the like.

Examples of the divalent saturated hydrocarbon group having 1 to 18 carbon atoms represented by $X^{III3}$ include a linear or branched alkanediyl group, a monocyclic or a polycyclic divalent alicyclic saturated hydrocarbon group, or a combination thereof.

Specific examples thereof include linear alkanediyl groups such as a methylene group, an ethylene group, a propane-1,3-diyl group, a propane-1,2-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group and a dodecane-1,12-diyl group; branched alkanediyl groups such as a butane-1,3-diyl group, a 2-methylpropane-1,3-diyl group, a 2-methylpropane-1,2-diyl group, a pentane-1,4-diyl group and a 2-methylbutane-1,4-diyl group; cycloalkanediyl groups such as a cyclobutane-1,3-diyl group, a cyclopentane-1,3-diyl group, a cyclohexane-1,4-diyl group and a cyclooctane-1,5-diyl group; and divalent polycyclic alicyclic saturated hydrocarbon groups such as a norbornane-1,4-diyl group, a norbornane-2,5-diyl group, an adamantane-1,5-diyl group and an adamantane-2,6-diyl group.

Examples of the group obtained by combining an alkanediyl group and an alicyclic saturated hydrocarbon group include cycloalkyl-alkanediyl groups such as a cyclohexylmethylene group, an adamantylmethylene group and a norbornylethylene group.

Those in which —CH$_2$— included in the saturated hydrocarbon group is replaced by —O—, —S— or —CO— include, for example, divalent groups represented by formula (X1) to formula (X53). Before replacing —CH$_2$— included in the saturated hydrocarbon group by —O—, —S— or —CO—, the number of carbon atoms is 17 or less. In the following formulas, * represents a bond to $A^{x1}$.

(X1)

(X2)

(X3)

(X4)

(X5)

(X6)

(X7)

(X8)

(X9)

(X10)

(X110)

(X12)

(X13)

(X14)

(X-15)

(X16)

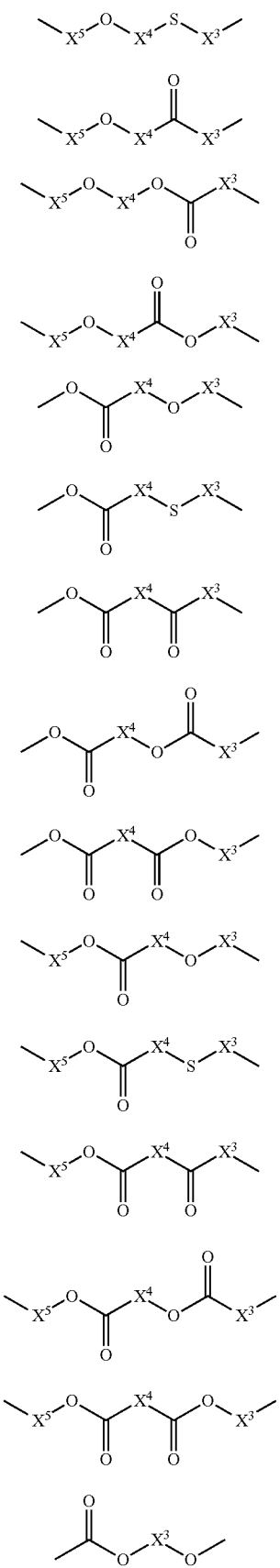
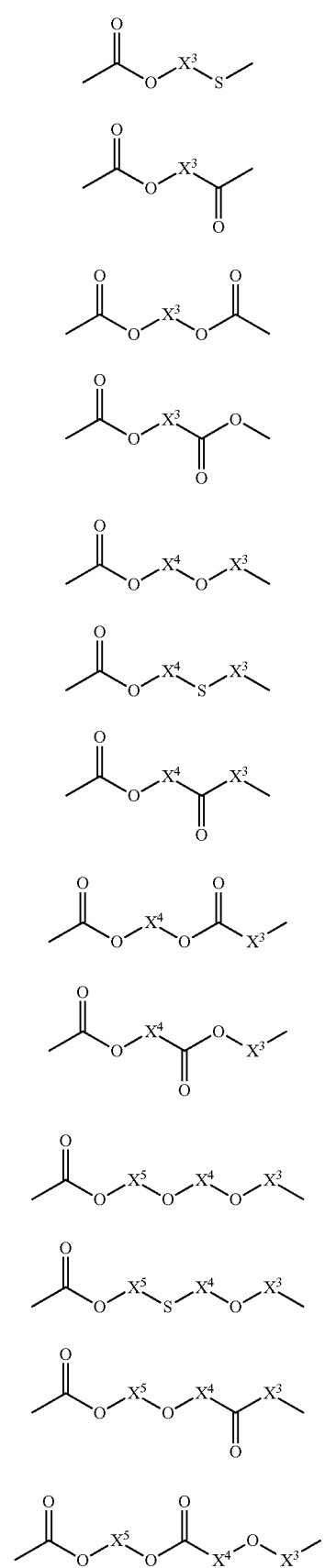

-continued

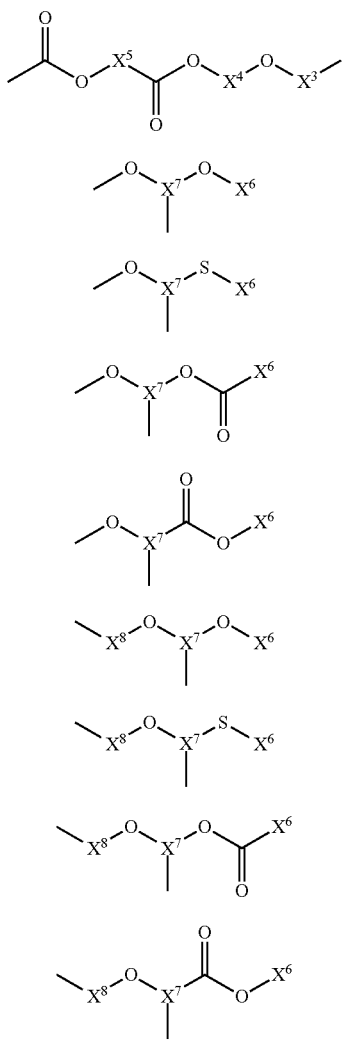

(X45)
(X46)
(X47)
(X48)
(X49)
(X50)
(X51)
(X52)
(X53)

X$^3$ represents a divalent saturated hydrocarbon group having 1 to 16 carbon atoms.

X$^4$ represents a divalent saturated hydrocarbon group having 1 to 15 carbon atoms.

X$^5$ represents a divalent saturated hydrocarbon group having 1 to 13 carbon atoms.

X$^6$ represents an alkyl group having 1 to 14 carbon atoms.

X$^7$ represents a trivalent saturated hydrocarbon group having 1 to 14 carbon atoms.

X$^8$ represents a divalent saturated hydrocarbon group having 1 to 13 carbon atoms.

Examples of the organic cation represented by $Z^{a+}$ include an organic onium cation, an organic sulfonium cation, an organic iodonium cation, an organic ammonium cation, an organic benzothiazolium cation, an organic phosphonium cation and the like, and an organic sulfonium cation and an organic iodonium cation are preferable, and an arylsulfonium cation is more preferable.

$Z^{a+}$ is preferably a cation represented by any one of formula (b2-1) to formula (b2-4) [hereinafter sometimes referred to as "cation (b2-1)" according to the number of formula].

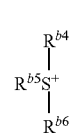

(b2-1)

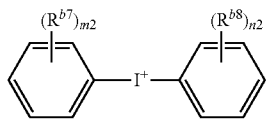

(b2-2)

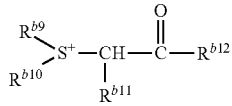

(b2-3)

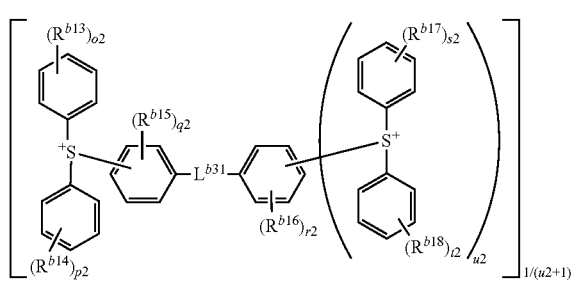

(b2-4)

In formula (b2-1) to formula (b2-4), $R^{b4}$ to $R^{b6}$ each independently represent an alkyl group having 1 to 30 carbon atoms, an alicyclic hydrocarbon group having 3 to 36 carbon atoms or an aromatic hydrocarbon group having 6 to 36 carbon atoms, a hydrogen atom included in the alkyl group may be substituted with a hydroxy group, an alkoxy group having 1 to 12 carbon atoms, an alicyclic hydrocarbon group having 3 to 12 carbon atoms or an aromatic hydrocarbon group having 6 to 18 carbon atoms, a hydrogen atom included in the alicyclic hydrocarbon group may be substituted with a halogen atom, an alkyl group having 1 to 18 carbon atoms, an acyl group having 2 to 4 carbon atoms or a glycidyloxy group, and a hydrogen atom included in the aromatic hydrocarbon group may be substituted with a halogen atom or an alkoxy group having 1 to 12 carbon atoms, $R^{b4}$ and $R^{b5}$ may form a ring together with sulfur atoms to which $R^{b4}$ and $R^{b5}$ are bonded, and —CH$_2$— included in the ring may be replaced by —O—, —SO— or —CO—, $R^{b7}$ and $R^{b8}$ each independently represent a hydroxy group, an aliphatic hydrocarbon group having 1 to 12 carbon atoms or an alkoxy group having 1 to 12 carbon atoms, m2 and n2 each independently represent an integer of 0 to 5, when m2 is 2 or more, a plurality of $R^{b7}$ may be the same or different, and when n2 is 2 or more, a plurality of $R^{b8}$ may be the same or different, $R^{b9}$ and $R^{b10}$ each independently represent an alkyl group having 1 to 36 carbon atoms or an alicyclic hydrocarbon group having 3 to 36 carbon atoms, $R^{b9}$ and $R^{b10}$ may form a ring together with sulfur atoms to which $R^{b9}$ and $R^{b10}$ are bonded, and —CH$_2$— included in the ring may be replaced by —O—, —SO— or —CO—, $R^{b11}$ represents a hydrogen atom, an alkyl group having 1 to 36 carbon atoms, an alicyclic hydrocarbon group having 3 to 36 carbon atoms or an aromatic hydrocarbon group having 6 to 18 carbon atoms, $R^{b12}$ represents an alkyl group having 1 to 12 carbon atoms, an alicyclic hydrocarbon group having 3 to 18 carbon atoms or an aromatic hydrocarbon group having 6 to 18 carbon atoms, a hydrogen atom included in the alkyl group may be substituted with an aromatic hydrocarbon group having 6 to 18 carbon atoms, and a hydrogen atom included in the aromatic hydrocarbon group may be substituted with an alkoxy group having 1 to 12 carbon atoms or an alkylcarbonyloxy group having 1 to 12 carbon atoms, $R^{b11}$ and $R^{b12}$ may form a ring including —CH—CO— to which $R^{b11}$ and $R^{b12}$ are bonded, and —CH$_2$— included in the ring may be replaced by —O—, —SO— or —CO—, $R^{b13}$ to $R^{b18}$ each independently represent a hydroxy group, an aliphatic hydrocarbon group having 1 to 12 carbon atoms or an alkoxy group having 1 to 12 carbon atoms, $L^{b31}$ represents —S— or —O—, o2, p2, s2 and t2 each independently represent an integer of 0 to 5, q2 and r2 each independently represent an integer of 0 to 4, u2 represents 0 or 1, and when o2 is 2 or more, a plurality of $R^{b13}$ may be the same or different, when p2 is 2 or more, a plurality of $R^{b14}$ may be the same or different, when q2 is 2 or more, a plurality of $R^{b15}$ may be the same or different, when r2 is 2 or more, a plurality of $R^{b16}$ may be the same or different, when s2 is 2 or more, a plurality of $R^{b17}$ may be the same or different, and when t2 is 2 or more, a plurality of $R^{b18}$ may be the same or different.

Examples of the alkyl group include a methyl group, an ethyl group, an n-propyl group, an isopropyl group, an n-butyl group, a sec-butyl group, a tert-butyl group, a pentyl group, a hexyl group, an octyl group, a 2-ethylhexyl group and the like. Particularly, the alkyl group of $R^{b9}$ to $R^{b12}$ preferably has 1 to 12 carbon atoms.

The alicyclic hydrocarbon group may be either monocyclic or polycyclic, and examples of the monocyclic alicyclic hydrocarbon group include cycloalkyl groups such as a cyclopropyl group, a cyclobutyl group, a cyclopentyl group, a cyclohexyl group, a cycloheptyl group, a cyclooctyl group and a cyclodecyl group. Examples of the polycyclic alicyclic hydrocarbon group include a decahydronaphthyl group, an adamantyl group, a norbornyl group and the following groups.

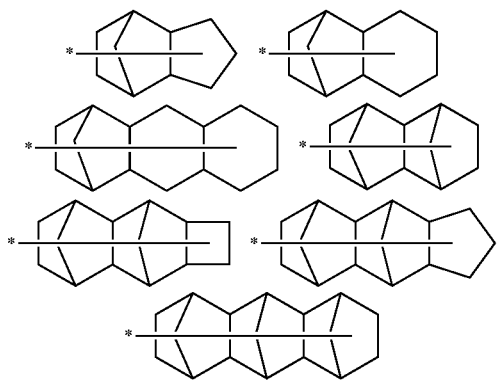

Particularly, the alkyl group of $R^{b9}$ to $R^{b12}$ preferably has 3 to 18 carbon atoms, and more preferably 4 to 12 carbon atoms.

Examples of the alicyclic hydrocarbon group in which a hydrogen atom is substituted with an alkyl group include a methylcyclohexyl group, a dimethylcyclohexyl group, a 2-alkyladamantan-2-yl group, a methylnorbornyl group, an isobornyl group and the like. In the alicyclic hydrocarbon group in which a hydrogen atom is substituted with an alkyl group, the total number of carbon atoms of the alicyclic hydrocarbon group and the alkyl group is preferably 20 or less.

Examples of the aliphatic hydrocarbon group of $R^{b7}$ and $R^{b8}$ and $R^{b13}$ to $R^{b18}$ include those which are the same as the above-mentioned alkyl group, alicyclic hydrocarbon group and group obtained by combining these groups.

Examples of the aromatic hydrocarbon group include aryl groups such as a phenyl group, a biphenylyl group, a naphthyl group and a phenanthryl group; alkyl-aryl groups such as a tolyl group, a xylyl group, a cumenyl group, a mesityl group, a p-ethylphenyl group, a p-tert-butylphenyl group, a 2,6-diethylphenyl group and a 2-methyl-6-ethylphenyl group; and cycloalkyl-aryl groups such as a p-cyclohexylphenyl group and a p-adamantylphenyl group.

When an alkyl group or an alicyclic hydrocarbon group is included in the aromatic hydrocarbon group, an alkyl group having 1 to 18 carbon atoms and an alicyclic hydrocarbon group having 3 to 18 carbon atoms are preferable.

Examples of the aromatic hydrocarbon group in which a hydrogen atom is substituted with an alkoxy group include a p-methoxyphenyl group and the like.

Examples of the alkyl group in which a hydrogen atom is substituted with an aromatic hydrocarbon group include aralkyl groups such as a benzyl group, a phenethyl group, a phenylpropyl group, a trityl group, a naphthylmethyl group and a naphthylethyl group.

Examples of the alkoxy group include a methoxy group, an ethoxy group, a propoxy group, a butoxy group, a pentyloxy group, a hexyloxy group, a heptyloxy group, an octyloxy group, a decyloxy group and a dodecyloxy group and the like.

Examples of the acyl group include an acetyl group, a propionyl group and a butyryl group and the like.

Examples of the halogen atom include a fluorine atom, a chlorine atom, a bromine atom and an iodine atom and the like.

Examples of the alkylcarbonyloxy group include a methylcarbonyloxy group, an ethylcarbonyloxy group, an n-propylcarbonyloxy group, an isopropylcarbonyloxy group, an n-butylcarbonyloxy group, a sec-butylcarbonyloxy group, a tert-butylcarbonyloxy group, a pentylcarbonyloxy group, a hexylcarbonyloxy group, an octylcarbonyloxy group and a 2-ethylhexylcarbonyloxy group and the like.

The ring, which may be formed by $R^{b4}$ and $R^{b5}$ together with sulfur atoms to which $R^{b4}$ and $R^{b5}$ are bonded, may be a monocyclic, polycyclic, aromatic, nonaromatic, saturated or unsaturated ring. Examples of this ring include a ring having 3 to 18 carbon atoms and are preferably a ring having 4 to 18 carbon atoms. Examples of the ring containing a sulfur atom include a 3-membered to 12-membered ring and are preferably a 3-membered to 7-membered ring, and specific examples thereof include the following rings.

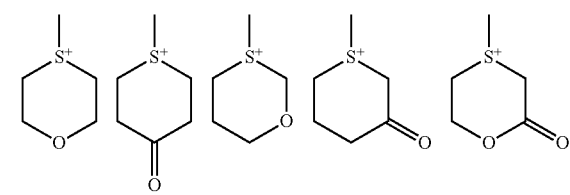

-continued

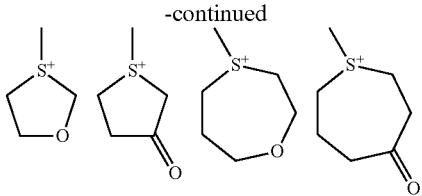

The ring formed by $R^{b9}$ and $R^{b10}$ together with sulfur atoms to which $R^{b4}$ and $R^{b5}$ are bonded may be a monocyclic, polycyclic, aromatic, nonaromatic, saturated or unsaturated ring. Examples of this ring include a 3-membered to 12-membered ring and are preferably a 3-membered to 7-membered ring, and examples thereof include a thiolan-1-ium ring (tetrahydrothiophenium ring), a thian-1-ium ring, a 1,4-oxathian-4-ium ring and the like.

The ring formed by bonding $R^{b11}$ and $R^{b12}$ each other may be a monocyclic, polycyclic, aromatic, nonaromatic, saturated or unsaturated ring. Examples of this ring include a 3-membered to 12-membered ring and are preferably a 3-membered to 7-membered ring, and examples thereof include an oxocycloheptane ring, an oxocyclohexane ring, an oxonorbornane ring, an oxoadamantane ring and the like.

Of cation (b2-1) to cation (b2-4), a cation (b2-1) is preferable.

Examples of the cation (b2-1) include the following cations.

(b2-c-1)

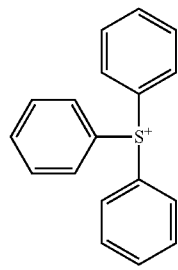

(b2-c-2)

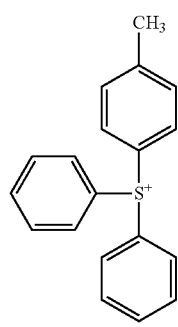

(b2-c-3)

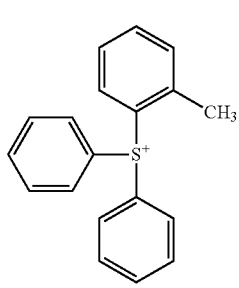

(b2-c-4)

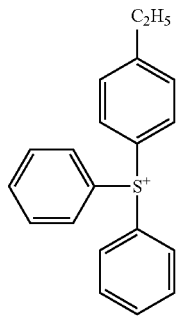

(b2-c-5)

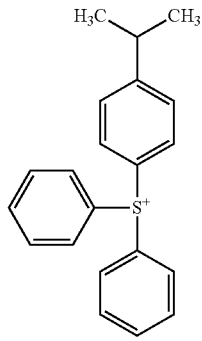

(b2-c-6)

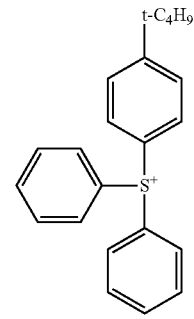

(b2-c-7)

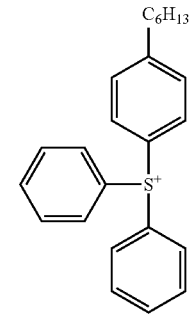

(b2-c-8)

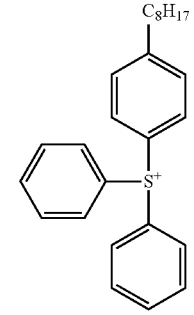

(b2-c-9)
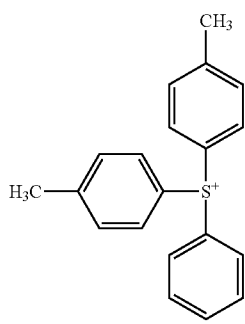
(b2-c-10)
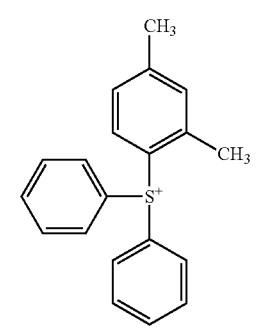
(b2-c-11)
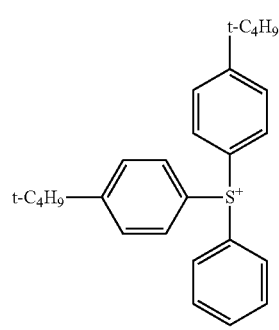
(b2-c-12)
(b2-c-13)
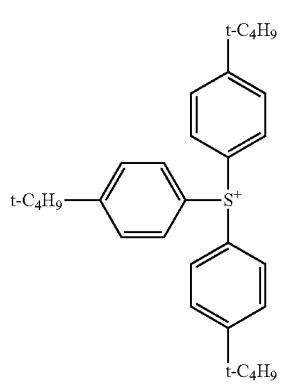
(b2-c-14)
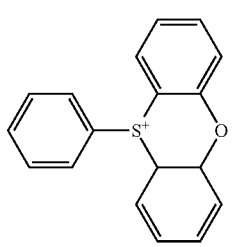
(b2-c-15)
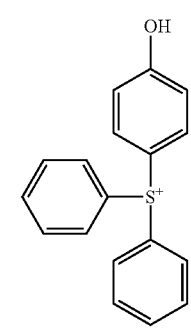
(b2-c-16)
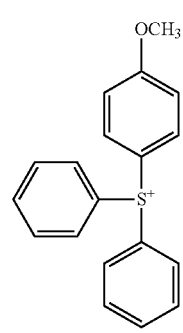
(b2-c-17)
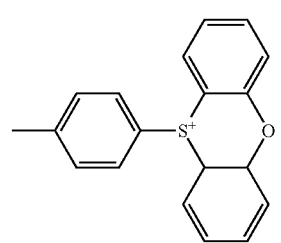

(b2-c-18)
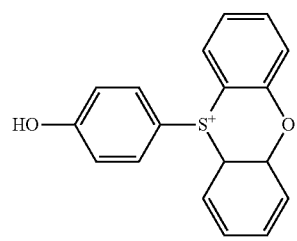
(b2-c-19)
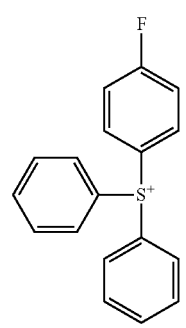
(b2-c-20)
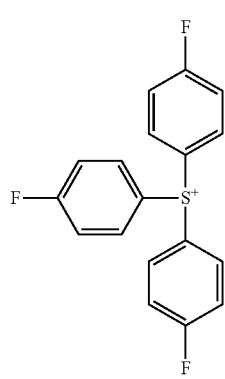
(b2-c-21)
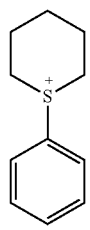
(b2-c-22)
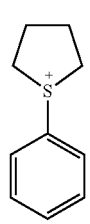
(b2-c-23)
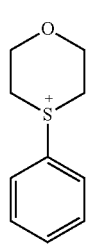
(b2-c-24)
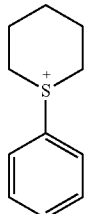
(b2-c-25)
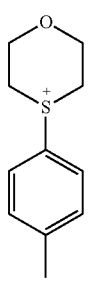
(b2-c-26)
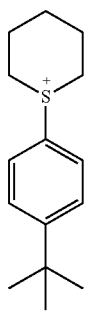
(b2-c-27)
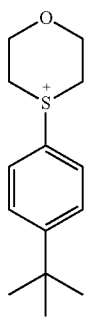
Examples of the cation (b2-2) include the following cations.
(b2-c-28)
(b2-c-29)
(b2-c-30)
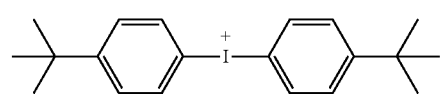

Examples of the cation (b2-3) include the following cations.
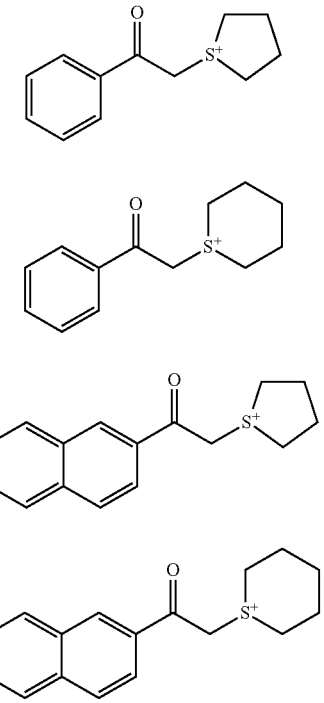
(b2-c-31)
(b2-c-32)
(b2-c-33)
(b2-c-34)
Examples of the cation (b2-4) include the following cations.
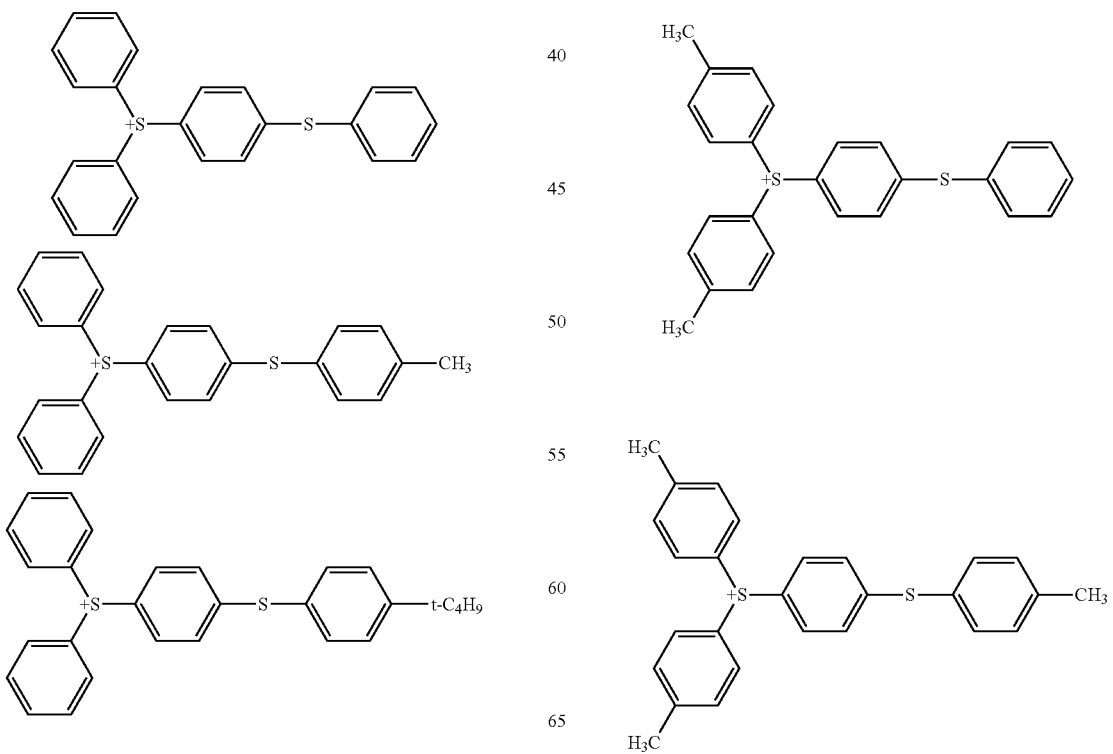
-continued
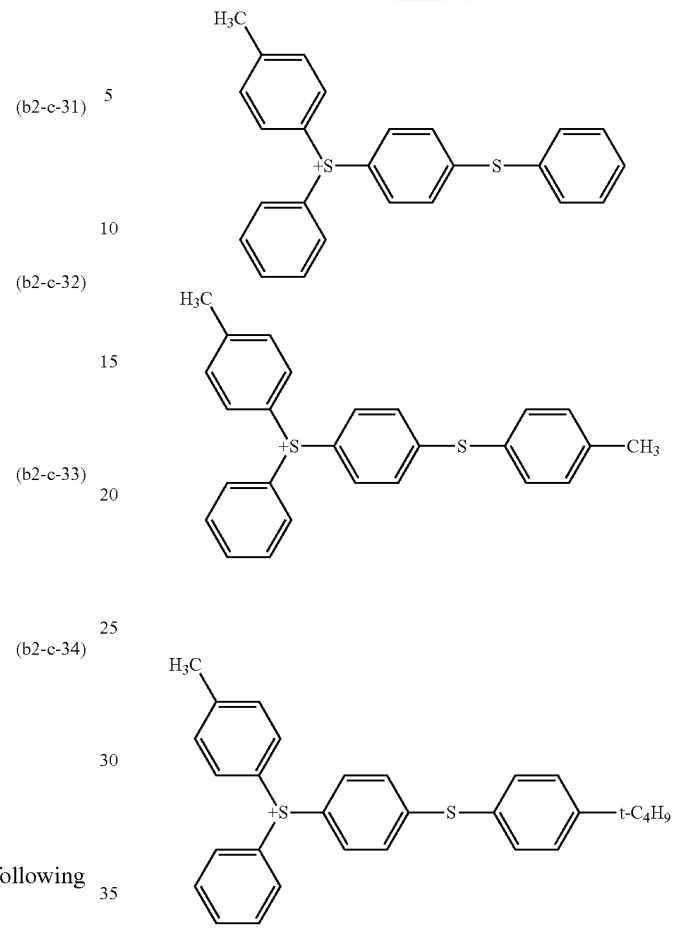

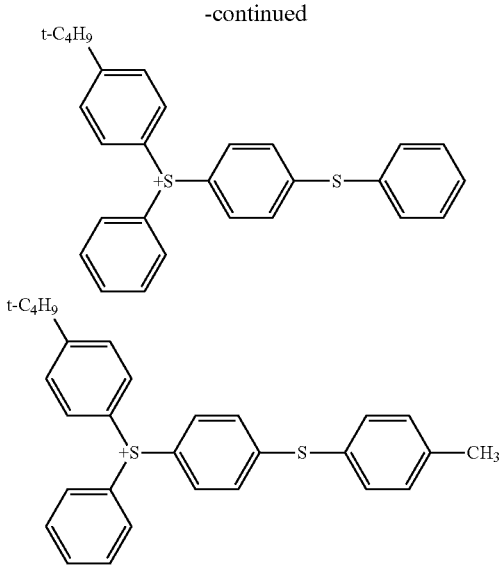

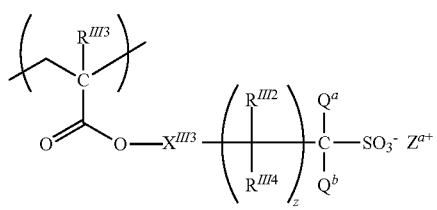

The structural unit represented by formula (II-2-A') is preferably a structural unit represented by formula (II-2-A):

(II-2-A)

wherein, in formula (II-2-A), $R^{III3}$, $X^{III3}$ and $Z^{a+}$ are the same as defined above, z represents an integer of 0 to 6, $R^{III2}$ and $R^{III4}$ each independently represent a hydrogen atom, a fluorine atom or a perfluoroalkyl group having 1 to 6 carbon atoms, and when z is 2 or more, a plurality of $R^{III2}$ and $R^{III4}$ may be the same or different from each other, and $Q^a$ and $Q^b$ each independently represent a fluorine atom or a perfluoroalkyl group having 1 to 6 carbon atoms.

Examples of the perfluoroalkyl group having 1 to 6 carbon atoms represented by $R^{III2}$, $R^{III4}$, $Q^a$ and $Q^b$ include those which are the same as the perfluoroalkyl group having 1 to 6 carbon atoms which is represented by the below-mentioned $Q^1$.

The structural unit represented by formula (II-2-A) is preferably a structural unit represented by formula (II-2-A-1):

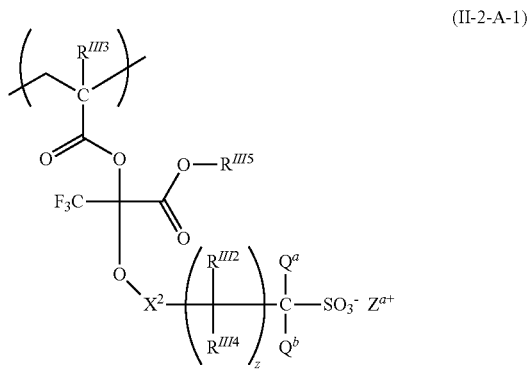

(II-2-A-1)

wherein, in formula (II-2-A-1), $R^{III2}$, $R^{III3}$, $R^{III4}$, $Q^a$, $Q^b$, z and $Z^{a+}$ are the same as defined above, $R^{III5}$ represents a saturated hydrocarbon group having 1 to 12 carbon atoms, and $X^2$ represents a divalent saturated hydrocarbon group having 1 to 11 carbon atoms, —$CH_2$— included in the saturated hydrocarbon group may be replaced by —O—, —S— or —CO—, and a hydrogen atom included in the saturated hydrocarbon group may be substituted with a halogen atom or a hydroxy group.

Examples of the saturated hydrocarbon group having 1 to 12 carbon atoms represented by $R^{III5}$ include linear or branched alkyl groups such as a methyl group, an ethyl group, a propyl group, an isopropyl group, a butyl group, a sec-butyl group, a tert-butyl group, a pentyl group, a hexyl group, a heptyl group, an octyl group, a nonyl group, a decyl group, an undecyl group and a dodecyl group.

Examples of the divalent saturated hydrocarbon group represented by $X^2$ include groups having 11 carbon atoms or less of specific examples of the divalent saturated hydrocarbon group represented by $X^{III3}$.

The structural unit represented by formula (II-2-A-1) is more preferably a structural unit represented by formula (II-2-A-2):

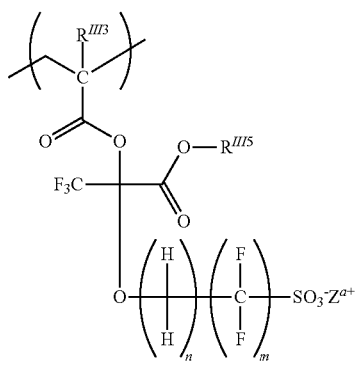
(II-2-A-2)
wherein, in formula (II-2-A-2), $R^{III3}$, $R^{III5}$ and $Z^{a+}$ are the same as defined above, and
m and n each independently represent 1 or 2.
The structural unit represented by formula (II-2-A-1) includes, for example, the following structural units and the structural units mentioned in WO 2012/050015 A. $Z^{a+}$ represents an organic cation.
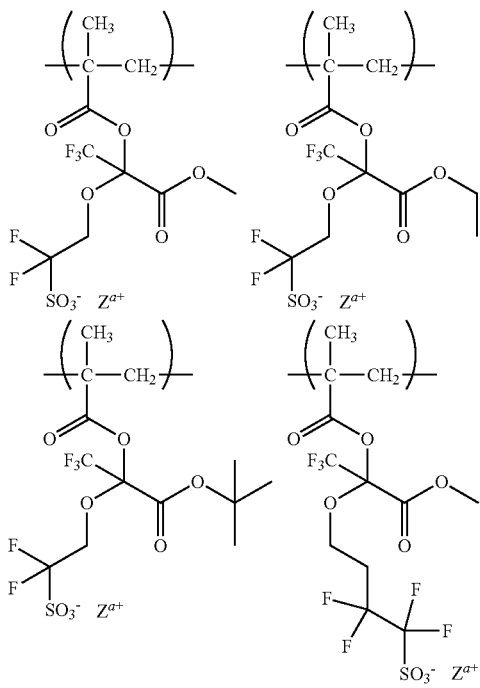
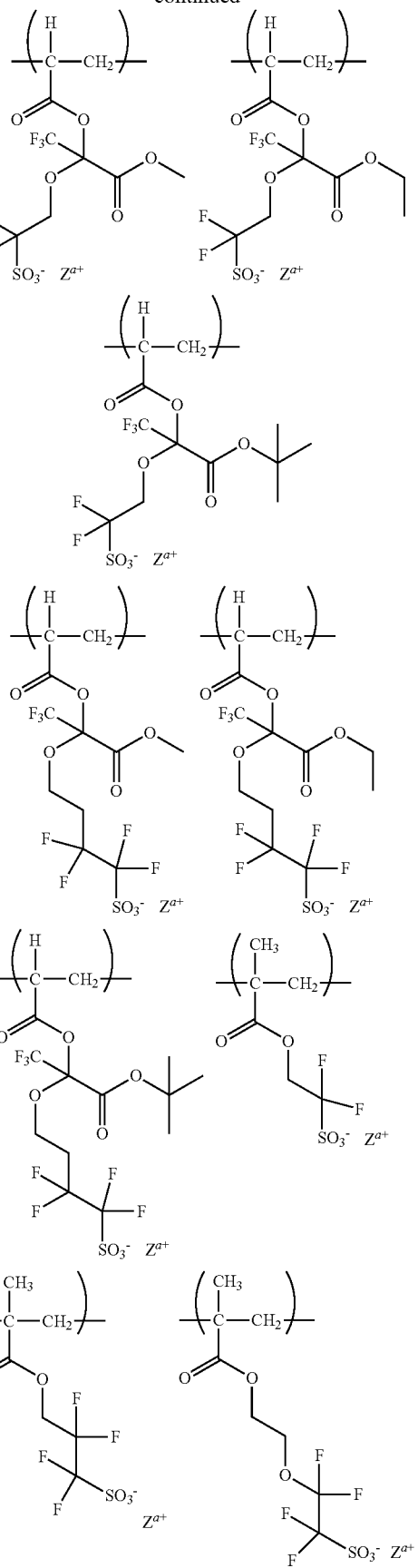

-continued

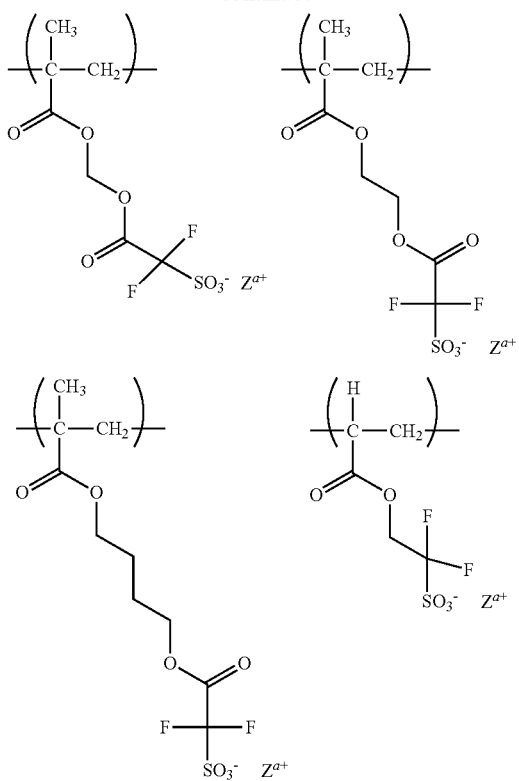

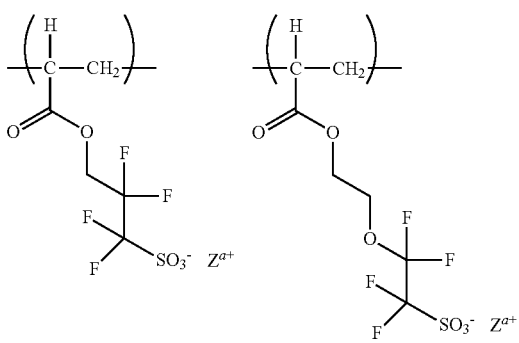

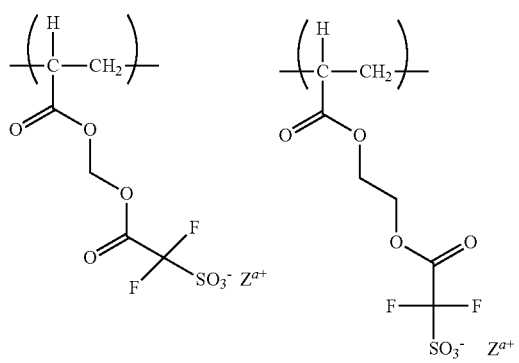

-continued

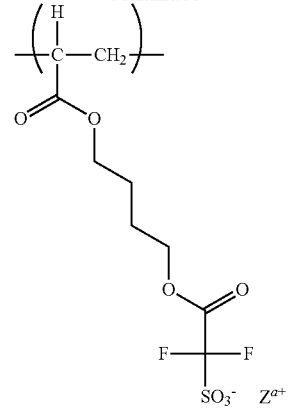

The structural unit having a sulfonio group and an organic anion in a side chain is preferably a structural unit represented by formula (II-1-1):

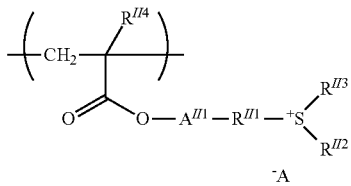

wherein, in formula (II-1-1), $A^{II1}$ represents a single bond or a divalent linking group, $R^{II1}$ represents a divalent aromatic hydrocarbon group having 6 to 18 carbon atoms, $R^{II2}$ and $R^{II3}$ each independently represent a hydrocarbon group having 1 to 18 carbon atoms, and $R^{II2}$ and $R^{II3}$ may be bonded each other to form a ring together with $S^+$ to which $R^{II2}$ and $R^{II3}$ are bonded, $R^{II4}$ represents a hydrogen atom, a halogen atom or an alkyl group having 1 to 6 carbon atoms which may have a halogen atom, and $A^-$ represents an organic anion.

Examples of the divalent aromatic hydrocarbon group having 6 to 18 carbon atoms represented by $R^{II1}$ include a phenylene group and a naphthylene group.

Examples of the hydrocarbon group having 1 to 18 carbon atoms represented by $R^{II2}$ and $R^{II3}$ include an alkyl group having 1 to 18 carbon atoms, an alicyclic hydrocarbon group having 3 to 18 carbon atoms, an aromatic hydrocarbon group having 6 to 18 carbon atoms and the like. Examples of the alkyl group having 1 to 18 carbon atoms include linear or branched alkyl groups such as a methyl group, an ethyl group, a propyl group, an isopropyl group, a butyl group, a sec-butyl group, a tert-butyl group, a pentyl group, a hexyl group, a heptyl group, an octyl group, a nonyl group, a decyl group, an undecyl group and a dodecyl group. Examples of the alicyclic hydrocarbon group having 3 to 18 carbon atoms include cycloalkyl groups such as a cyclopropyl group, a cyclopentyl group, a cyclohexyl group, a cycloheptyl group, a cyclooctyl group, a methylcyclohexyl group, a dimethylcyclohexyl group and a methylnorbornyl group; and polycyclic alicyclic hydrocarbon groups such as a decahydronaphthyl group, an adamantyl group, a norbornyl group, an adamantylcyclohexyl group and the like. Examples of the aromatic hydrocarbon group having 6 to 18 carbon atoms include a phenyl group, a naphthyl group, an anthracenyl group and the like. The ring formed by bonding $R^{II2}$ and $R^{II3}$ each other together with $S^+$ may further have an oxygen atom or may have a polycyclic structure.

Examples of the halogen atom represented by $R^{II4}$ include a fluorine atom, a chlorine atom, a bromine atom and an iodine atom.

Examples of the alkyl group having 1 to 6 carbon atoms which may have a halogen atom represented by $R^{II4}$ include those which are the same as the alkyl group having 1 to 6 carbon atoms which may have a halogen atom represented by $R^{a8}$.

Examples of the divalent linking group represented by $A^{II1}$ include a divalent saturated hydrocarbon group having 1 to 18 carbon atoms, and —$CH_2$— included in the divalent saturated hydrocarbon group may be replaced by —O—, —S— or —CO—. Specific examples thereof include those which are the same as a divalent saturated hydrocarbon group having 1 to 18 carbon atoms represented by $X^{III3}$.

Examples of the structural unit including a cation in formula (II-1-1) include the following structural units.

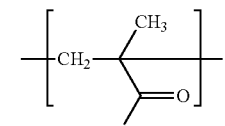

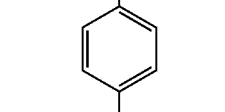

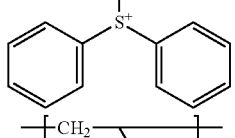

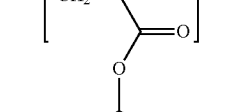

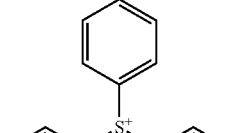

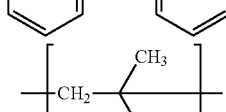

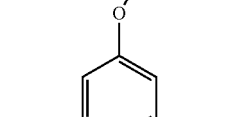

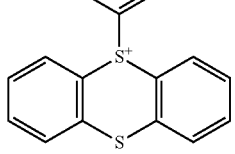

-continued

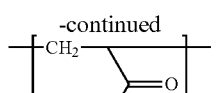

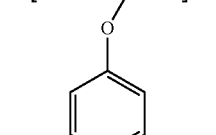

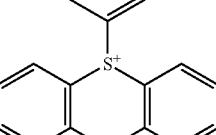

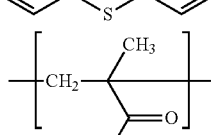

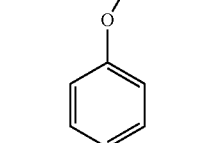

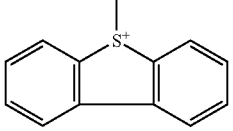

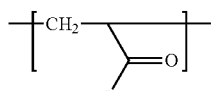

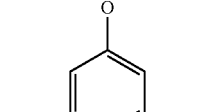

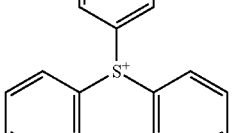

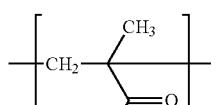

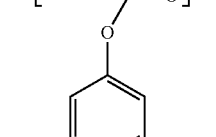

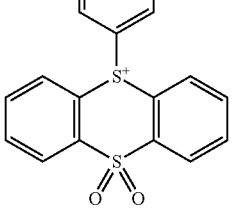

95
-continued
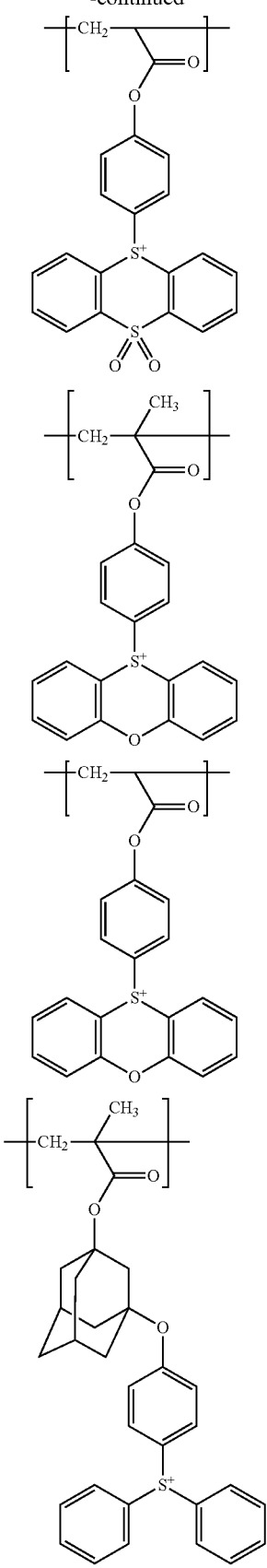
96
-continued
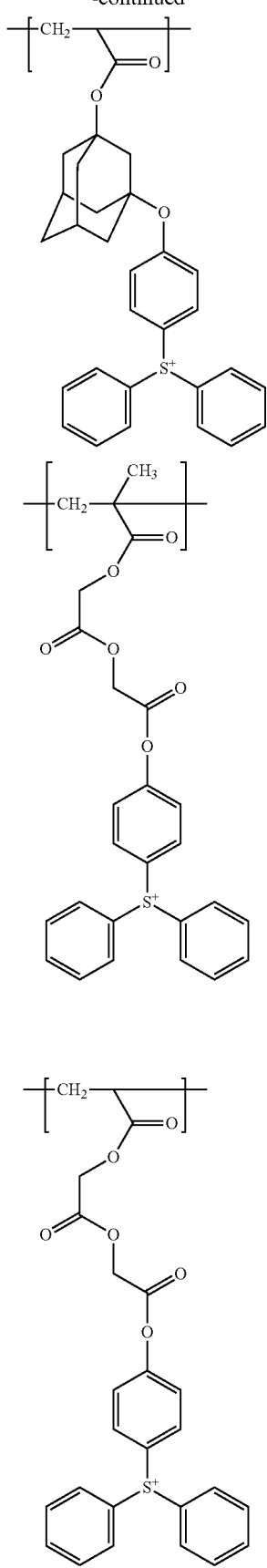

-continued
97
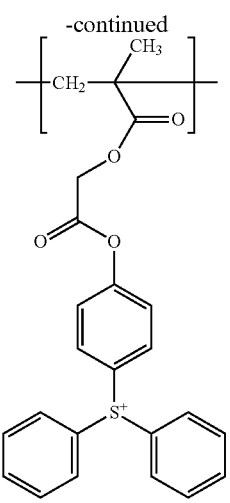
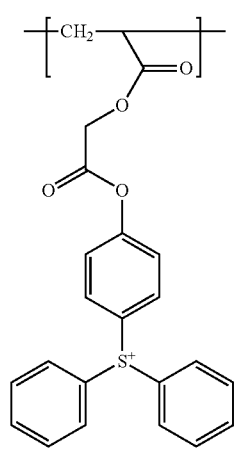
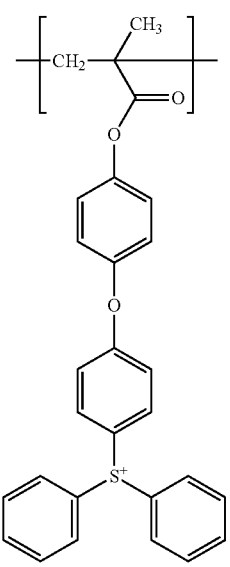
98
-continued
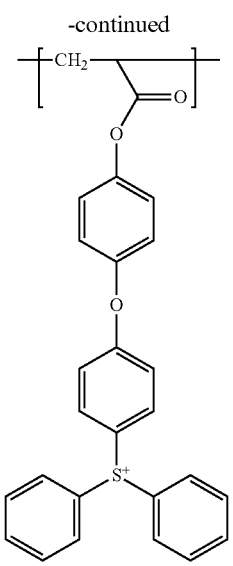
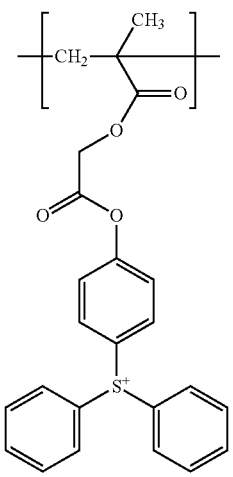
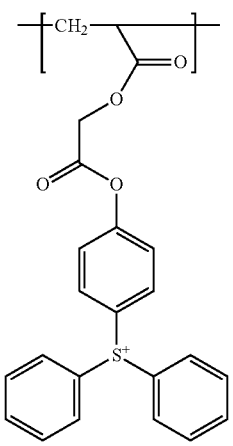

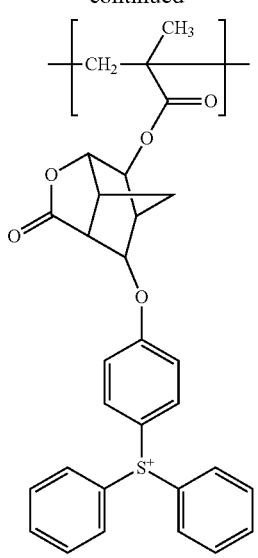

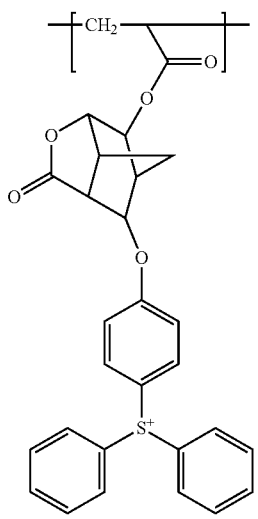

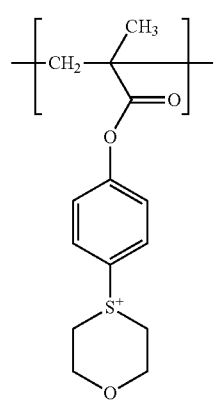

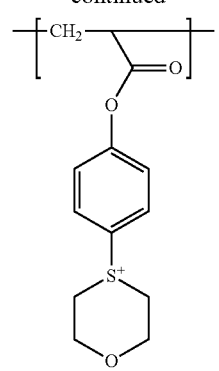

Examples of the organic anion represented by A⁻ include a sulfonic acid anion, a sulfonylimide anion, a sulfonylmethide anion and a carboxylic acid anion. The organic anion represented by A⁻ is preferably a sulfonic acid anion, and more preferably an anion included in the below-mentioned acid generator (B1).

Examples of the sulfonylimide anion represented by A⁻ include the followings.

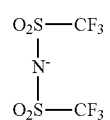

(I-b-1)

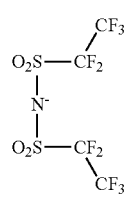

(I-b-2)

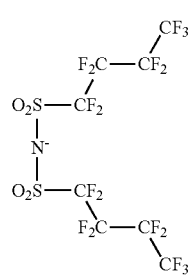

(I-b-3)

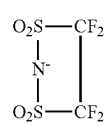

(I-b-4)

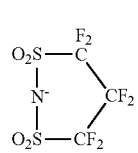

(I-b-5)

Examples of the structural unit represented by formula (II-1-1) include the following structural units.

101
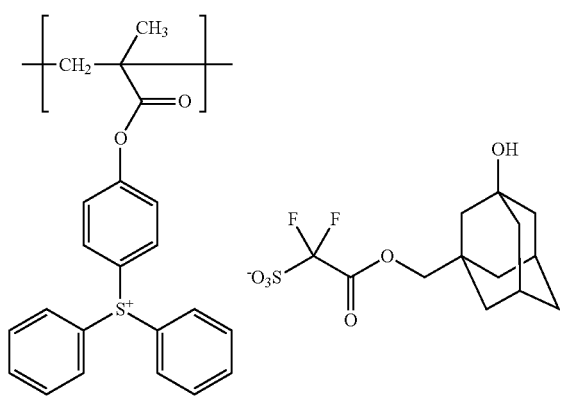
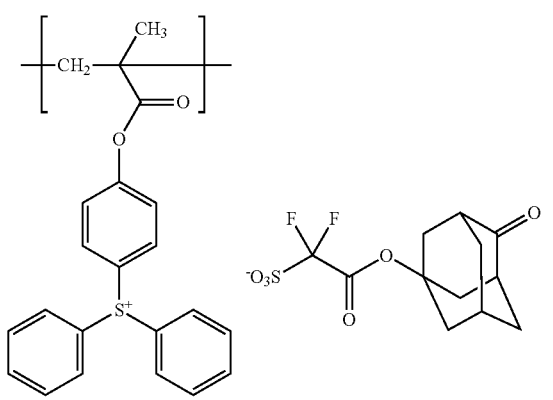
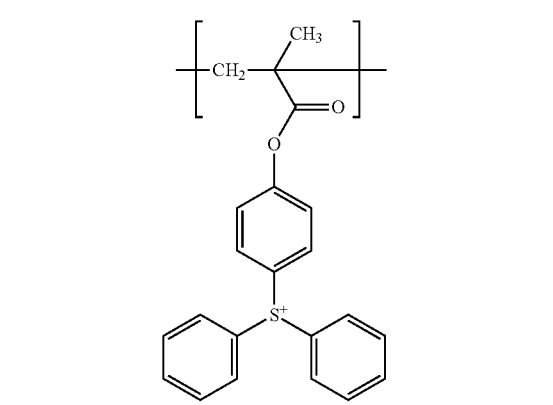
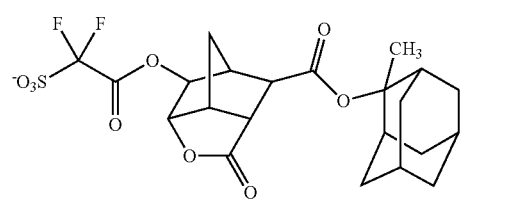
102
-continued
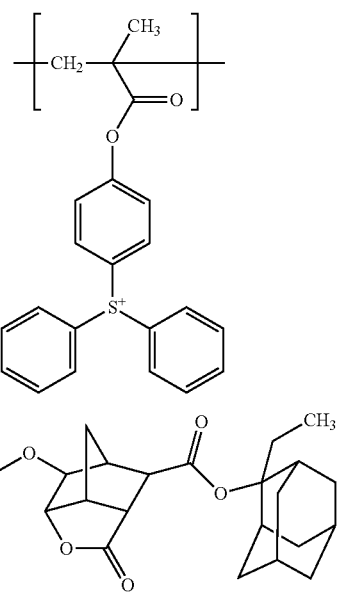
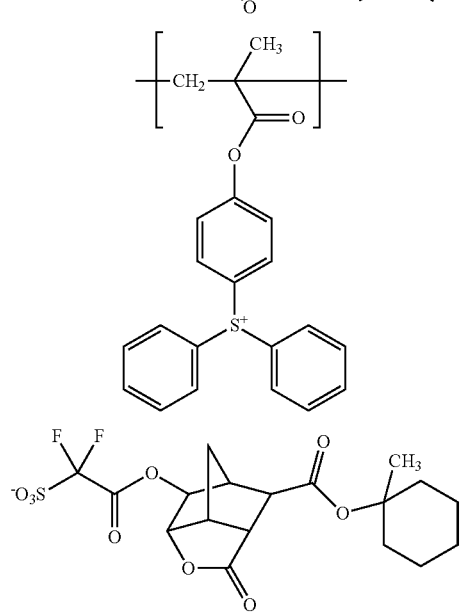
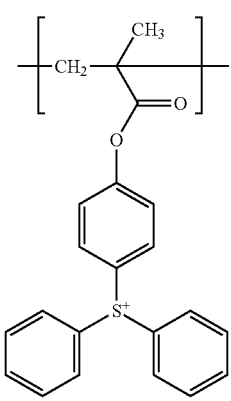

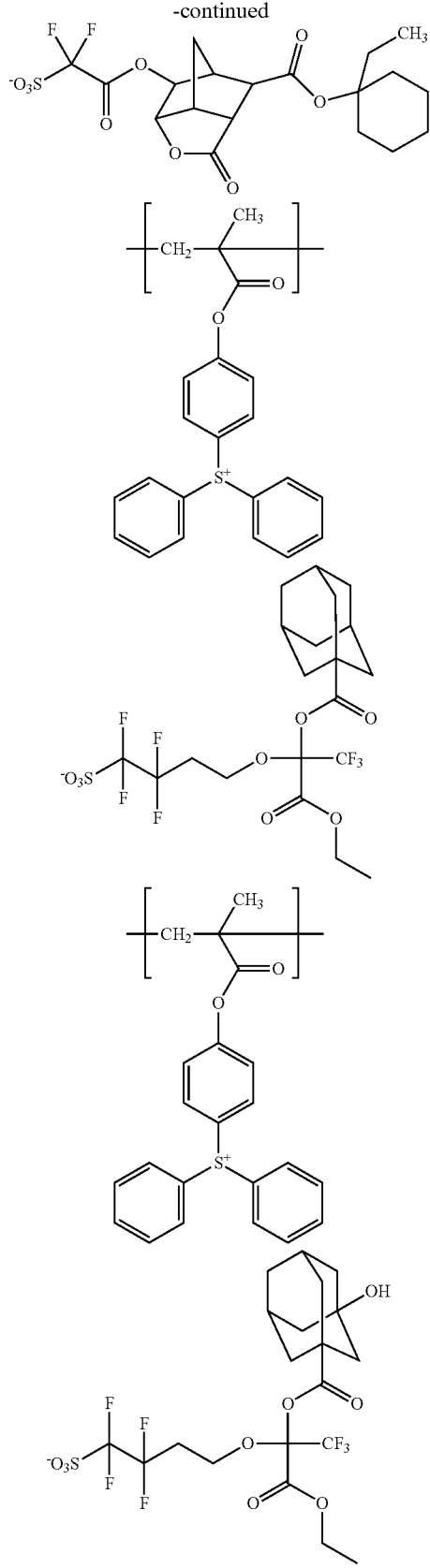

When the structural unit (II) is included in the resin (A), the content of the structural unit (II) is preferably 1 to 20 mol %, more preferably 2 to 15 mol %, and still more preferably 3 to 10 mol %, based on all structural units of the resin (A).

The resin (A) is preferably a resin composed of a structural unit (I), a structural unit (a1) and a structural unit(s), i.e. a copolymer of a compound (I'), a monomer (a1) and a monomer(s).

The structural unit (a1) is preferably at least one selected from a structural unit (a1-1) and a structural unit (a1-2) (preferably the structural unit having a cyclohexyl group, a cyclopentyl group), and more preferably at least two selected from a structural unit (a1-1) or a structural unit (a1-1) and a structural unit (a1-2) (preferably the structural unit having a cyclohexyl group, a cyclopentyl group).

The structural unit(s) is preferably at least one of a structural unit (a2) and a structural unit (a3). The structural unit (a2) is preferably a structural unit represented by formula (a2-1). The structural unit (a3) is preferably at least one selected from structural units represented by formula (a3-1-1) to formula (a3-1-4), and structural units represented by formula (a3-2-1) to formula (a3-2-4) and formula (a3-4-1) to formula (a3-4-2).

The structural unit (I), the structural unit (a1), the structural unit(s), the structural unit (a4), the structural unit (a5) and the structural unit (II) which constitute the resin (A) may be used alone, or two or more structural units may be used in combination. Using a monomer from which these structural units are derived, it is possible to produce by a known polymerization method (e.g., radical polymerization method). The content of the respective structural units included in the resin (A) can be adjusted according to the amount of the monomer used in the polymerization.

The weight-average molecular weight of the resin (A) is preferably 2,000 or more (more preferably 2,500 or more, and still more preferably 3,000 or more), and 50,000 or less (more preferably 30,000 or less, and still more preferably 15,000 or less). In the present description, the weight-average molecular weight is a value determined by gel permeation chromatography under the conditions mentioned in Examples.

[Resist Composition]

The resist composition of the present invention includes a resin (A).

Examples of the resist composition of the present invention include a resist composition including the resin (A) and an acid generator (hereinafter sometimes referred to as "acid generator (B)").

When the resist composition of the present invention does not include the acid generator (B), it is preferable to include a resin (A) including a structural unit (II).

It is preferable that the resist composition of the present invention includes, in addition to the resin (A) and the acid generator (B), a resin other than the resin (A), a quencher (hereinafter sometimes referred to as "quencher (C)") and/or a solvent (hereinafter sometimes referred to as "solvent (E)").

<Resin Other than Resin (A)>

Examples of the resin other than the resin (A) include a resin including a structural unit (a4) (hereinafter sometimes referred to as "resin (X)"). Examples of the structural unit, which may be further included in the resin (X), include a structural unit (a1), a structural unit (a2), a structural unit (a3), a structural unit (a5) and other known structural units.

The resin (X) is more preferably a resin composed of a structural unit (a4) and/or a structural unit (a5).

When resin (X) includes the structural unit (a4), the content is preferably 40 mol % or more, more preferably 45 mol % or more, and still more preferably 50 mol % or more, based on all structural units of the resin (X).

When the resin (X) includes the structural unit (a5), the content is preferably 10 to 60 mol %, more preferably 20 to 55 mol %, and still more preferably 25 to 50 mol %, based on all structural units of the resin (X).

The structural unit (a1), the structural unit(s), the structural unit (a4) and the structural unit (a5), which constitute the resin (X), may be used alone, or two or more structural units may be used in combination. Using a monomer from which these structural units are derived, it is possible to produce by a known polymerization method (e.g., radical polymerization method). The content of the respective structural units included in the resin (X) can be adjusted according to the amount of the monomer used in the polymerization.

The weight-average molecular weight of the resin (X) is preferably 6,000 or more (more preferably 7,000 or more), and 80,000 or less (more preferably 60,000 or less). The measurement means of the weight-average molecular weight of such resin (X) is the same as in the case of the resin (A).

When the resist composition includes the resin (X), the content is preferably 1 to 60 parts by mass, more preferably 1 to 50 parts by mass, still more preferably 1 to 40 parts by mass, and particularly preferably 2 to 30 parts by mass, based on 100 parts by mass of the resin (A).

The total content of the resin (A) and the resin other than the resin (A) is preferably 80% by mass or more and 99% by mass or less, and more preferably 90% by mass or more and 99% by mass or less, based on the solid component of the resist composition. The solid component of the resist composition and the content of the resin thereto can be measured by a known analysis means such as liquid chromatography or gas chromatography.

<Acid Generator (B)>

It is preferable that the resist composition of the present invention further include an acid generator (B).

The acid generator is classified into nonionic and ionic acid generators, and either nonionic or ionic acid generator may be used as the acid generator (B) of the resist composition of the present invention. Examples of the nonionic acid generator include organic halides, sulfonate esters (e.g., 2-nitrobenzyl ester, aromatic sulfonate, oxime sulfonate, N-sulfonyloxyimide, sulfonyloxyketone, diazonaphthoquinone 4-sulfonate), sulfones (e.g., disulfone, ketosulfone, sulfonyldiazomethane) and the like. Typical examples of the ionic acid generator include onium salts containing an onium cation (e.g., diazonium salt, phosphonium salt, sulfonium salt, iodonium salt). Examples of the anion of the onium salt include sulfonic acid anion, sulfonylimide anion, sulfonylmethide anion and the like.

Specific examples of the acid generator (B) include compounds generating an acid upon exposure to radiation mentioned in JP 63-26653 A, JP 55-164824 A, JP 62-69263 A, JP 63-146038 A, JP 63-163452 A, JP 62-153853 A, JP 63-146029 A, U.S. Pat. Nos. 3,779,778, and 3,849,137, DE Patent No. 3914407 and EP Patent No. 126,712. Compounds produced by a known method may also be used. The acid generator (B) may be used alone, or two or more acid generators may also be used in combination.

The acid generator (B) is preferably a fluorine-containing acid generator, and more preferably a salt represented by formula (B1) (hereinafter sometimes referred to as "acid generator (B1)"):

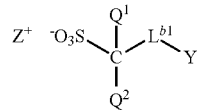

(B1)

wherein, in formula (B1), $Q^1$ and $Q^2$ each independently represent a fluorine atom or a perfluoroalkyl group having 1 to 6 carbon atoms, $L^{b1}$ represents a divalent saturated hydrocarbon group having 1 to 24 carbon atoms which may have a substituent, —CH$_2$— included in the divalent saturated hydrocarbon group may be replaced by —O— or —CO—, and a hydrogen atom included in the divalent saturated hydrocarbon group may be substituted with a fluorine atom or a hydroxy group, Y represents a hydrogen atom or an alicyclic hydrocarbon group having 3 to 18 carbon atoms which may have a substituent, and —CH$_2$— included in the alicyclic hydrocarbon group may be replaced by —O—, —S(O)$_2$— or —CO—, and $Z^+$ represents an organic cation.

Examples of the perfluoroalkyl group of $Q^1$ and $Q^2$ include a trifluoromethyl group, a perfluoroethyl group, a perfluoropropyl group, a perfluoroisopropyl group, a perfluorobutyl group, a perfluorosec-butyl group, a perfluorotert-butyl group, a perfluoropentyl group and a perfluorohexyl group and the like.

Preferably, $Q^1$ and $Q^2$ are each independently a fluorine atom or trifluoromethyl group, and more preferably, both are fluorine atoms. Examples of the divalent saturated hydrocarbon group of $L^{b1}$ include a linear alkanediyl group, a branched alkanediyl group, and a monocyclic or polycyclic divalent alicyclic saturated hydrocarbon group, or the divalent saturated hydrocarbon group may be a group formed by using two or more of these groups in combination.

Specific examples thereof include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group;

branched alkanediyl groups such as an ethane-1,1-diyl group, a propane-1,1-diyl group, a propane-1,2-diyl group, a propane-2,2-diyl group, a pentane-2,4-diyl group, a 2-methylpropane-1,3-diyl group, a 2-methylpropane-1,2-diyl group, a pentane-1,4-diyl group and a 2-methylbutane-1,4-diyl group;

monocyclic divalent alicyclic saturated hydrocarbon groups which are cycloalkanediyl groups such as a cyclobutane-1,3-diyl group, a cyclopentane-1,3-diyl group, a cyclohexane-1,4-diyl group and a cyclooctane-1,5-diyl group; and polycyclic divalent alicyclic saturated hydrocarbon groups such as a norbornane-1,4-diyl group, a norbornane-2,5-diyl group, an adamantane-1,5-diyl group and an adamantane-2,6-diyl group.

The group in which —CH$_2$— included in the divalent saturated hydrocarbon group of $L^{b1}$ is replaced by —O— or —CO— includes, for example, a group represented by any one of formula (b1-1) to formula (b1-3). In formula (b1-1) to formula (b1-3) and the following specific examples, * represents a bond to —Y.

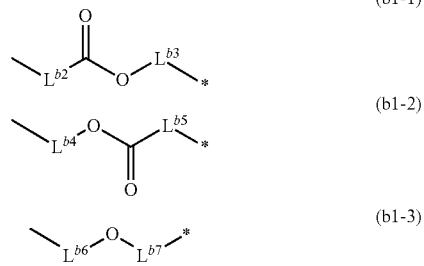

In formula (b1-1),
$L^{b2}$ represents a single bond or a divalent saturated hydrocarbon group having 1 to 22 carbon atoms, and a hydrogen atom included in the saturated hydrocarbon group may be substituted with a fluorine atom, $L^{b3}$ represents a single bond or a divalent saturated hydrocarbon group having 1 to 22 carbon atoms, a hydrogen atom included in the saturated hydrocarbon group may be substituted with a fluorine atom or a hydroxy group, and a methylene group included in the saturated hydrocarbon group may be substituted with an oxygen atom or a carbonyl group, and the total number of carbon atoms of $L^{b2}$ and $L^{b3}$ is 22 or less.

In formula (b1-2),
$L^{b4}$ represents a single bond or a divalent saturated hydrocarbon group having 1 to 22 carbon atoms, and a hydrogen atom included in the saturated hydrocarbon group may be substituted with a fluorine atom, $L^{b5}$ represents a single bond or a divalent saturated hydrocarbon group having 1 to 22 carbon atoms, a hydrogen atom included in the saturated hydrocarbon group may be substituted with a fluorine atom or a hydroxy group, and a methylene group included in the saturated hydrocarbon group may be substituted with an oxygen atom or a carbonyl group, and the total number of carbon atoms of $L^{b4}$ and $L^{b5}$ is 22 or less.

In formula (b1-3),
$L^{b6}$ represents a single bond or a divalent saturated hydrocarbon group having 1 to 23 carbon atoms, and a hydrogen atom included in the saturated hydrocarbon group may be substituted with a fluorine atom or a hydroxy group,
$L^{b7}$ represents a single bond or a divalent saturated hydrocarbon group having 1 to 23 carbon atoms, a hydrogen atom included in the saturated hydrocarbon group may be substituted with a fluorine atom or a hydroxy group, and a methylene group included in the saturated hydrocarbon group may be substituted with an oxygen atom or a carbonyl group, and the total number of carbon atoms of $L^{b6}$ and $L^{b7}$ is 23 or less.

In groups of formula (b1-1) to formula (b1-3), when a methylene group included in the saturated hydrocarbon group is substituted with an oxygen atom or a carbonyl group, the number of carbon atoms before replacement is taken as the number of carbon atoms of the saturated hydrocarbon group.

Examples of the divalent saturated hydrocarbon group include those which are the same as the divalent saturated hydrocarbon group of $L^{b1}$.

$L^{b2}$ is preferably a single bond.
$L^{b3}$ is preferably a divalent saturated hydrocarbon group having 1 to 4 carbon atoms.
$L^{b4}$ is preferably a divalent saturated hydrocarbon group having 1 to 8 carbon atoms, and a hydrogen atom included in the divalent saturated hydrocarbon group may be substituted with a fluorine atom.
$L^{b5}$ is preferably a single bond or a divalent saturated hydrocarbon group having 1 to 8 carbon atoms.
$L^{b6}$ is preferably a single bond or a divalent saturated hydrocarbon group having 1 to 4 carbon atoms, and a hydrogen atom included in the saturated hydrocarbon group may be substituted with a fluorine atom.
$L^{b7}$ is preferably a single bond or a divalent saturated hydrocarbon group having 1 to 18 carbon atoms, a hydrogen atom included in the saturated hydrocarbon group may be substituted with a fluorine atom or a hydroxy group, and a methylene group included in the divalent saturated hydrocarbon group may be substituted with an oxygen atom or a carbonyl group.

The group in which —CH$_2$— included in the divalent saturated hydrocarbon group of $L^{b1}$ is replaced by —O— or —CO— is preferably a group represented by formula (b1-1) or formula (b1-3).

Examples of the group represented by formula (b1-1) include groups represented by formula (b1-4) to formula (b1-8).

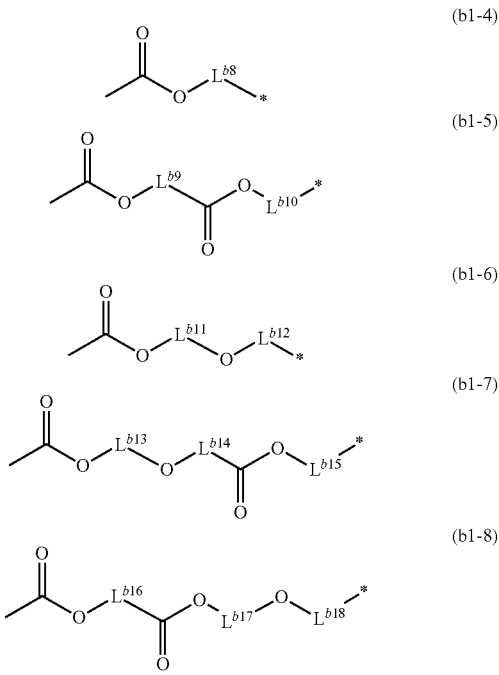

In formula (b1-4),
$L^{b8}$ represents a single bond or a divalent saturated hydrocarbon group having 1 to 22 carbon atoms, and a hydrogen atom included in the saturated hydrocarbon group may be substituted with a fluorine atom or a hydroxy group.

In formula (b1-5),
$L^{b9}$ represents a divalent saturated hydrocarbon group having 1 to 20 carbon atoms,
$L^{b10}$ represents a single bond or a divalent saturated hydrocarbon group having 1 to 19 carbon atoms, and a hydrogen atom included in the divalent saturated hydrocarbon group may be substituted with a fluorine atom or a hydroxy group, and the total number of carbon atoms of $L^{b9}$ and $L^{b10}$ is 20 or less.

In formula (b1-6),
$L^{b11}$ represents a divalent saturated hydrocarbon group having 1 to 21 carbon atoms,
$L^{b12}$ represents a single bond or a divalent saturated hydrocarbon group having 1 to 20 carbon atoms, and a hydrogen atom included in the divalent saturated hydrocarbon group may be substituted with a fluorine atom or a hydroxy group, and
the total number of carbon atoms of $L^{b11}$ and $L^{b12}$ is 21 or less.

In formula (b1-7),
$L^{b13}$ represents a divalent saturated hydrocarbon group having 1 to 19 carbon atoms,
$L^{b14}$ represents a single bond or a divalent saturated hydrocarbon group having 1 to 18 carbon atoms,
$L^{b15}$ represents a single bond or a divalent saturated hydrocarbon group having 1 to 18 carbon atoms, and a hydrogen atom included in the divalent saturated hydrocarbon group may be substituted with a fluorine atom or a hydroxy group, and the total number of carbon atoms of $L^{b13}$ to $L^{b15}$ is 19 or less.

In formula (b1-8),
$L^{b16}$ represents a divalent saturated hydrocarbon group having 1 to 18 carbon atoms,
$L^{b17}$ represents a divalent saturated hydrocarbon group having 1 to 18 carbon atoms,
$L^{b18}$ represents a single bond or a divalent saturated hydrocarbon group having 1 to 17 carbon atoms, and a hydrogen atom included in the divalent saturated hydrocarbon group may be substituted with a fluorine atom or a hydroxy group, and
the total number of carbon atoms of $L^{b16}$ to $L^{b18}$ is 19 or less.

$L^{b8}$ is preferably a divalent saturated hydrocarbon group having 1 to 4 carbon atoms.

$L^{b9}$ is preferably a divalent saturated hydrocarbon group having 1 to 8 carbon atoms.

$L^{b10}$ is preferably a single bond or a divalent saturated hydrocarbon group having 1 to 19 carbon atoms, and more preferably a single bond or a divalent saturated hydrocarbon group having 1 to 8 carbon atoms.

$L^{b11}$ is preferably a divalent saturated hydrocarbon group having 1 to 8 carbon atoms.

$L^{b12}$ is preferably a single bond or a divalent saturated hydrocarbon group having 1 to 8 carbon atoms.

$L^{b13}$ is preferably a divalent saturated hydrocarbon group having 1 to 12 carbon atoms.

$L^{b14}$ is preferably a single bond or a divalent saturated hydrocarbon group having 1 to 6 carbon atoms.

$L^{b15}$ is preferably a single bond or a divalent saturated hydrocarbon group having 1 to 18 carbon atoms, and more preferably a single bond or a divalent saturated hydrocarbon group having 1 to 8 carbon atoms.

$L^{b16}$ is preferably a divalent saturated hydrocarbon group having 1 to 12 carbon atoms.

$L^{b17}$ is preferably a divalent saturated hydrocarbon group having 1 to 6 carbon atoms.

$L^{b18}$ is preferably a single bond or a divalent saturated hydrocarbon group having 1 to 17 carbon atoms, and more preferably a single bond or a divalent saturated hydrocarbon group having 1 to 4 carbon atoms.

Examples of the group of formula (b1-3) include groups represented by formula (b1-9) to formula (b1-11).

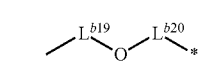
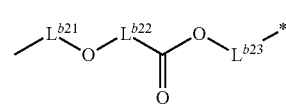
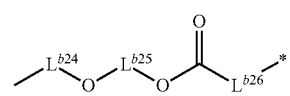

In formula (b1-9),
$L^{b19}$ represents a single bond or a divalent saturated hydrocarbon group having 1 to 23 carbon atoms, and a hydrogen atom included in the saturated hydrocarbon group may be substituted with a fluorine atom,
$L^{b20}$ represents a single bond or a divalent saturated hydrocarbon group having 1 to 23 carbon atoms, and a hydrogen atom included in the divalent saturated hydrocarbon group may be substituted with a fluorine atom, a hydroxy group or an acyloxy group, a methylene group included in the acyloxy group may be substituted with an oxygen atom or a carbonyl group, and a hydrogen atom included in the acyloxy group may be substituted with a hydroxy group, and
the total number of carbon atoms of $L^{b19}$ and $L^{b20}$ is 23 or less.

In formula (b1-10),
$L^{b21}$ represents a single bond or a divalent saturated hydrocarbon group having 1 to 21 carbon atoms, and a hydrogen atom included in the divalent saturated hydrocarbon group may be substituted with a fluorine atom,
$L^{b22}$ represents a single bond or a divalent saturated hydrocarbon group having 1 to 21 carbon atoms,
$L^{b23}$ represents a single bond or a divalent saturated hydrocarbon group having 1 to 21 carbon atoms, and a hydrogen atom included in the divalent saturated hydrocarbon group may be substituted with a fluorine atom, a hydroxy group or an acyloxy group, a methylene group included in the acyloxy group may be substituted with an oxygen atom or a carbonyl group, and a hydrogen atom included in the acyloxy group may be substituted with a hydroxy group, and
the total number of carbon atoms of $L^{b21}$ to $L^{b23}$ is 21 or less.

In formula (b1-11),
$L^{b24}$ represents a single bond or a divalent saturated hydrocarbon group having 1 to 20 carbon atoms, and a hydrogen atom included in the divalent saturated hydrocarbon group may be substituted with a fluorine atom,
$L^{b25}$ represents a divalent saturated hydrocarbon group having 1 to 21 carbon atoms,
$L^{b26}$ represents a single bond or a divalent saturated hydrocarbon group having 1 to 20 carbon atoms, a hydrogen atom included in the divalent saturated hydrocarbon group may be substituted with a fluorine atom, a hydroxy group or an acyloxy group, a methylene group included in the acyloxy group may be substituted with an oxygen atom or a carbonyl group, and a hydrogen atom included in the acyloxy group may be substituted with a hydroxy group, and
the total number of carbon atoms of $L^{b24}$ to $L^{b26}$ is 21 or less.

In formula (b1-9) to formula (b1-11), when a hydrogen atom included in the divalent saturated hydrocarbon group is substituted with an acyloxy group, the number of carbon atoms is taken as the number of carbon atoms of the divalent saturated hydrocarbon group, including the number of carbon atoms of the acyloxy group and the number of CO and O in an ester bond.

Examples of the acyloxy group include an acetyloxy group, a propionyloxy group, a butyryloxy group, a cyclohexylcarbonyloxy group, an adamantylcarbonyloxy group and the like.

Examples of the acyloxy group having a substituent include an oxoadamantylcarbonyloxy group, a hydroxyadamantylcarbonyloxy group, an oxocyclohexylcarbonyloxy group, a hydroxycyclohexylcarbonyloxy group and the like.

Examples of the group represented by formula (b1-4) of the group represented by formula (b1-1) include the followings.

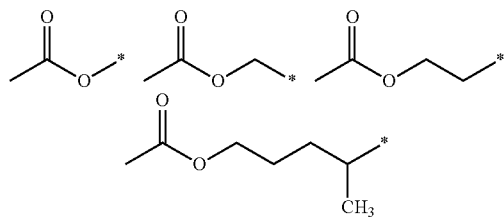

Examples of the group represented by formula (b1-5) of the group represented by formula (b1-1) include the followings:

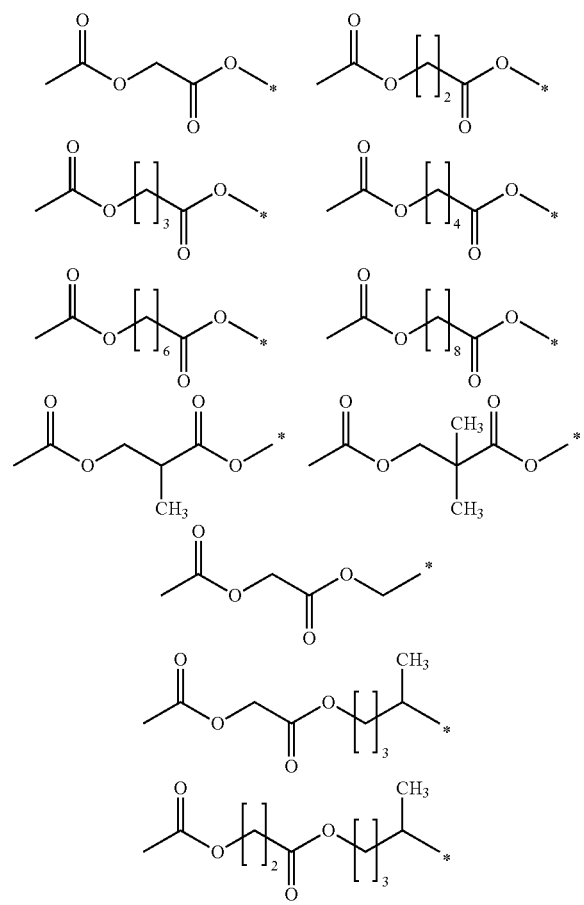

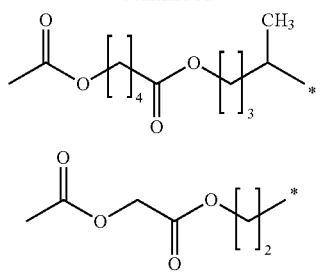

Examples of the group represented by formula (b1-6) of the group represented by formula (b1-1) include the followings:

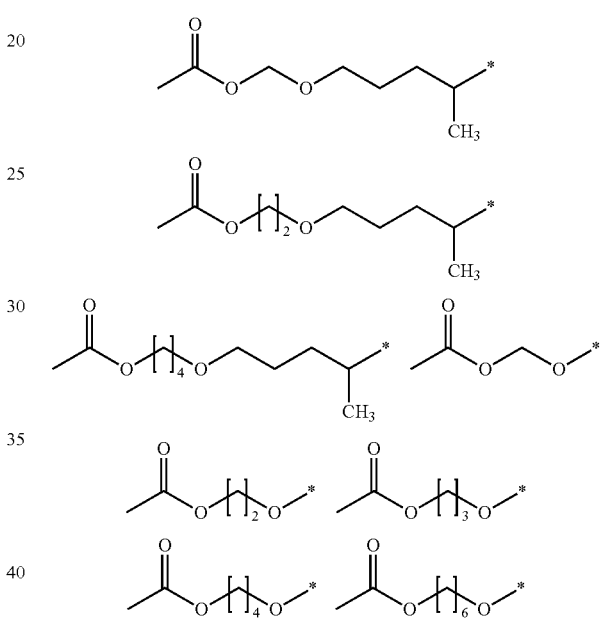

Examples of the group represented by formula (b1-7) of the group represented by formula (b1-1) include the followings:

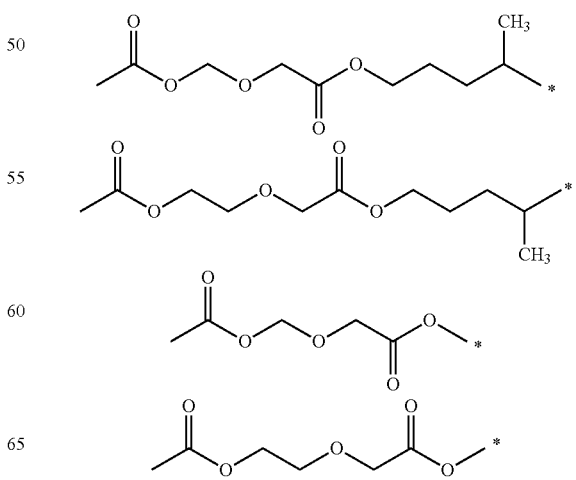

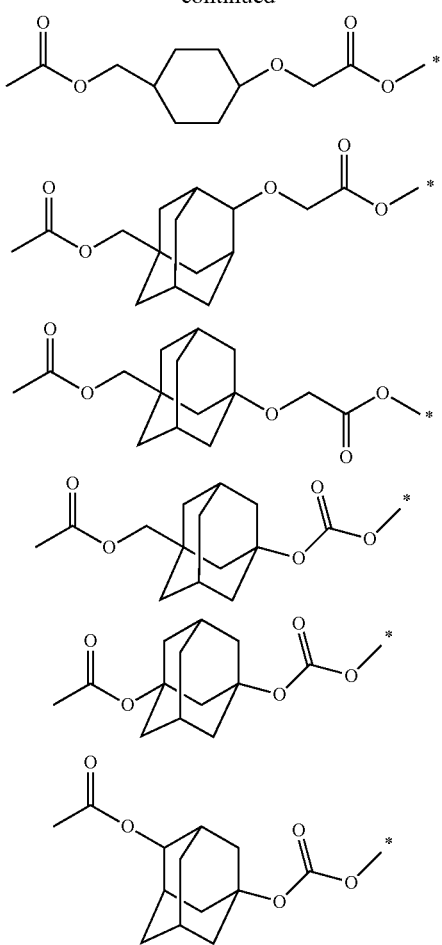
Examples of the group represented by formula (b1-8) of the group represented by formula (b1-1) include the followings:
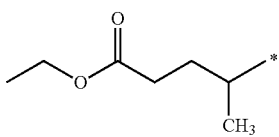
Examples of the group represented by formula (b1-2) include the followings:
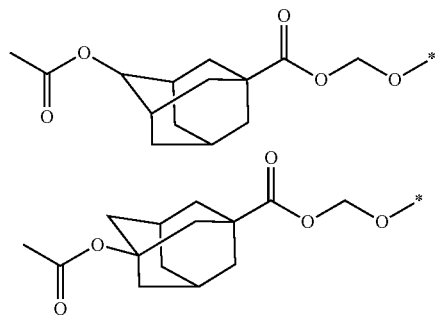
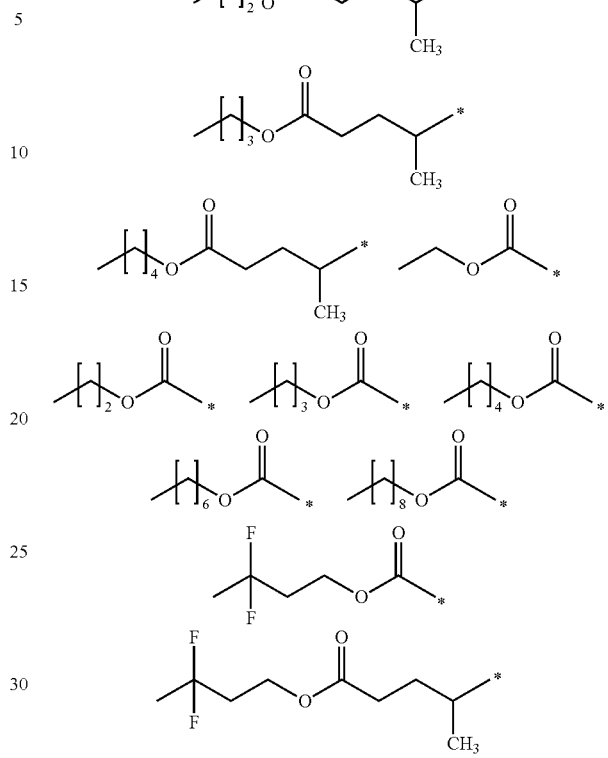
Examples of the group represented by formula (b1-9) of the group represented by formula (b1-3) include the followings:
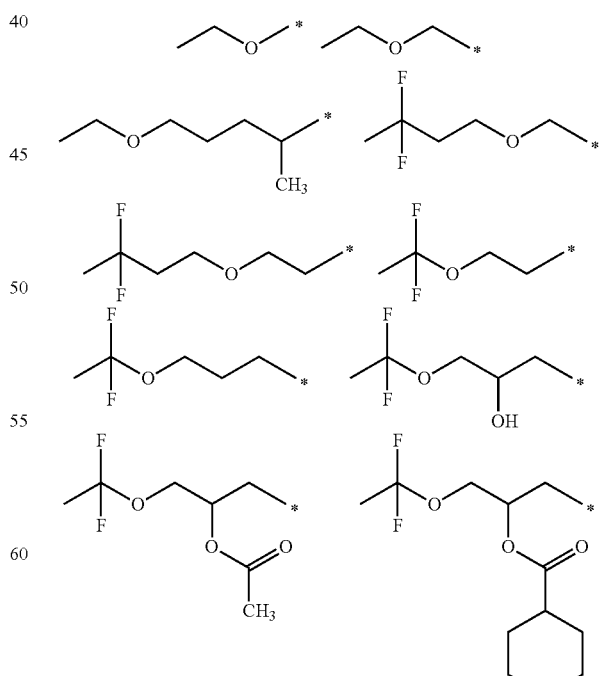

Examples of the group represented by formula (b1-10) of the group represented by formula (b1-3) include the followings:
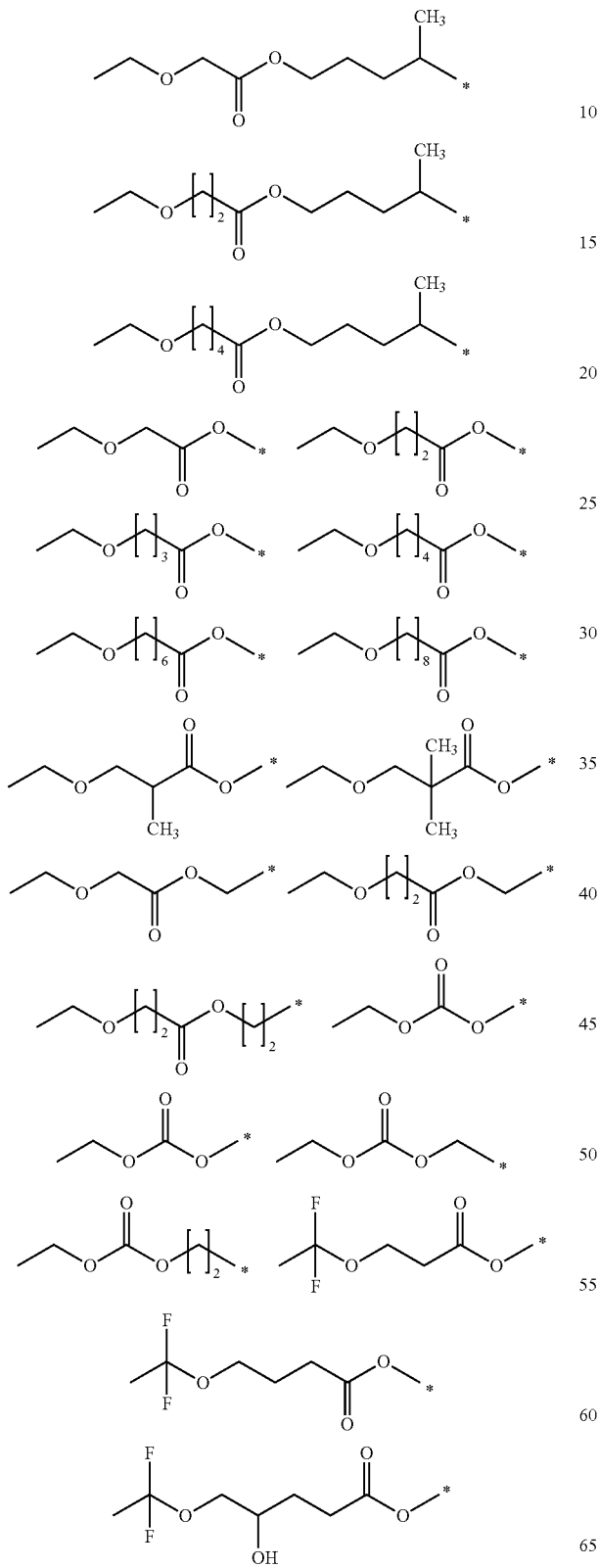
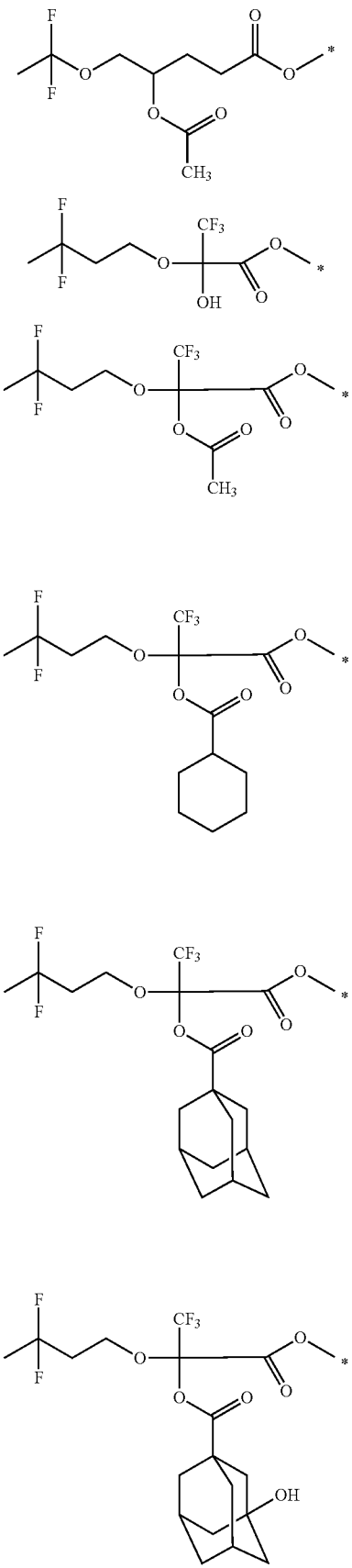

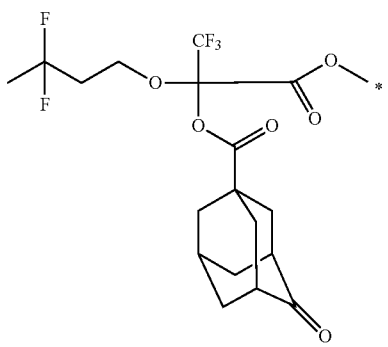
Examples of the group represented by formula (b1-11) of the group represented by formula (b1-3) include the followings:
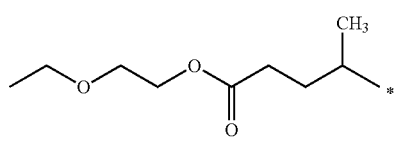
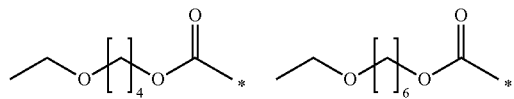
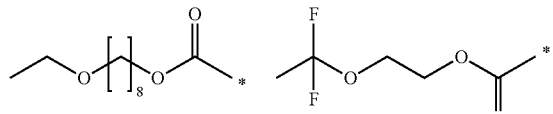
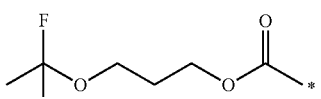
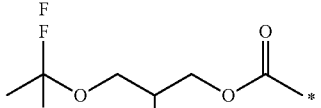
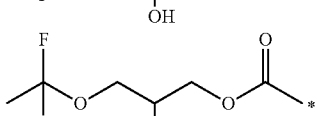
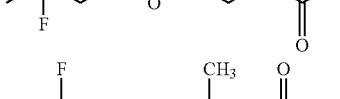
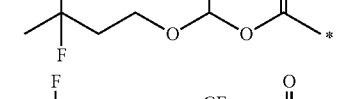
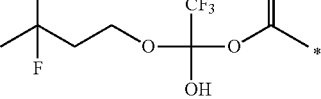
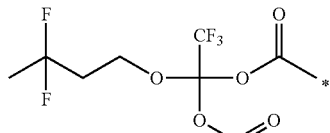
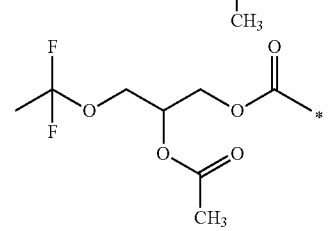
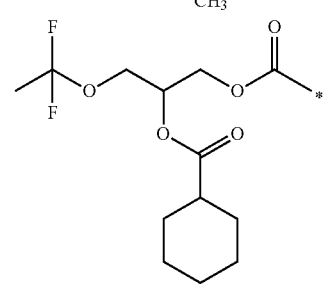
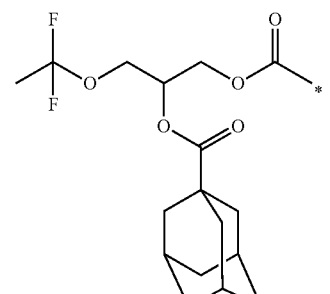
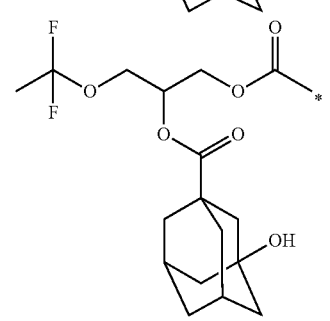
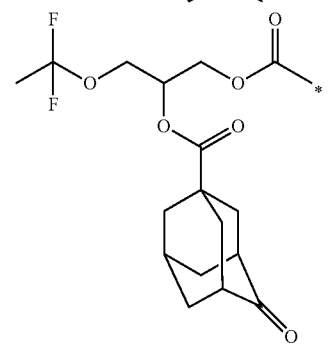
Examples of the alicyclic hydrocarbon group represented by Y include groups represented by formula (Y1) to formula (Y11) and formula (Y36) to formula (Y38).

When —CH$_2$— included in the alicyclic hydrocarbon group represented by Y is replaced by —O—, —S(O)$_2$— or —CO—, the number may be 1, or a plural of 2 or more. Examples of such group include groups represented by formula (Y12) to formula (Y35) and formula (Y36) to formula (Y38).
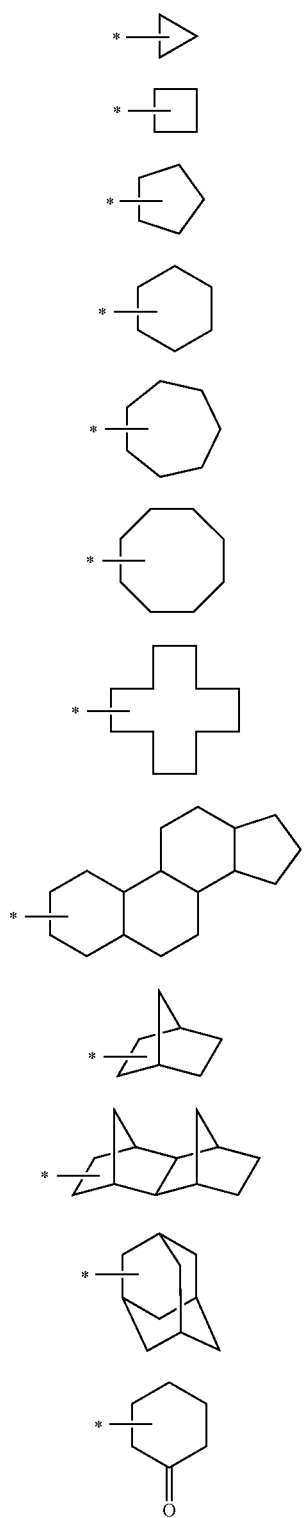
(Y1)
(Y2)
(Y3)
(Y4)
(Y5)
(Y6)
(Y7)
(Y8)
(Y9)
(Y10)
(Y11)
(Y12)
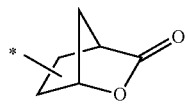
(Y13)
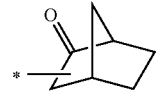
(Y14)
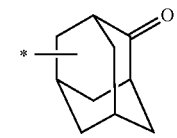
(Y15)
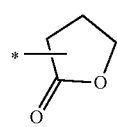
(Y16)
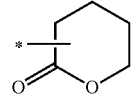
(Y17)
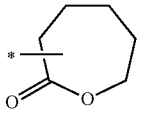
(Y18)
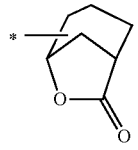
(Y19)
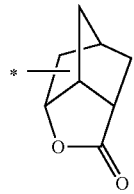
(Y20)
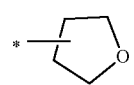
(Y21)
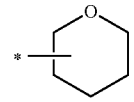
(Y22)
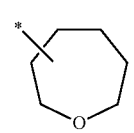
(Y23)
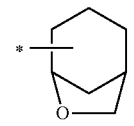
(Y24)

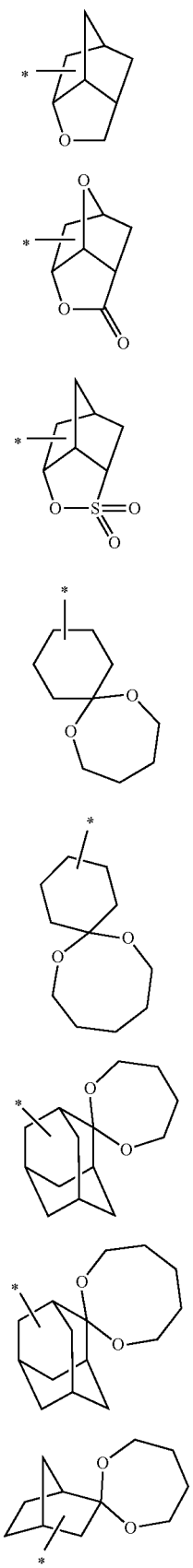
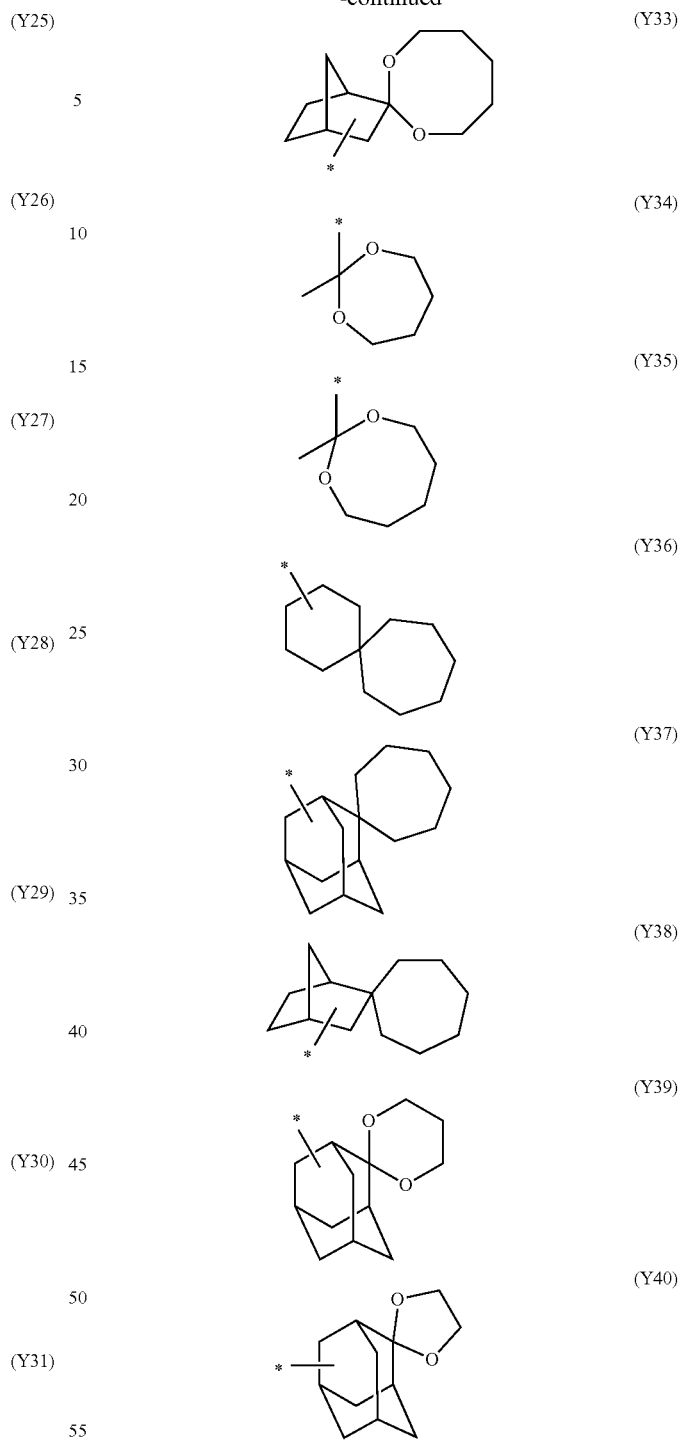

Namely, each of two hydrogen atoms included in the alicyclic hydrocarbon group as Y is substituted with an oxygen atom, and two oxygen atoms may form a ketal ring together with an alkanediyl group having 1 to 8 carbon atoms, and may include a structure in which each oxygen atom is bonded to different carbon atoms. When constituting a spiro ring having oxygen atoms such as formula (Y28) to formula (Y33), formula (Y39) to formula (Y40) and the like, an alkanediyl group between two oxygens preferably has one or more fluorine atoms. Of the alkanediyl group included in the ketal structure, methylene groups adjacent to an oxygen atom are preferably those which are not substituted with a fluorine atom.

Of these, a group represented by any one of formula (Y1) to formula (Y20), formula (Y30), formula (Y31) and formula (Y39) to formula (Y40) is preferable, a group represented by formula (Y11), formula (Y15), formula (Y16), formula (Y19), formula (Y20), formula (Y30) to formula (Y31) or formula (Y39) to formula (Y40) are more preferable, and a group represented by formula (Y11), formula (Y15), formula (Y30), formula (Y39) or formula (Y40) is still more preferable.

Examples of the substituent of the alicyclic hydrocarbon group represented by Y include a halogen atom, a hydroxy group, an alkyl group having 1 to 12 carbon atoms, a hydroxy group-containing alkyl group having 1 to 12 carbon atoms, an alicyclic hydrocarbon group having 3 to 16 carbon atoms, an alkoxy group having 1 to 12 carbon atoms, an aromatic hydrocarbon group having 6 to 18 carbon atoms, an aralkyl group having 7 to 21 carbon atoms, an acyl group having 2 to 4 carbon atoms, a glycidyloxy group or —(CH$_2$)$_{ja}$—O—CO—R$^{b1}$ group (in which R$^{b1}$ represents an alkyl group having 1 to 16 carbon atoms, an alicyclic hydrocarbon group having 3 to 16 carbon atoms or an aromatic hydrocarbon group having 6 to 18 carbon atoms, ja represents an integer of 0 to 4, and —CH$_2$— included in the alkyl group having 1 to 16 carbon atoms and the alicyclic hydrocarbon group having 3 to 16 carbon atoms may be replaced by —O—, —S(O)$_2$— or —CO—) and the like.

Examples of the hydroxy group-containing alkyl group having 1 to 12 carbon atoms include a hydroxymethyl group, a hydroxyethyl group and the like.

Examples of the alkoxy group include a methoxy group, an ethoxy group, a propoxy group, a butoxy group, a pentyloxy group, a hexyloxy group, a heptyloxy group, an octyloxy group, a decyloxy group and a dodecyloxy group.

Examples of the aromatic hydrocarbon group include aryl groups such as a phenyl group, a naphthyl group, an anthryl group, a biphenyl group and a phenanthryl group; alkyl-aryl groups such as a tolyl group, a xylyl group, a cumenyl group, a mesityl group, a 2,6-diethylphenyl group, a p-tert-butylphenyl group and a 2-methyl-6-ethylphenyl group; and cycloalkyl-aryl groups such as a p-adamantylphenyl group.

Examples of the aralkyl group include a benzyl group, a phenethyl group, a phenylpropyl group, a naphthylmethyl group and a naphthylethyl group.

Examples of the acyl group include an acetyl group, a propionyl group and a butyryl group.

Examples of the halogen atom include a fluorine atom, a chlorine atom, a bromine atom and an iodine atom.

Examples of Y include the followings.

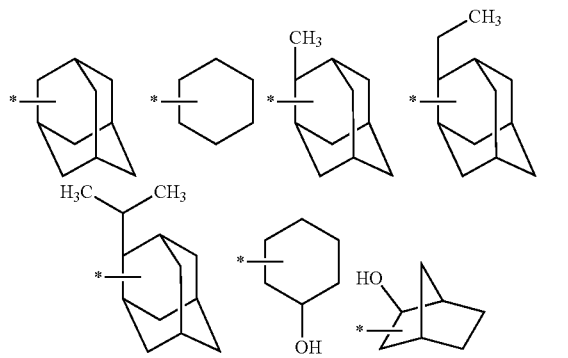

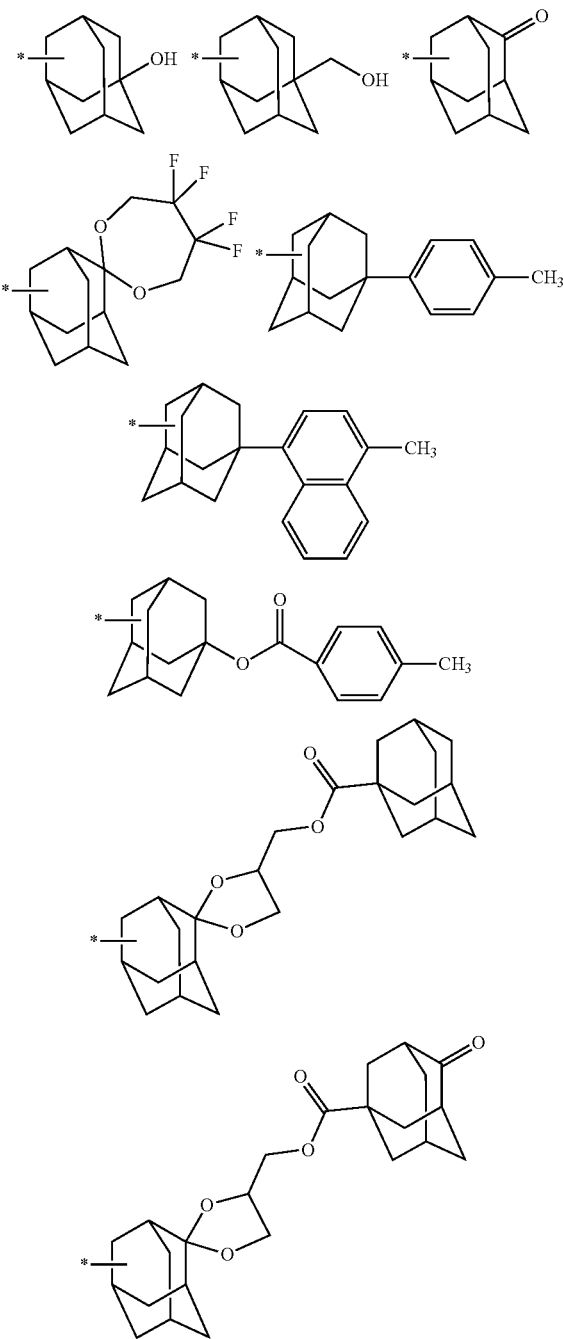

-continued

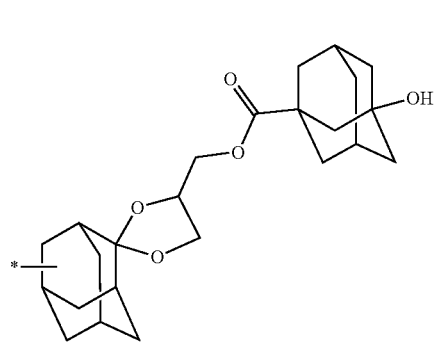

125
-continued
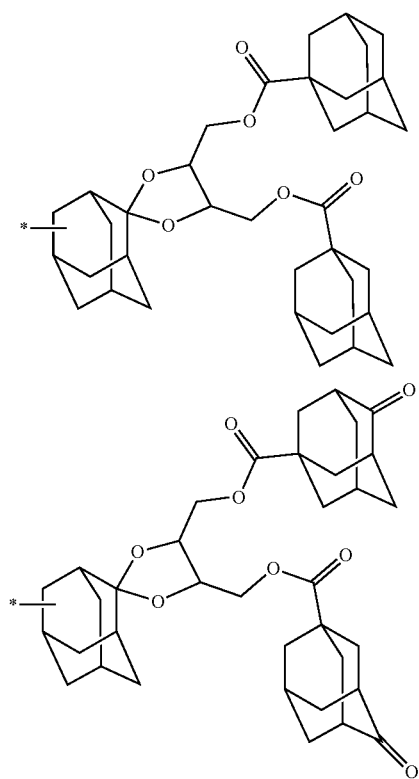
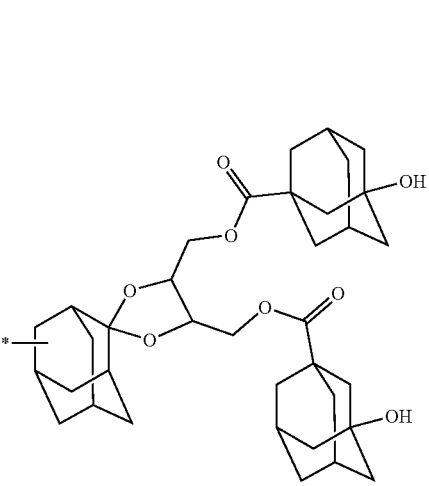
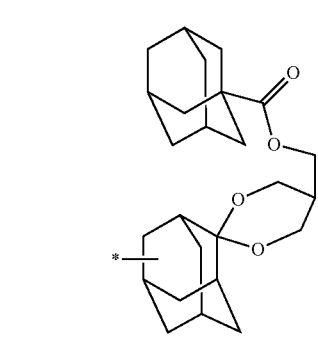
126
-continued
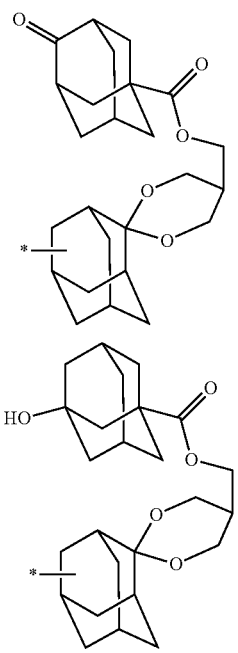
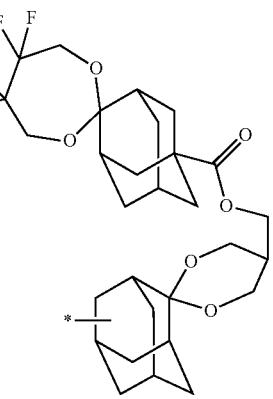
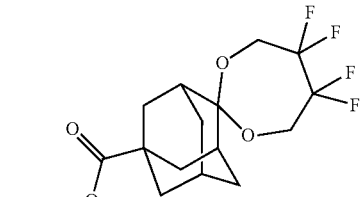
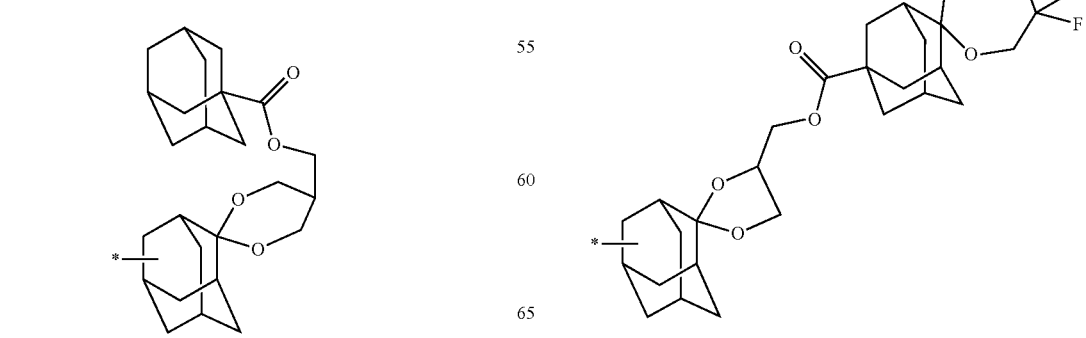

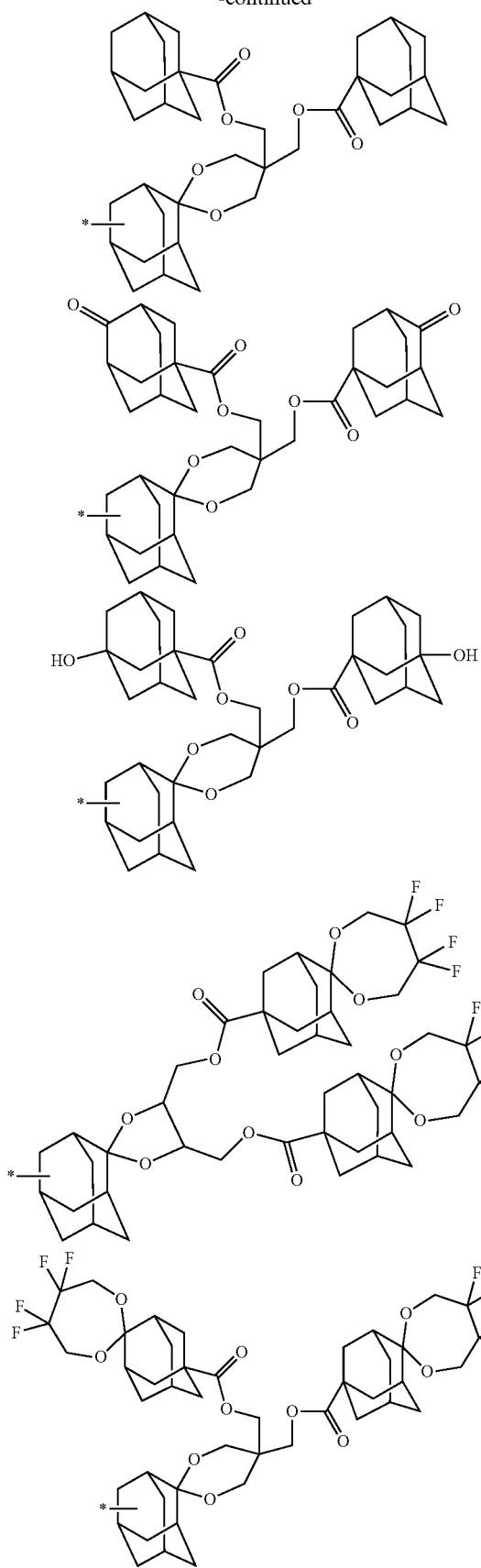

Y is preferably an alicyclic hydrocarbon group having 3 to 18 carbon atoms which may have a substituent, more preferably an adamantyl group which may have a substituent, and a methylene group constituting these groups may be substituted with an oxygen atom, a sulfonyl group or a carbonyl group. Y is still more preferably an adamantyl group, a hydroxyadamantyl group or an oxoadamantyl group, or groups represented by the following formulas.

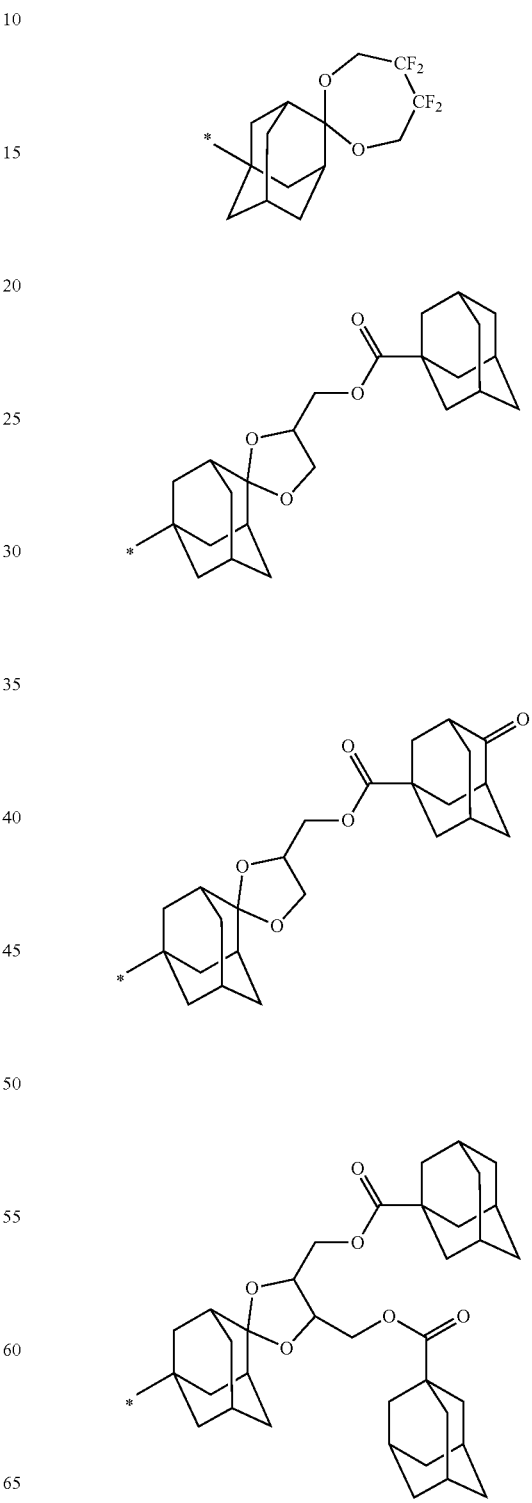

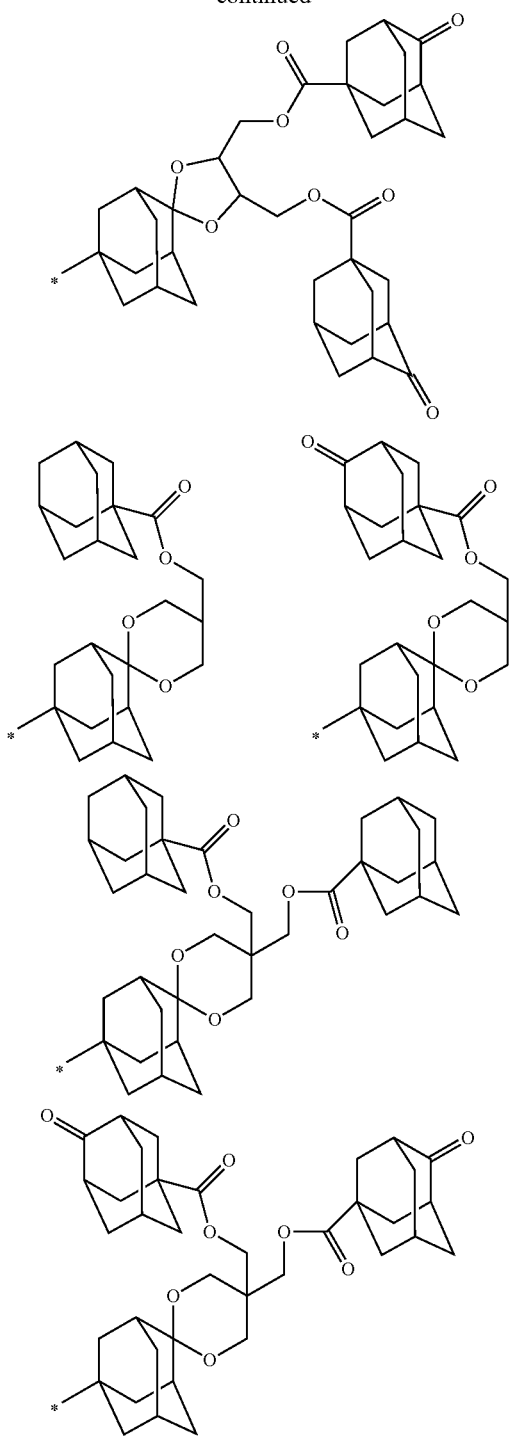

The sulfonic acid anion in the salt represented by formula (B1) is preferably anions represented by formula (B1-A-1) to formula (B1-A-55) [hereinafter sometimes referred to as "anion (B1-A-1)" according to the number of formula], and more preferably an anion represented by any one of formula (B1-A-1) to formula (B1-A-4), formula (B1-A-9), formula (B1-A-10), formula (B1-A-24) to formula (B1-A-33), formula (B1-A-36) to formula (B1-A-40) and formula (B1-A-47) to formula (B1-A-55).

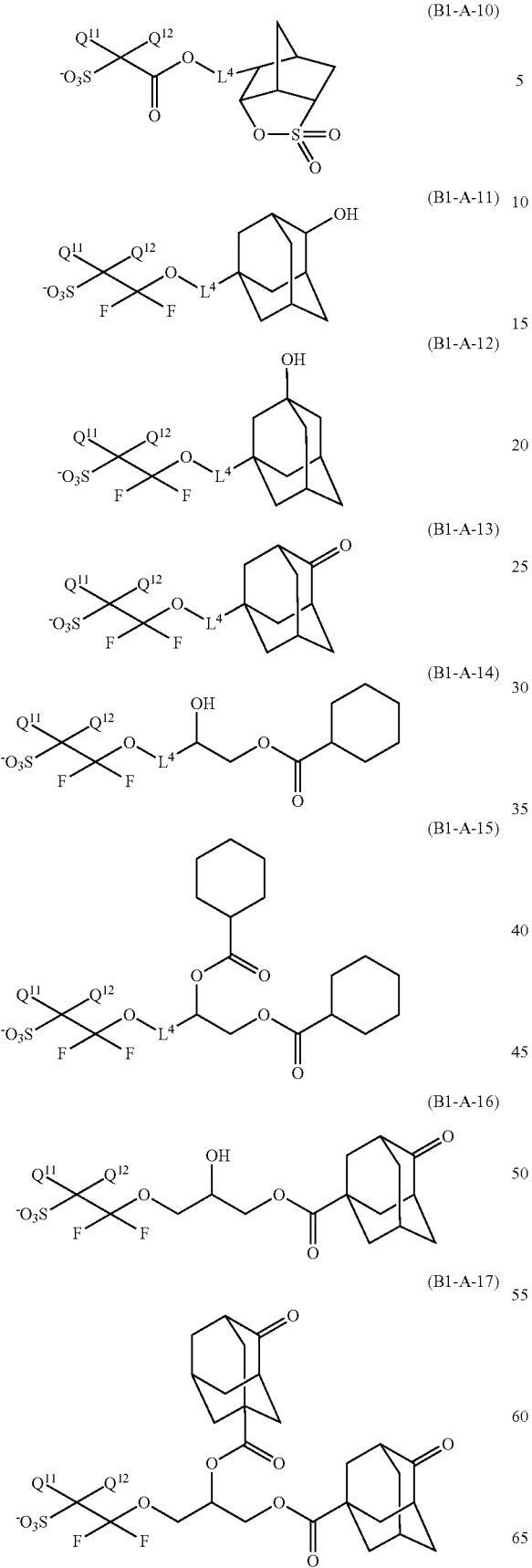
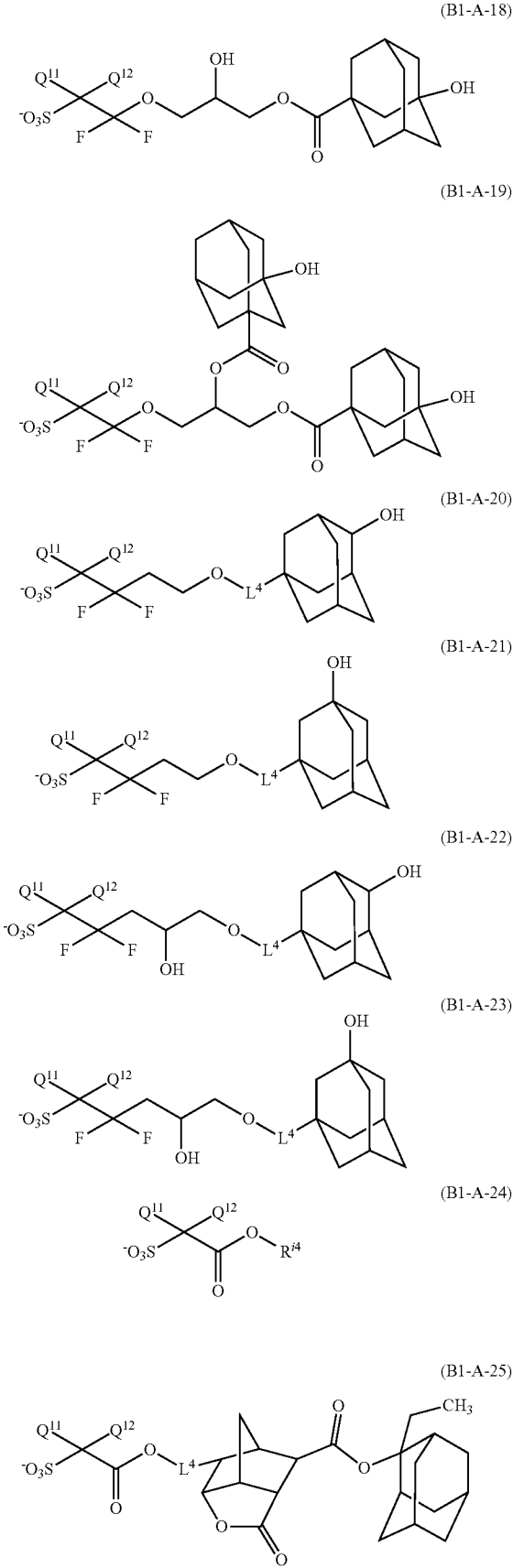

-continued
(B1-A-26)
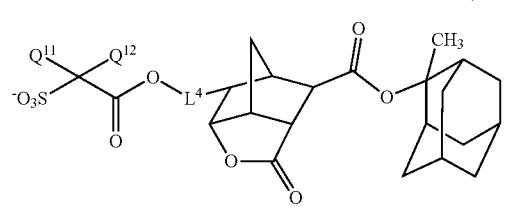
(B1-A-27)
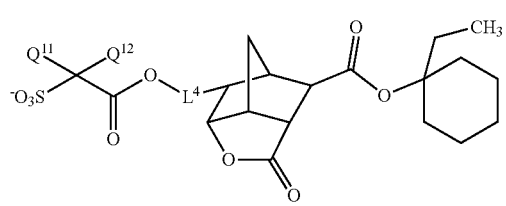
(B1-A-28)
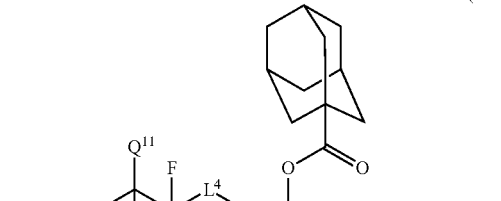
(B1-A-29)
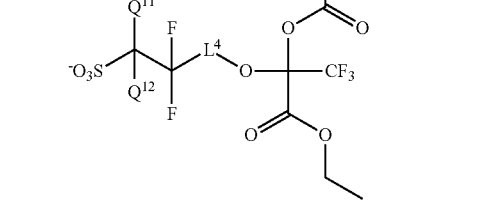
(B1-A-30)
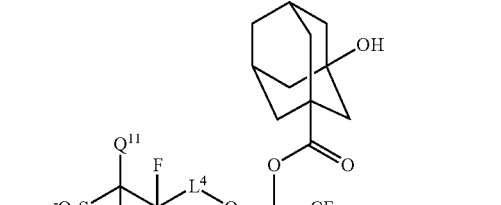
(B1-A-31)
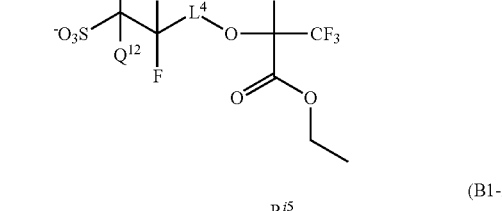
-continued
(B1-A-32)
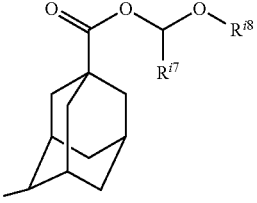
(B1-A-33)
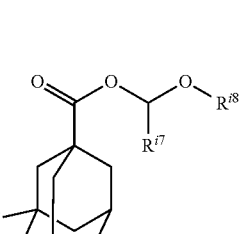
(B1-A-34)
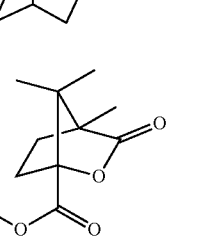
(B1-A-35)
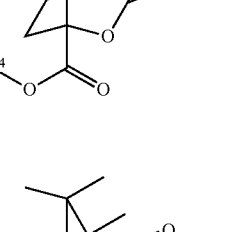
(B1-A-36)
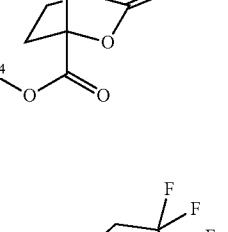
(B1-A-37)
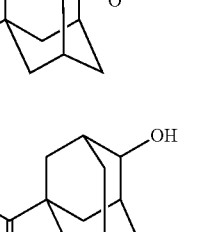
(B1-A-38)
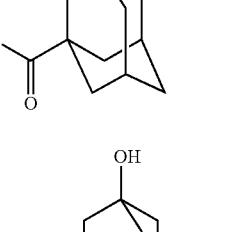

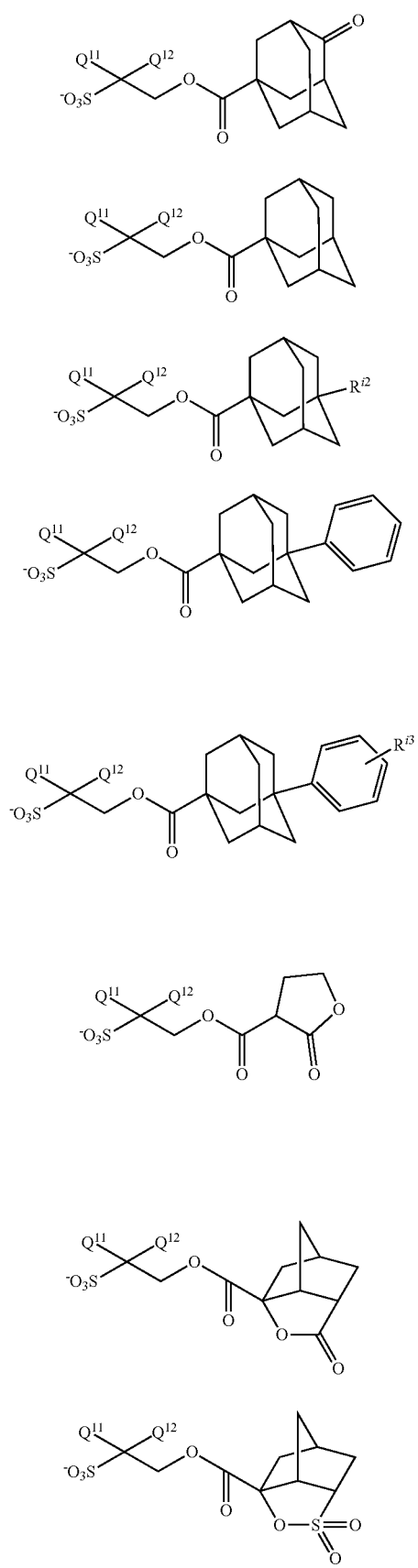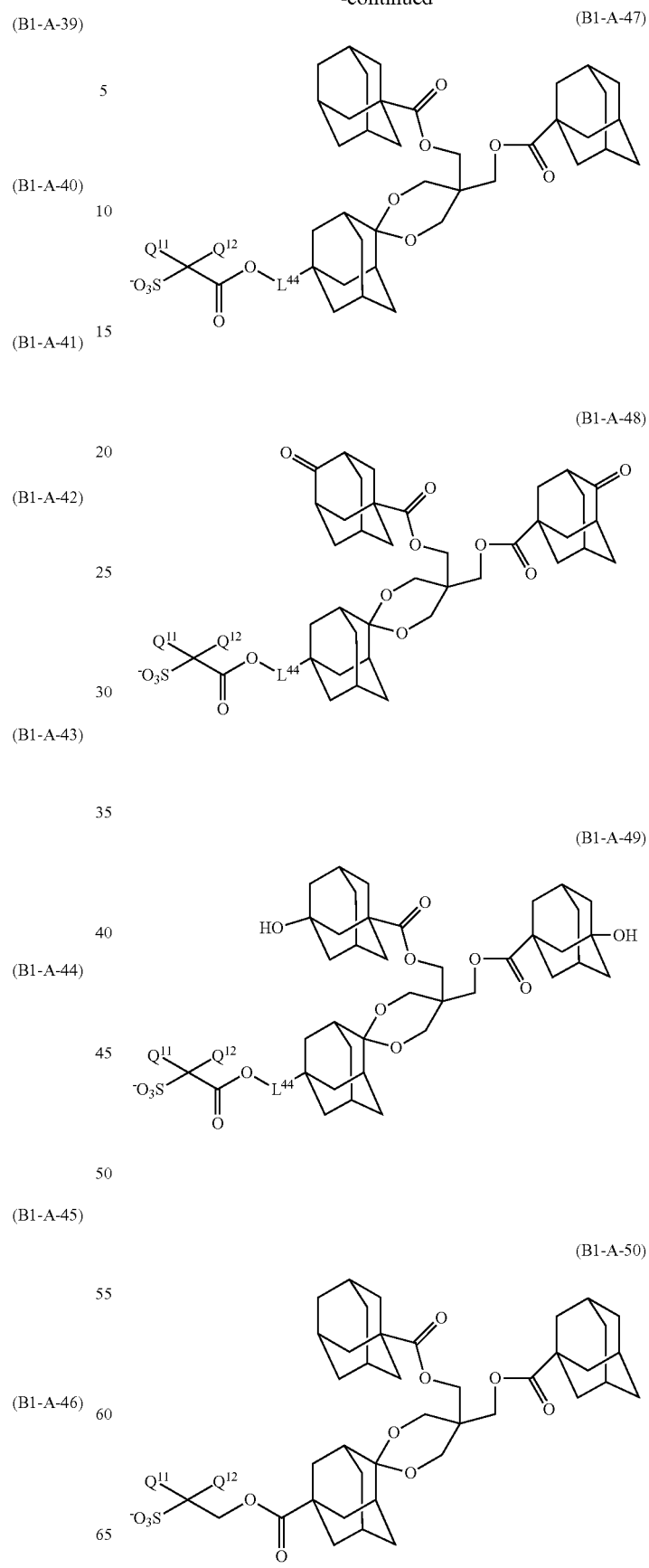

-continued

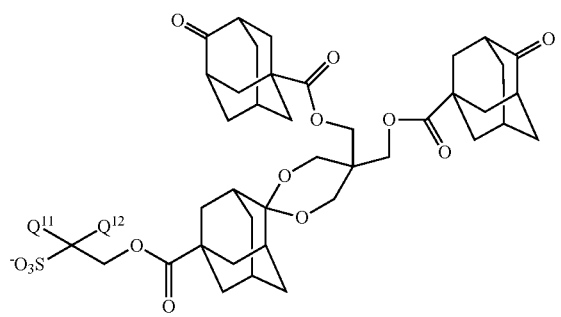
(B1-A-51)

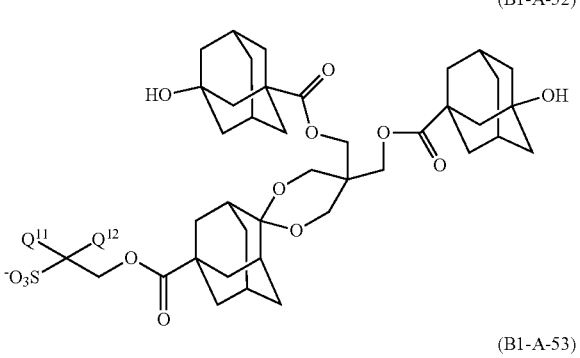
(B1-A-52)

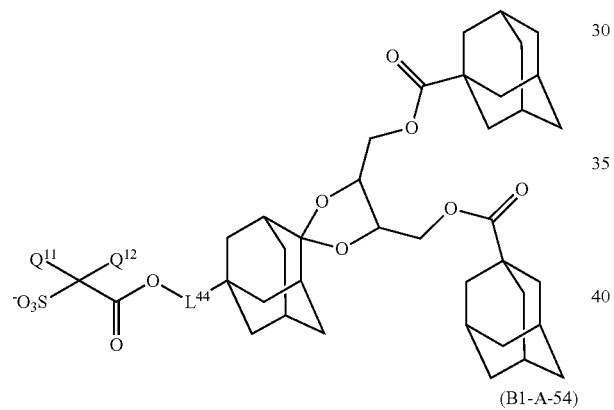
(B1-A-53)

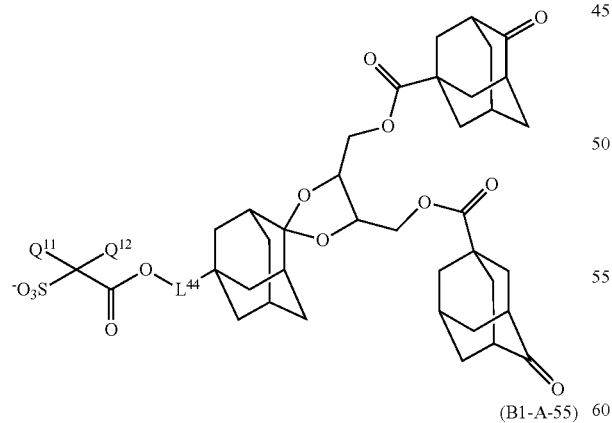
(B1-A-54)

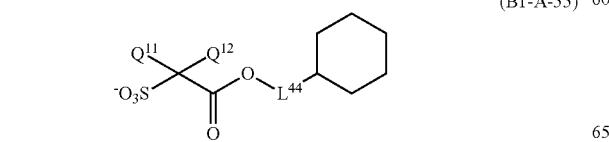
(B1-A-55)

$R^{i2}$ to $R^{i7}$ represent, for example, an alkyl group having 1 to 4 carbon atoms, and preferably a methyl group or an ethyl group.

$R^{i8}$ is, for example, an aliphatic hydrocarbon group having 1 to 12 carbon atoms, preferably an alkyl group having 1 to 4 carbon atoms, an alicyclic hydrocarbon group having 5 to 12 carbon atoms or groups formed by combining these groups, and more preferably a methyl group, an ethyl group, a cyclohexyl group or an adamantyl group.

$L^{44}$ is a single bond or an alkanediyl group having 1 to 4 carbon atoms.

$Q^1$ and $Q^2$ are the same as defined above.

Specific examples of the sulfonic acid anion in the salt represented by formula (B1) include anions mentioned in JP 2010-204646 A.

Examples of preferable sulfonic acid anion in the salt represented by formula (B1) are preferably anions represented by formula (B1a-1) to formula (B1a-34).

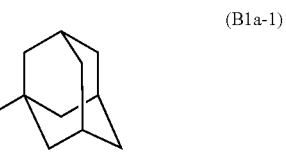
(B1a-1)

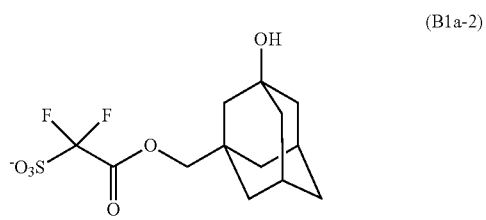
(B1a-2)

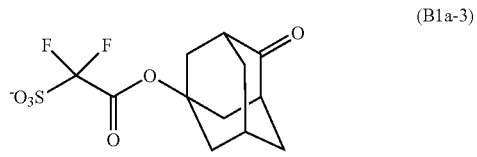
(B1a-3)

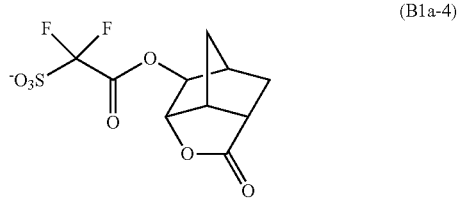
(B1a-4)

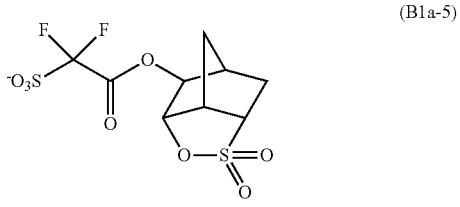
(B1a-5)

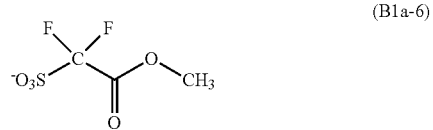
(B1a-6)

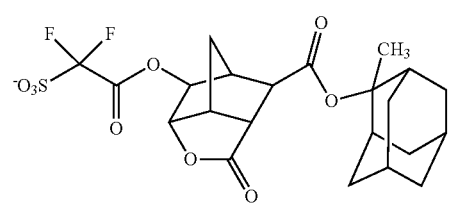
(B1a-7)
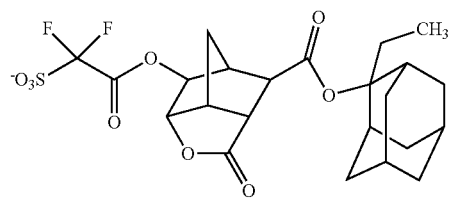
(B1a-8)
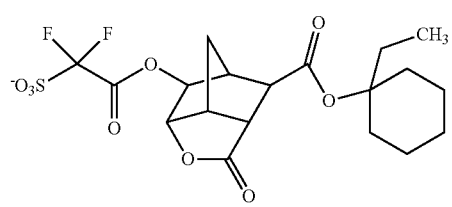
(B1a-9)
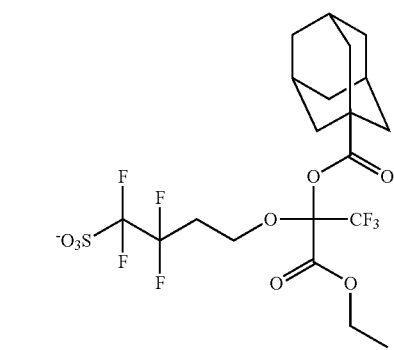
(B1a-10)
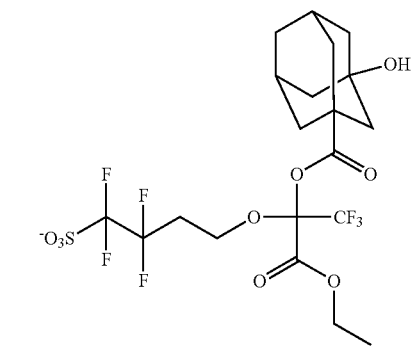
(B1a-11)
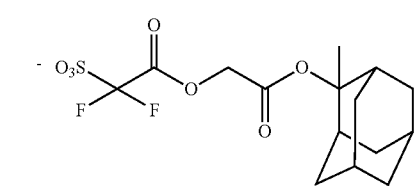
(B1a-12)
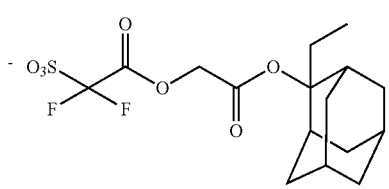
(B1a-13)
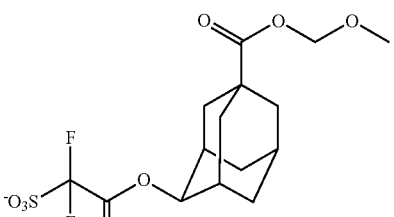
(B1a-14)
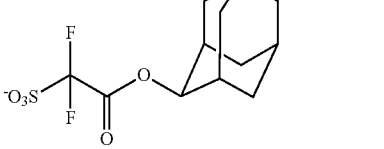
(B1a-15)
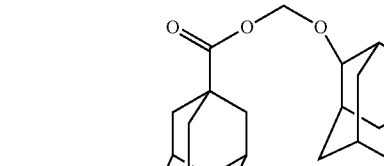
(B1a-16)
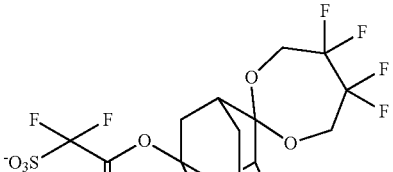
(B1a-17)
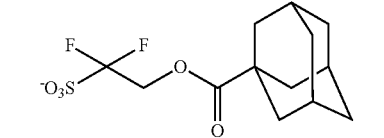
(B1a-18)
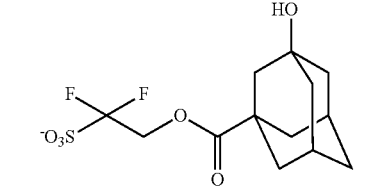
(B1a-19)

(B1a-20)
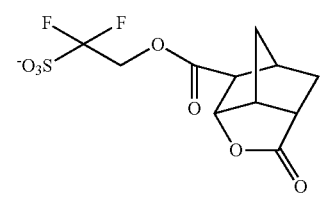
(B1a-21)
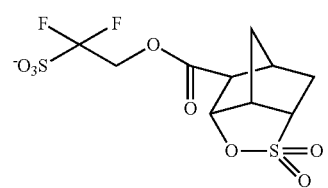
(B1a-22)
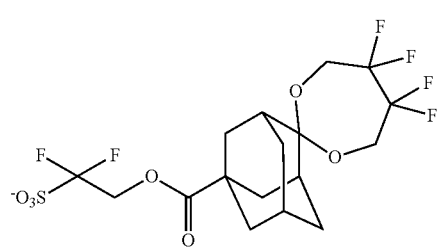
(B1a-23)
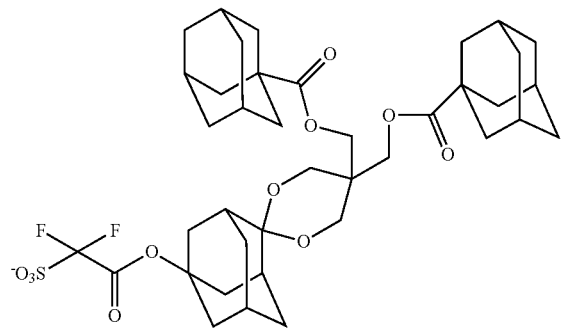
(B1a-24)
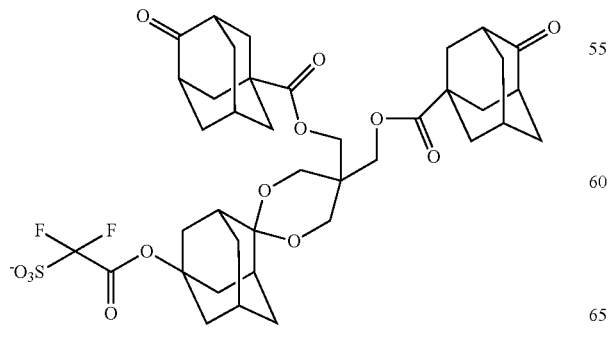
(B1a-25)
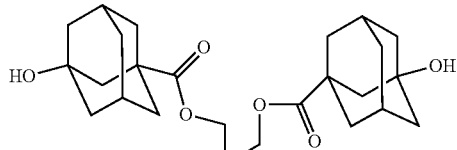
(B1a-26)
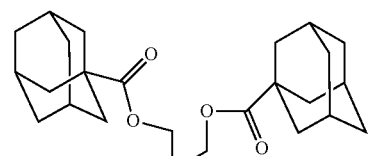
(B1a-27)
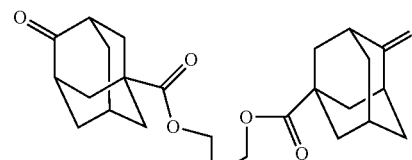
(B1a-28)
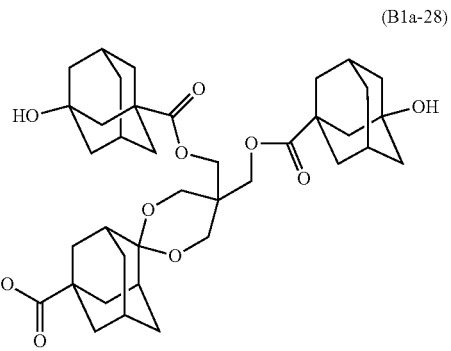

-continued

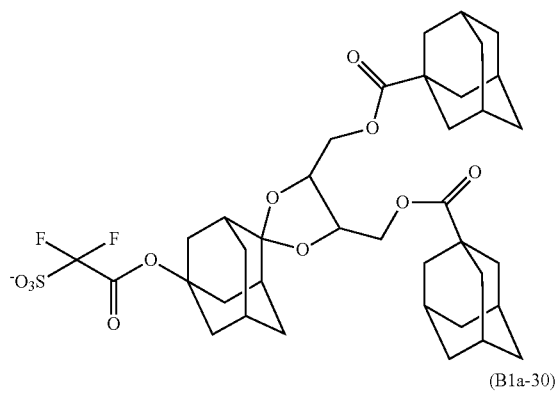
(B1a-29)

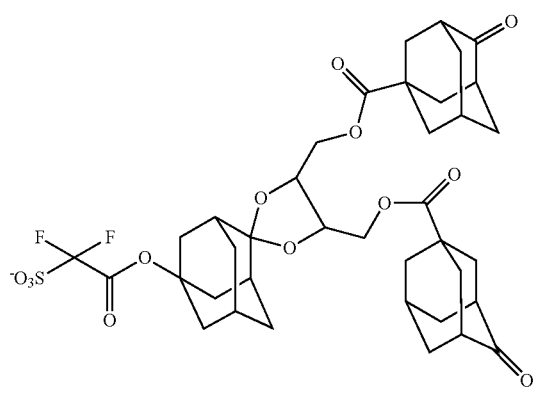
(B1a-30)

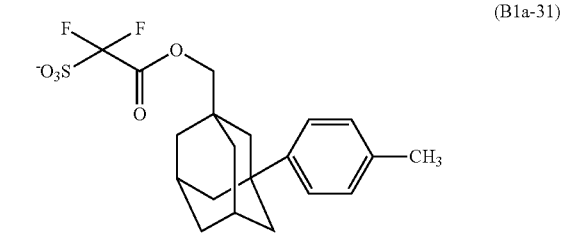
(B1a-31)

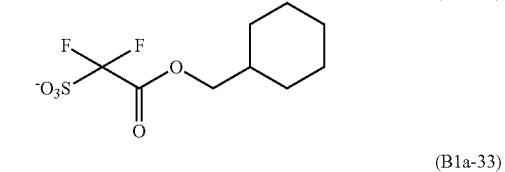
(B1a-32)

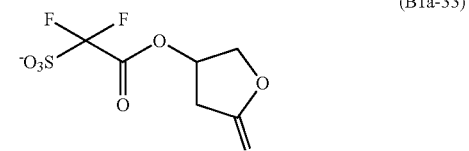
(B1a-33)

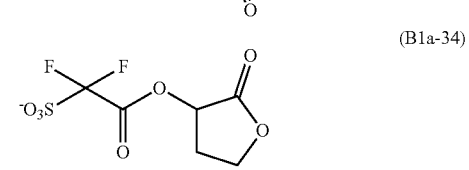
(B1a-34)

Of these anions, the anion is preferably an anion represented by any one of formula (B1a-1) to formula (B1a-3) and formula (B1a-7) to formula (B1a-16), formula (B1a-18), formula (B1a-19) and formula (B1a-22) to formula (B1a-34).

The organic cation of $Z^+$ includes organic onium cations, for example, an organic sulfonium cation, an organic iodonium cation, an organic ammonium cation, a benzothiazolium cation, an organic phosphonium cation and the like, and is preferably an organic sulfonium cation or an organic iodonium cation, and more preferably an arylsulfonium cation.

Specific examples thereof include those which are the same as the organic cation in the structural unit (II).

The acid generator (B1) is a combination of the above-mentioned sulfonic acid anions and the above-mentioned organic cations, and these can be optionally combined. Examples of the acid generator (B1) are preferably combinations of anions represented by any one of formula (B1a-1) to formula (B1a-3) and formula (B1a-7) to formula (B1a-16) and a cation (b2-1).

Examples of the acid generator (B1) include those represented by formula (B1-1) to formula (B1-48). Of these, those represented by formula (B1-1) to formula (B1-3), formula (B1-5) to formula (B1-7), formula (B1-11) to formula (B1-14), formula (B1-17), formula (B1-20) to formula (B1-26), formula (B1-29) and formula (B1-31) to formula (B1-48) are preferable.

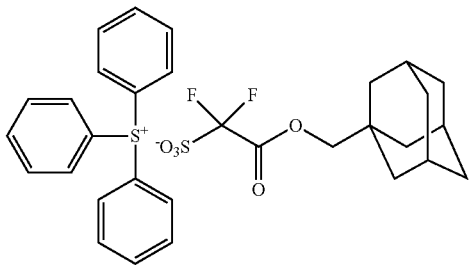
(B1-1)

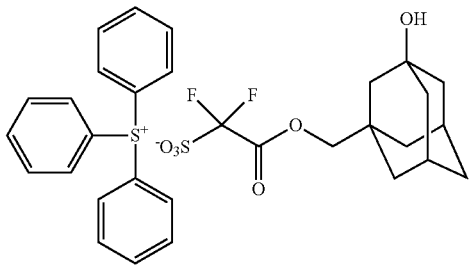
(B1-2)

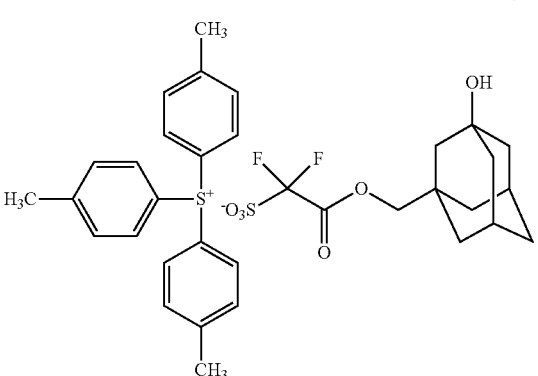
(B1-3)

(B1-4)
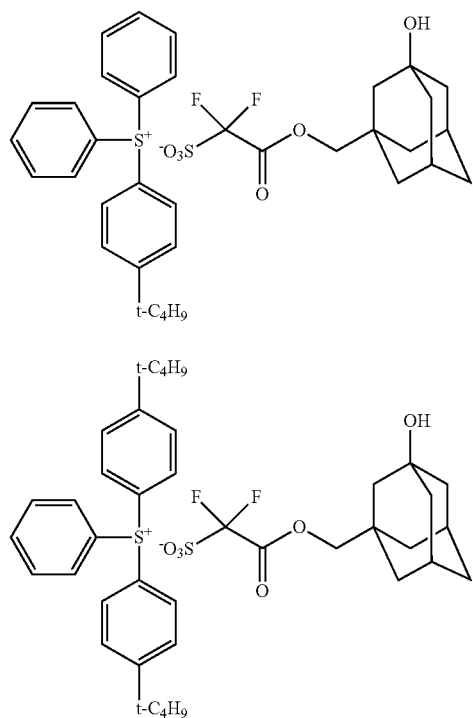
(B1-5)
(B1-6)
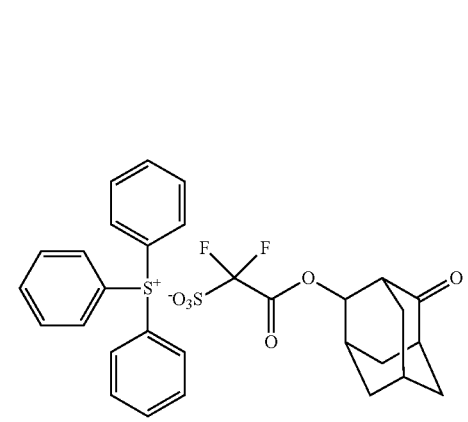
(B1-7)
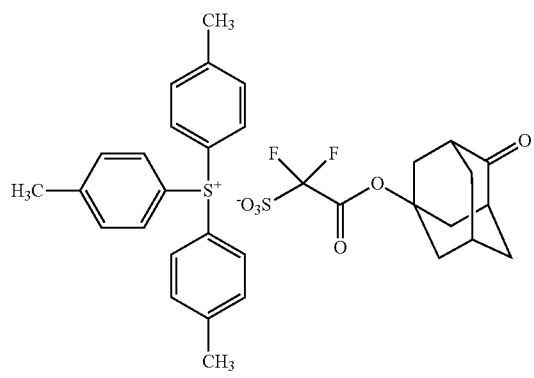
(B1-8)
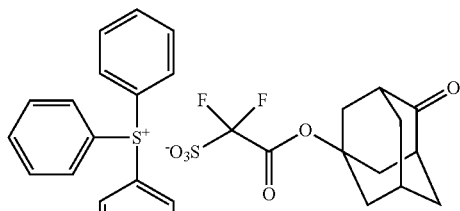
(B1-9)
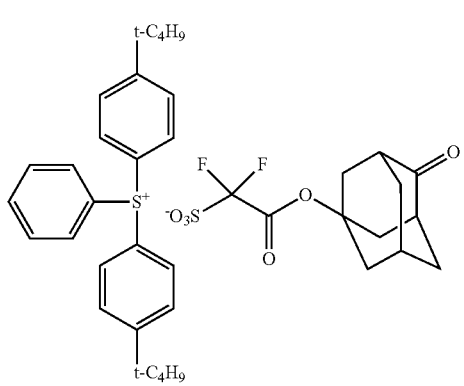
(B1-10)
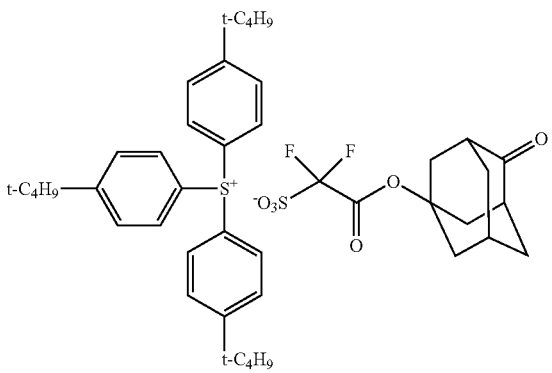
(B1-11)
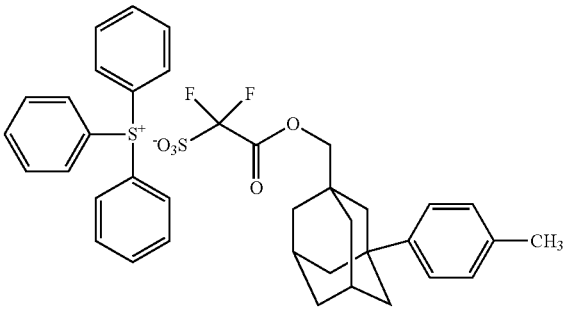

(B1-12)
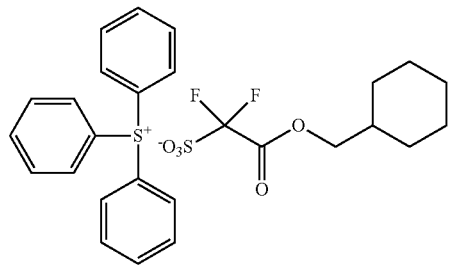
(B1-13)
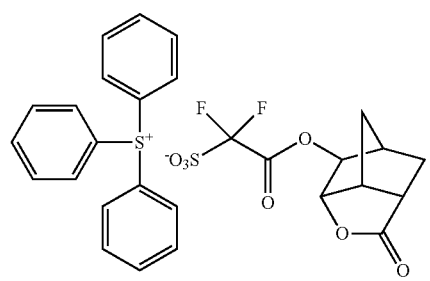
(B1-14)
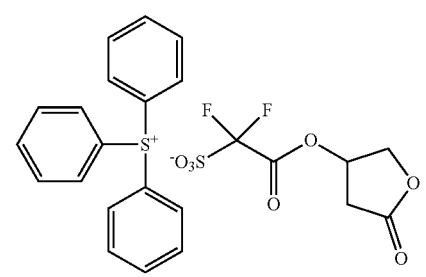
(B1-15)
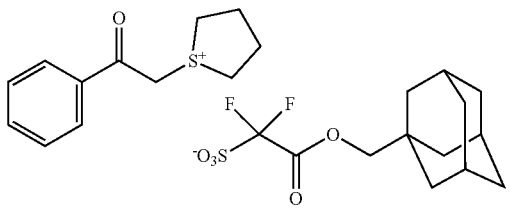
(B1-16)
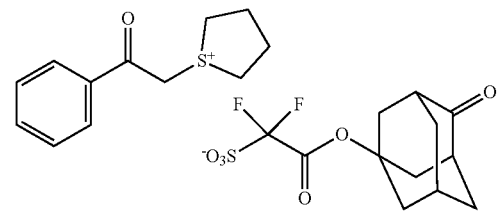
(B1-17)
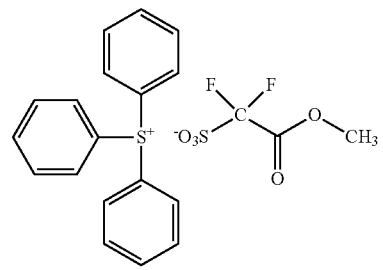
(B1-18)
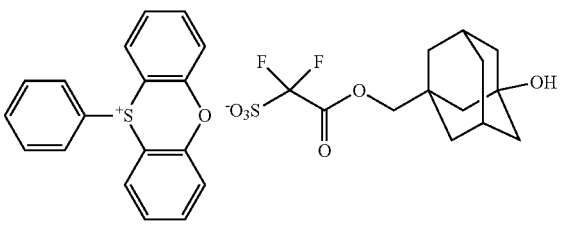
(B1-19)
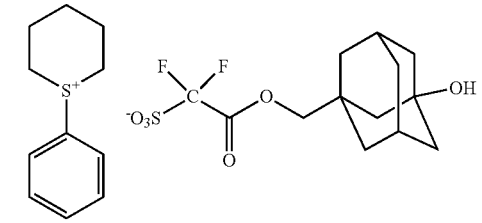
(B1-20)
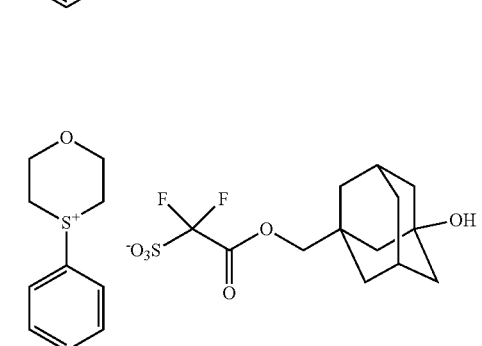
(B1-21)
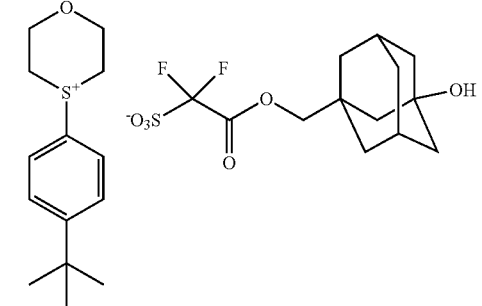
(B1-22)
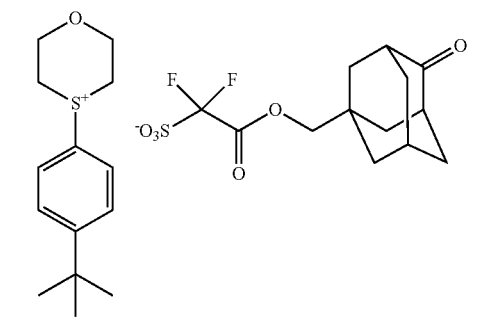

(B1-23)
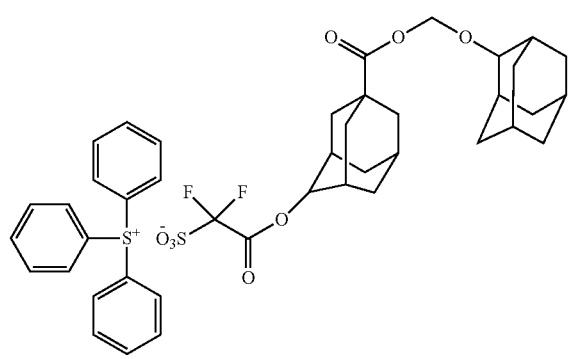
(B1-24)
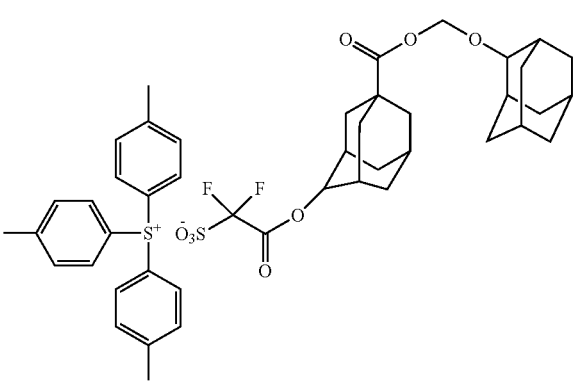
(B1-25)
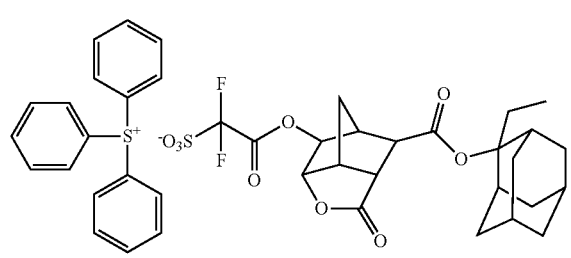
(B1-26)
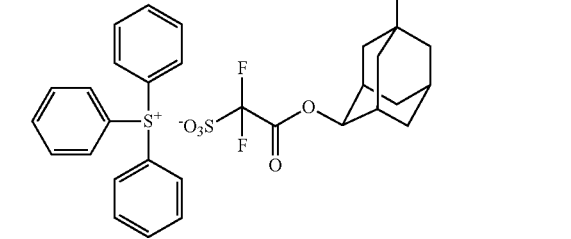
(B1-27)
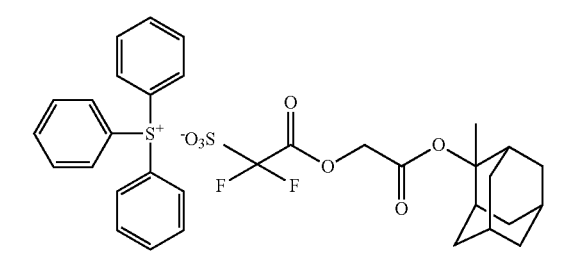
(B1-28)
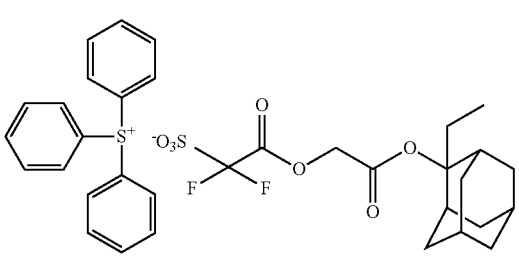
(B1-29)
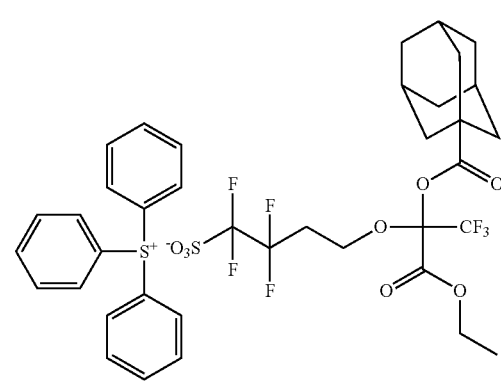
(B1-30)
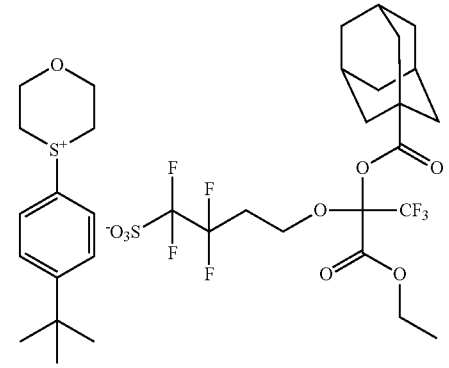
(B1-31)
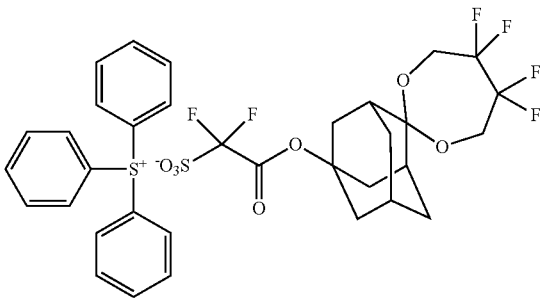

(B1-32)
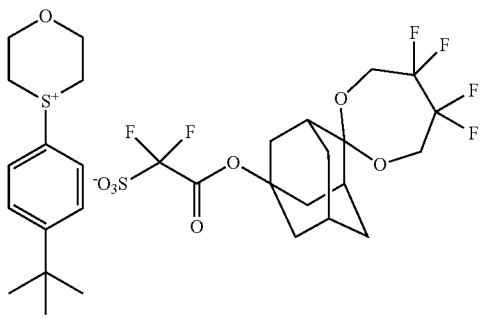

(B1-37)
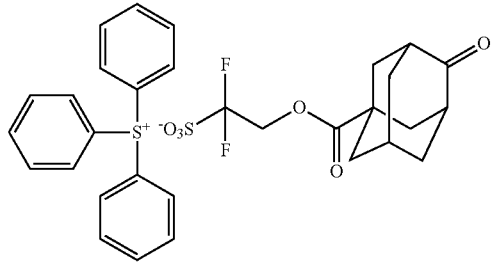

(B1-33)
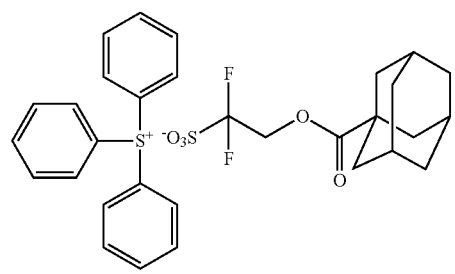

(B1-38)
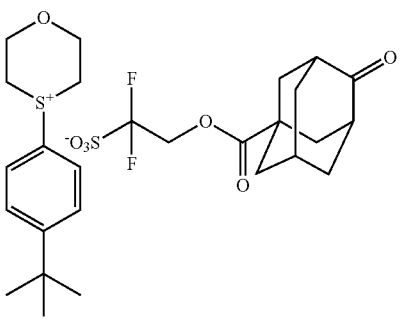

(B1-34)
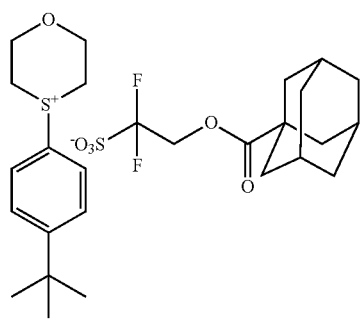

(B1-39)
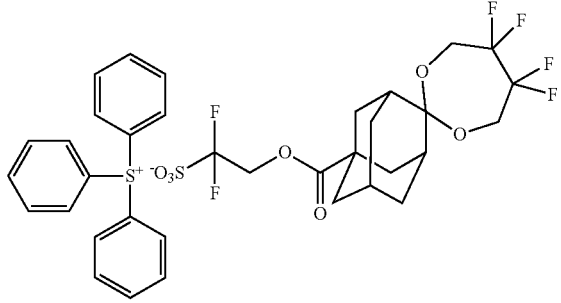

(B1-35)
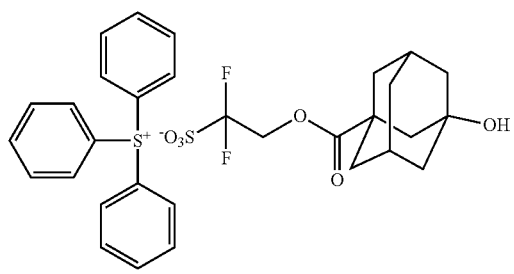

(B1-40)
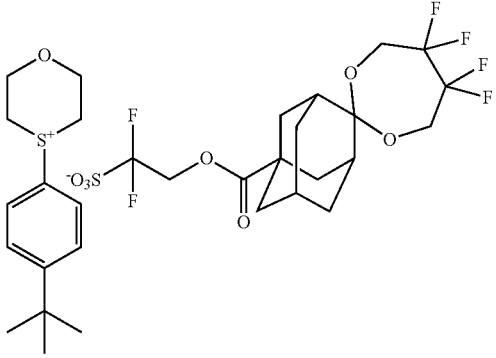

(B1-36)
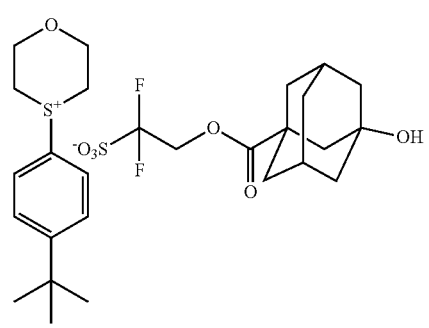

The acid generator (B) may include an acid generator other than the acid generator (B1).

In the resist composition of the present invention, the acid generator (B1) may be included alone, or a plurality of acid generators may also be included. The content of the acid generator (B1) is preferably 50% by mass or more, more preferably 70% by mass or more, and still more preferably 90% by mass or more, based on the total amount of the acid generator (B). It is particularly preferable that only the acid generator (B1) is included.

The content of the acid generator (B) is preferably 1 part by mass or more (more preferably 3 parts by mass or more), and more preferably 40 parts by mass or less (more preferably 35 parts by mass or less), based on 100 parts by mass of the resin (A).

<Solvent (E)>

The content of the solvent (E) in the resist composition is usually 90% by mass or more, preferably 92% by mass or more, more preferably 94% by mass or more, 99.9% by mass or less, and preferably 99% by mass or less. The content of the solvent (E) can be measured, for example, by a known analysis means such as liquid chromatography or gas chromatography.

Examples of the solvent (E) include glycol ether esters such as ethylcellosolve acetate, methylcellosolve acetate and propylene glycol monomethyl ether acetate; glycol ethers such as propylene glycol monomethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. The solvent (E) may be included alone, or two or more solvents may be included.

<Quencher (C)>

The resist composition of the present invention may include a quencher (hereinafter sometimes referred to as "quencher (C)"). Examples of the quencher (C) include a basic nitrogen-containing organic compound or a salt generating an acid having an acidity lower than that of an acid generated from an acid generator (B).

<Basic Nitrogen-Containing Organic Compound>

Examples of the basic nitrogen-containing organic compound include amine and an ammonium salt. Examples of the amine include an aliphatic amine and an aromatic amine. Examples of the aliphatic amine include a primary amine, a secondary amine and a tertiary amine.

Specific examples thereof include 1-naphthylamine, 2-naphthylamine, aniline, diisopropylaniline, 2-, 3- or 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, 2,2'-methylenebisaniline, imidazole, 4-methylimidazole, pyridine, 4-methylpyridine, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine, 2,2'-dipicolylamine, bipyridine and the like, preferably diisopropylaniline, and particularly preferably 2,6-diisopropylaniline.

Examples of the ammonium salt include tetramethylammonium hydroxide, tetraisopropylammonium hydroxide, tetrabutylammonium hydroxide, tetrahexylammonium hydroxide, tetraoctylammonium hydroxide, phenyltrimethylammonium hydroxide, 3-(trifluoromethyl)phenyltrimethylammonium hydroxide, tetra-n-butylammonium salicylate and choline.

<Salt Generating Acid Having Low Acidity>

The acidity in a salt generating an acid having an acidity lower than that of an acid generated from the acid generator is indicated by the acid dissociation constant (pKa). Regarding the salt generating an acid having an acidity lower than that of an acid generated from the acid generator, pKa of an acid generated from the salt usually meets the following inequality: $-3 < pKa$, preferably $-1 < pKa < 7$, and more preferably $0 < pKa < 5$. Examples of the salt generating an acid weaker than an acid generated from the acid generator include salts represented by the following formulas, a weak acid inner salt mentioned in JP 2015-147926 A, and salts mentioned in JP 2012-229206 A, JP 2012-6908 A, JP 2012-72109 A, JP 2011-39502 A.

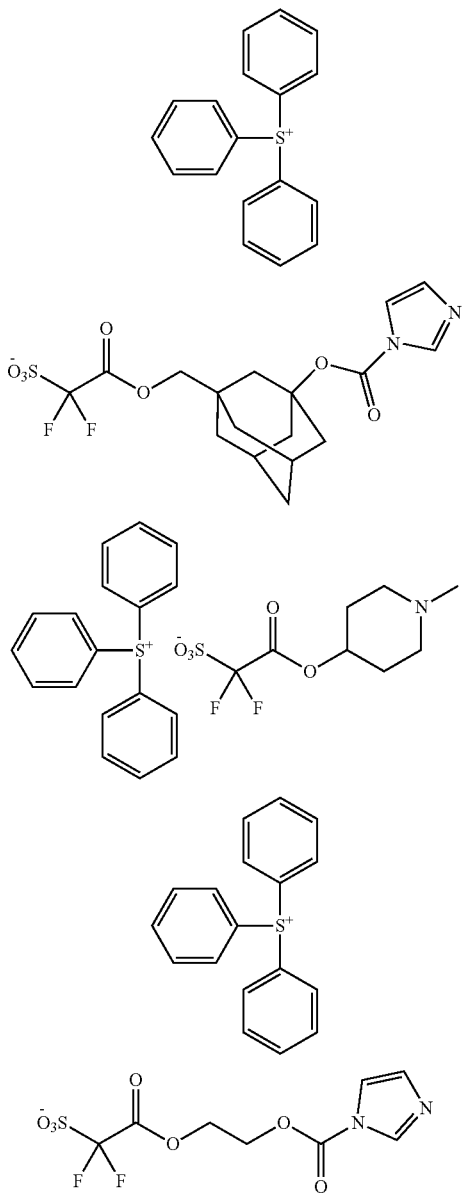

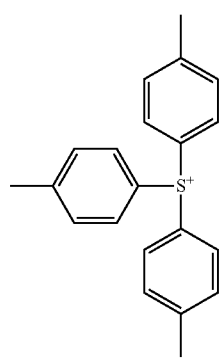
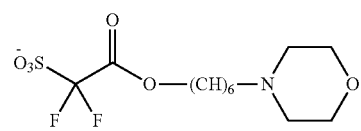
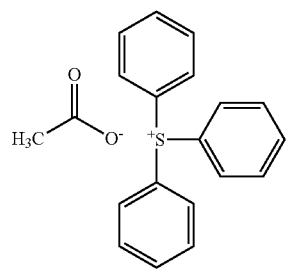
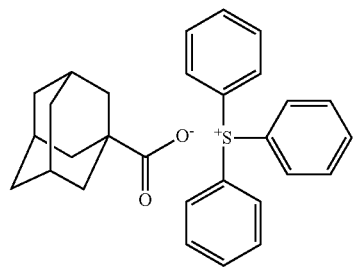
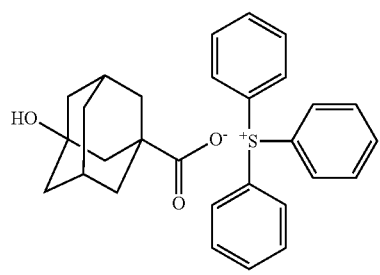
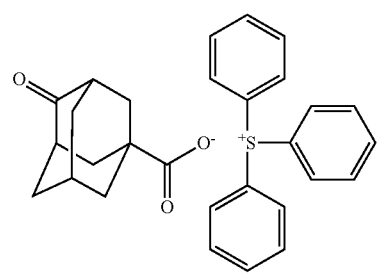
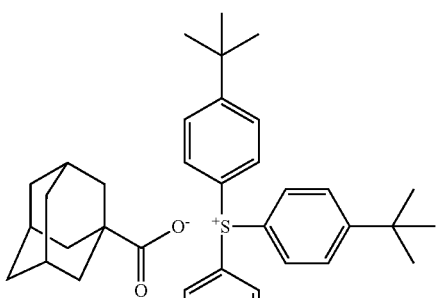
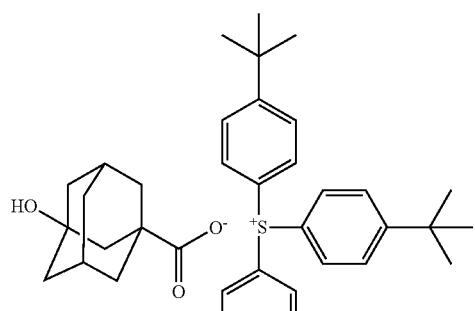
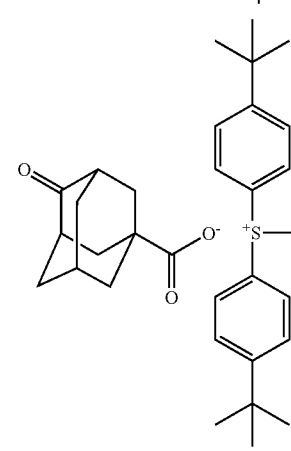
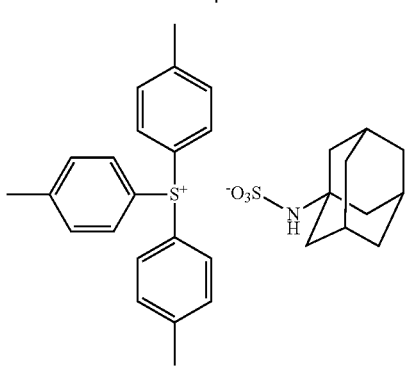

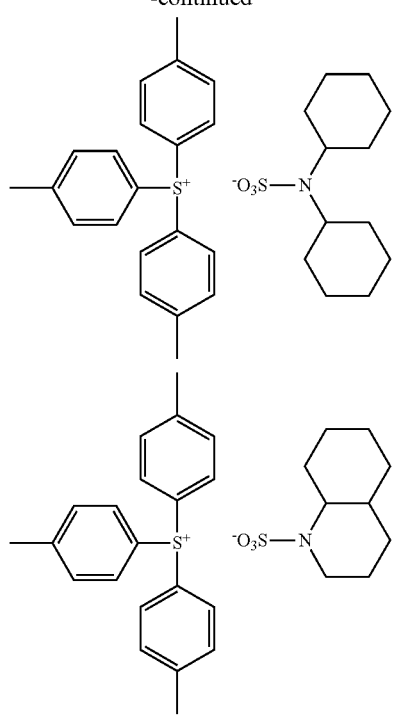
Examples of the salt generating an acid having an acidity lower than that of an acid generated from the acid generator include the following salts.
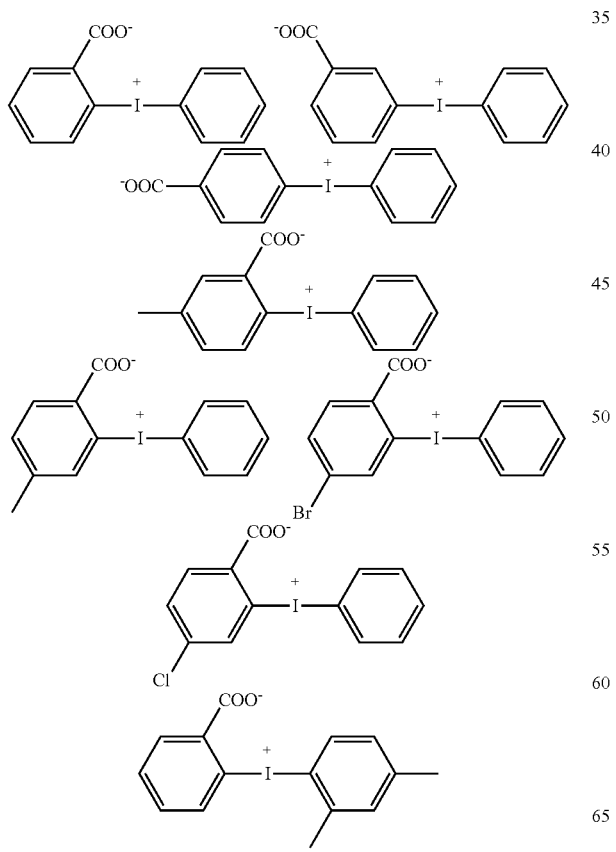
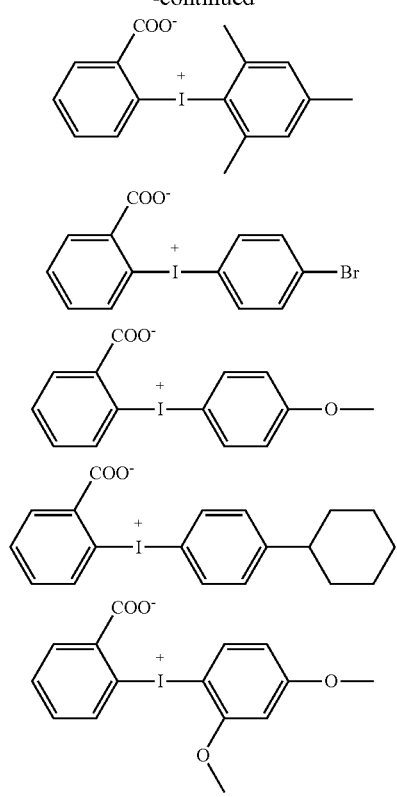
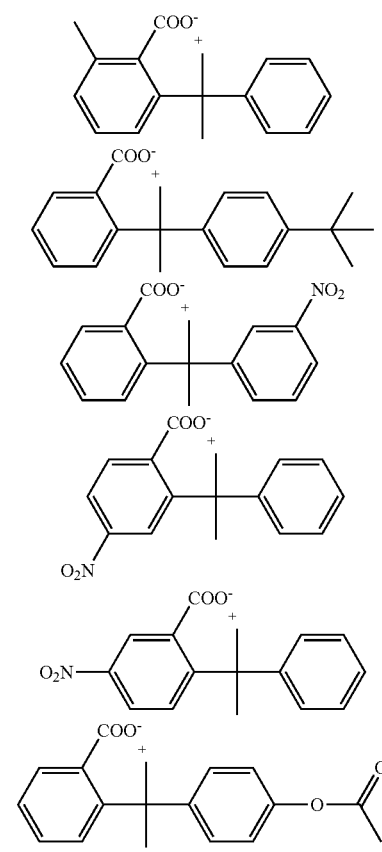

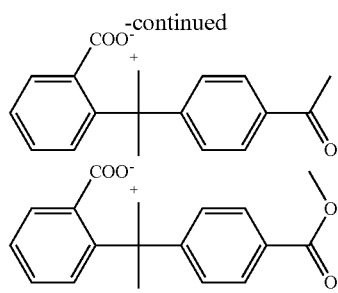
-continued

The content of the quencher (C) in the solid component of the resist composition is usually 0.01 to 5% by mass, more preferably 0.01 to 4% by mass, and particularly preferably 0.01 to 3% by mass.

<Other Components>

The resist composition of the present invention may also include components other than the components mentioned above (hereinafter sometimes referred to as "other components (F)"). The other components (F) are not particularly limited and it is possible to use various additives known in the resist field, for example, sensitizers, dissolution inhibitors, surfactants, stabilizers and dyes.

<Preparation of Resist Composition>

The resist composition of the present invention can be prepared by mixing a resin (A) and an acid generator (B), as well as a resin (X), a quencher (C), a solvent (E) and other components (F) which are optionally used. The order of mixing these components is any order and is not particularly limited. It is possible to select, as the temperature during mixing, appropriate temperature according to the type of the resin, the solubility in the solvent (E) of the resin and the like. Usually, the temperature is 10 to 40° C. It is possible to select, as the mixing time, appropriate time according to the mixing temperature. Usually, the mixing time is 0.5 to 24 hours. The mixing means is not particularly limited and it is possible to use mixing with stirring.

After mixing the respective components, the mixture is preferably filtered through a filter having a pore diameter of about 0.003 to 0.2 µm.

<Method for Producing Resist Pattern>

The method for producing a resist pattern of the present invention comprises:
(1) a step of applying the resist composition of the present invention on a substrate,
(2) a step of drying the applied composition to form a composition layer,
(3) a step of exposing the composition layer,
(4) a step of heating the exposed composition layer, and
(5) a step of developing the heated composition layer.

The resist composition can be usually applied on a substrate using a conventionally used apparatus, such as a spin coater. Examples of the substrate include inorganic substrates such as a silicon wafer. Before applying the resist composition, the substrate may be washed, and an antireflection film may be formed on the substrate.

The solvent is removed by drying the applied composition to form a composition layer. Drying is performed by evaporating the solvent using a heating device such as a hot plate (so-called "prebake"), or a decompression device. The heating temperature is preferably 50 to 200° C. and the heating time is preferably 10 to 180 seconds. The pressure during drying under reduced pressure is preferably about 1 to $1.0 \times 10^5$ Pa.

The composition layer thus obtained is usually exposed using an aligner. The aligner may be a liquid immersion aligner. It is possible to use, as an exposure source, various exposure sources, for example, exposure sources capable of emitting laser beam in an ultraviolet region such as KrF excimer laser (wavelength of 248 nm), ArF excimer laser (wavelength of 193 nm) and $F_2$ excimer laser (wavelength of 157 nm), an exposure source capable of emitting harmonic laser beam in a far-ultraviolet or vacuum ultra violet region by wavelength-converting laser beam from a solid-state laser source (YAG or semiconductor laser), an exposure source capable of emitting electron beam or EUV and the like. In the present description, such exposure to radiation is sometimes collectively referred to as exposure. The exposure is usually performed through a mask corresponding to a pattern to be required. When electron beam is used as the exposure source, exposure may be performed by direct writing without using the mask.

The exposed composition layer is subjected to a heat treatment (so-called "post-exposure bake") to promote the deprotection reaction in an acid-labile group. The heating temperature is usually about 50 to 200° C., and preferably about 70 to 150° C.

The heated composition layer is usually developed with a developing solution using a development apparatus. Examples of the developing method include a dipping method, a paddle method, a spraying method, a dynamic dispensing method and the like. The developing temperature is preferably 5 to 60° C. and the developing time is preferably 5 to 300 seconds. It is possible to produce a positive resist pattern or negative resist pattern by selecting the type of the developing solution as follows.

When the positive resist pattern is produced from the resist composition of the present invention, an alkaline developing solution is used as the developing solution. The alkaline developing solution may be various aqueous alkaline solutions used in this field. Examples thereof include aqueous solutions of tetramethylammonium hydroxide and (2-hydroxyethyl)trimethylammonium hydroxide (commonly known as choline). The surfactant may be contained in the alkaline developing solution.

It is preferable that the developed resist pattern is washed with ultrapure water and then water remaining on the substrate and the pattern is removed.

When the negative resist pattern is produced from the resist composition of the present invention, a developing solution containing an organic solvent (hereinafter sometimes referred to as "organic developing solution") is used as the developing solution.

Examples of the organic solvent contained in the organic developing solution include ketone solvents such as 2-hexanone and 2-heptanone; glycol ether ester solvents such as propylene glycol monomethyl ether acetate; ester solvents such as butyl acetate; glycol ether solvents such as propylene glycol monomethyl ether; amide solvents such as N,N-dimethylacetamide; and aromatic hydrocarbon solvents such as anisole.

The content of the organic solvent in the organic developing solution is preferably 90% by mass or more and 100% by mass or less, more preferably 95% by mass or more and 100% by mass or less, and still more preferably the organic developing solution is substantially composed of the organic solvent.

Particularly, the organic developing solution is preferably a developing solution containing butyl acetate and/or 2-heptanone. The total content of butyl acetate and 2-heptanone in the organic developing solution is preferably 50% by mass or more and 100% by mass or less, more preferably 90% by mass or more and 100% by mass or less, and still more preferably the organic developing solution is substantially composed of butyl acetate and/or 2-heptanone.

The surfactant may be contained in the organic developing solution. A trace amount of water may be contained in the organic developing solution.

During development, the development may be stopped by replacing by a solvent with the type different from that of the organic developing solution.

The developed resist pattern is preferably washed with a rinsing solution. The rinsing solution is not particularly limited as long as it does not dissolve the resist pattern, and it is possible to use a solution containing an ordinary organic solvent which is preferably an alcohol solvent or an ester solvent.

After washing, the rinsing solution remaining on the substrate and the pattern is preferably removed.

<Applications>

The resist composition of the present invention is suitable as a resist composition for exposure of KrF excimer laser, a resist composition for exposure of ArF excimer laser, a resist composition for exposure of electron beam (EB) or a resist composition for exposure of EUV, particularly a resist composition for exposure of electron beam (EB) or a resist composition for exposure of EUV, and the resist composition is useful for fine processing of semiconductors.

EXAMPLES

The present invention will be described more specifically by way of Examples. Percentages and parts expressing the contents or amounts used in the Examples are by mass unless otherwise specified.

The weight-average molecular weight is a value determined by gel permeation chromatography under the following conditions.

Equipment: HLC-8120 GPC type (manufactured by TOSOH CORPORATION)

Column: TSKgel Multipore $H_{XL}$-M×3+guardcolumn (manufactured by TOSOH CORPORATION)

Eluent: tetrahydrofuran

Flow rate: 1.0 mL/min

Detector: RI detector

Column temperature: 40° C.

Injection amount: 100 μl

Molecular weight standards: polystyrene standard (manufactured by TOSOH CORPORATION)

Structures of compounds were confirmed by measuring a molecular ion peak using mass spectrometry (Liquid Chromatography: Model 1100, manufactured by Agilent Technologies, Inc., Mass Spectrometry: Model LC/MSD, manufactured by Agilent Technologies, Inc.). The value of this molecular ion peak in the following Examples is indicated by "MASS".

Synthesis Example 1 [Synthesis of Compound Represented by Formula (I-1)]

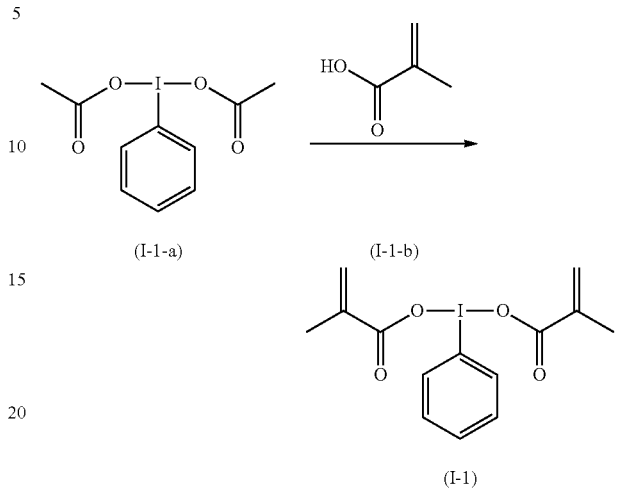

10 Parts of a compound represented by formula (I-1-a) and 50 parts of monochlorobenzene were mixed, followed by stirring at 23° C. for 30 minutes. To the mixed solution thus obtained, 10.7 parts of a compound represented by formula (I-1-b) was added, followed by stirring at 40° C. for 3 hours and further concentration. The reaction product thus obtained was mixed with 15 parts of chloroform and 60 parts of n-heptane, followed by stirring at 23° C. for 30 minutes and further filtration to obtain 9.18 parts of a compound represented by formula (I-1).

MS (mass spectrometry): 375.0 $[M+H]^+$

Synthesis Example 2 [Synthesis of Compound Represented by Formula (I-4)]

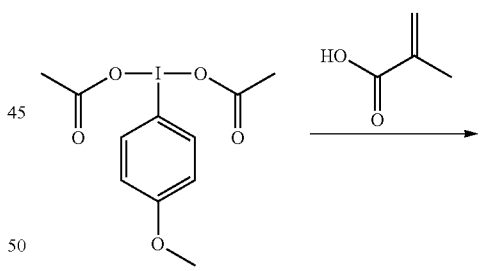

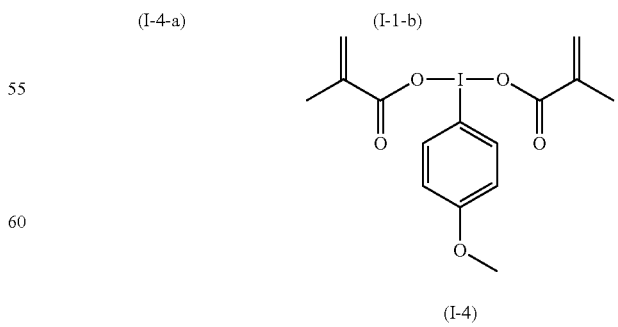

10.9 Parts of a compound represented by formula (I-4-a) and 50 parts of monochlorobenzene were mixed, followed by stirring at 23° C. for 30 minutes. To the mixed solution thus obtained, 10.7 parts of a compound represented by formula (I-1-b) was added, followed by stirring at 40° C. for 3 hours and further concentration. The reaction product thus obtained was mixed with 5 parts of chloroform and 50 parts of n-heptane, followed by stirring at 23° C. for 30 minutes and further filtration to obtain 8.28 parts of a compound represented by formula (I-4).

MS (mass spectrometry): 405.0 [M+H]$^+$

Synthesis Example 3 [Synthesis of Compound Represented by Formula (I-10)]

10 Parts of a compound represented by formula (I-1-a) and 50 parts of monochlorobenzene were mixed, followed by stirring at 23° C. for 30 minutes. To the mixed solution thus obtained, 25.6 parts of a compound represented by formula (I-10-b) was added, followed by stirring at 60° C. for 12 hours and further concentration. The reaction product thus obtained was mixed with 50 parts of n-heptane, followed by stirring at 23° C. for 30 minutes and further filtration to obtain 2.14 parts of a compound represented by formula (I-10).

MS (mass spectrometry): 615.0 [M+H]$^+$

Synthesis of Resin

Compounds (monomers) used in the synthesis of a resin are shown below.

(II-2-A-1-1)

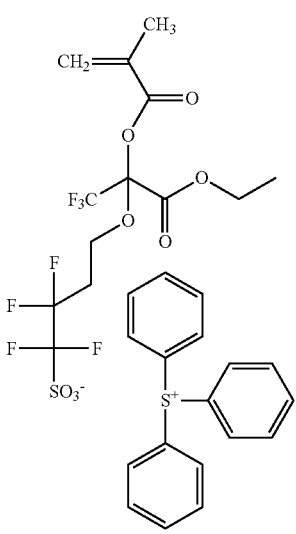

(I-1)

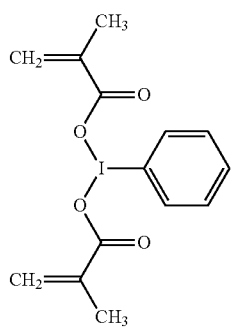

(I-4)

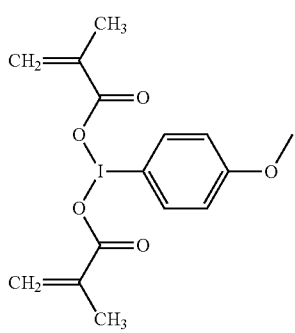

(I-10)

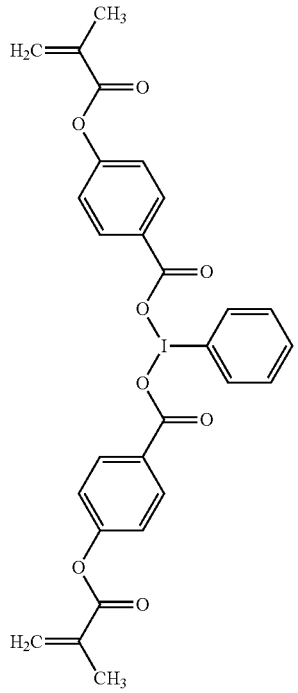

(IX-1)

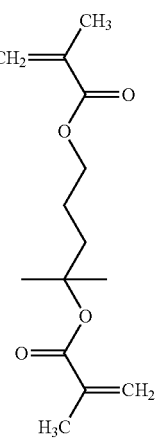

Hereinafter, these monomers are referred to as "monomer (a1-1-3)" according to the number of formula.

Example 1 [Synthesis of Resin A1]

Using a monomer (a1-1-3), a monomer (a1-2-9), a monomer (a2-1-3), a monomer (a3-2-1), a monomer (a3-1-1) and a monomer (I-1) as monomers, and these monomers were mixed in a molar ratio of 28:25:3:10:31:3 [monomer (a1-1-3):monomer (a1-2-9):monomer (a2-1-3):monomer (a3-2-1):monomer (a3-1-1):monomer (I-1)], and kethyl ethyl ketone was added in the amount of 1.5 mass times the total mass of all monomers to obtain a solution. To the solution thus obtained, azobisisobutyronitrile and azobis(2,4-dimethyl-valeronitrile) as initiators were added in the amounts of 1.5 mol % and 4.5 mol % based on the total molar number of all monomers, and then the mixture was heated at 75° C. for about 5 hours. The reaction mixture thus obtained was poured into a large amount of a methanol/water mixed solvent to precipitate a resin, and this resin was filtered.

After performing a purification operation in which the resin thus obtained is added to a methanol/water mixed solvent, followed by repulping and further filtration, twice, a copolymer having a weight-average molecular weight of $7.4 \times 10^3$ was obtained in a yield of 65%. This copolymer includes the following structural unit, and this is called a resin A1.

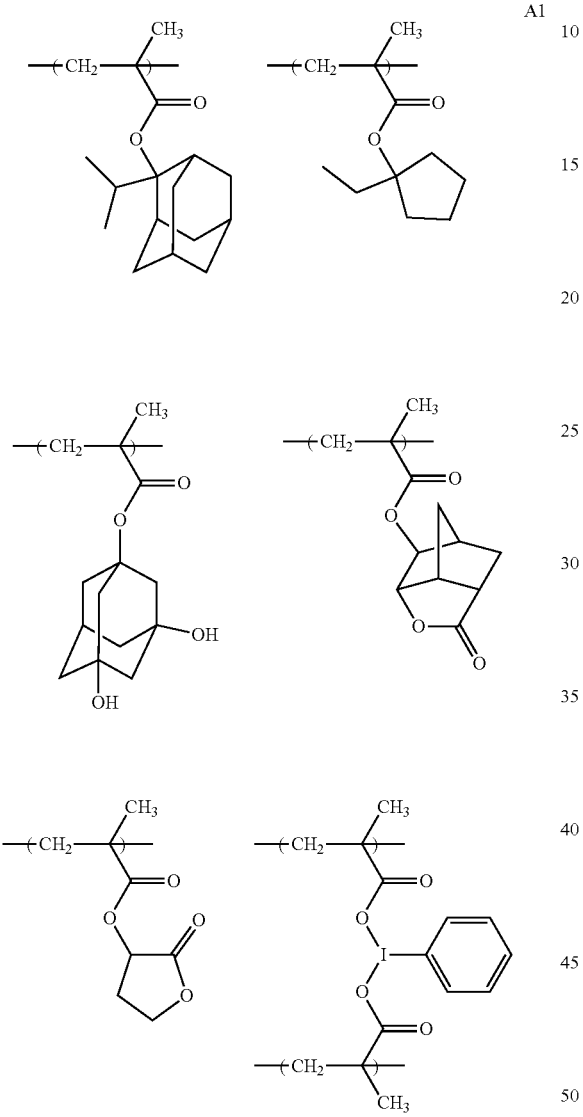

Example 2 [Synthesis of Resin A2]

Using a monomer (a1-1-3), a monomer (a1-2-9), a monomer (a2-1-3), a monomer (a3-2-1), a monomer (a3-1-1), monomer (II-2-A-1-1) and a monomer (I-1) as monomers, and these monomers were mixed in a molar ratio of 28:25:3:7:31:3:3 [monomer (a1-1-3):monomer (a1-2-9):monomer (a2-1-3):monomer (a3-2-1):monomer (a3-1-1):monomer (II-2-A-1-1):monomer (I-1)] and then, in the same manner as in resin A2, a copolymer having a weight-average molecular weight of $8.6 \times 10^3$ was obtained in a yield of 55%. This copolymer includes the following structural unit, and this is called a resin A2.

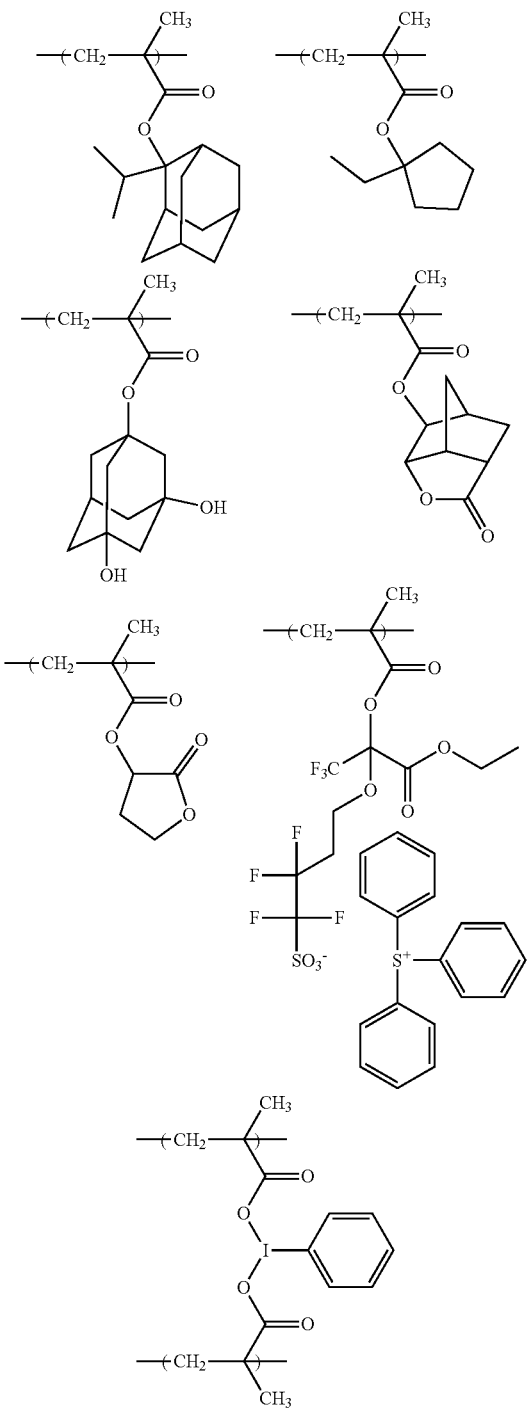

Example 3 [Synthesis of Resin A3]

Using a monomer (a1-1-3), a monomer (a1-2-9), a monomer (a2-1-3), a monomer (a3-2-1), a monomer (a3-1-1) and a monomer (I-4) as monomers, and these monomers were mixed in a molar ratio of 28:25:3:10:31:3 [monomer (a1-1-3):monomer (a1-2-9):monomer (a2-1-3):monomer (a3-2-1):monomer (a3-1-1):monomer (I-4)], and kethyl ethyl ketone was added in the amount of 1.5 mass times the total mass of all monomers to obtain a solution. To the solution thus obtained, azobisisobutyronitrile and azobis(2,4-dimethyl-valeronitrile) as initiators were added in the amounts of 1.5 mol % and 4.5 mol % based on the total molar number of all monomers, and then the mixture was heated at 75° C. for about 5 hours. The reaction mixture thus obtained was poured into a large amount of a methanol/water mixed solvent to precipitate a resin, and this resin was filtered. After performing a purification operation in which the resin thus obtained is added to a methanol/water mixed solvent, followed by repulping and further filtration, twice, a copolymer having a weight-average molecular weight of $7.6 \times 10^3$ was obtained in a yield of 61%. This copolymer includes the following structural unit, and this is called a resin A3.

poured into a large amount of a methanol/water mixed solvent to precipitate a resin, and this resin was filtered. After performing a purification operation in which the resin thus obtained is added to a methanol/water mixed solvent, followed by repulping and further filtration, twice, a copolymer having a weight-average molecular weight of $7.0 \times 10^3$ was obtained in a yield of 58%. This copolymer includes the following structural unit, and this is called a resin A4.

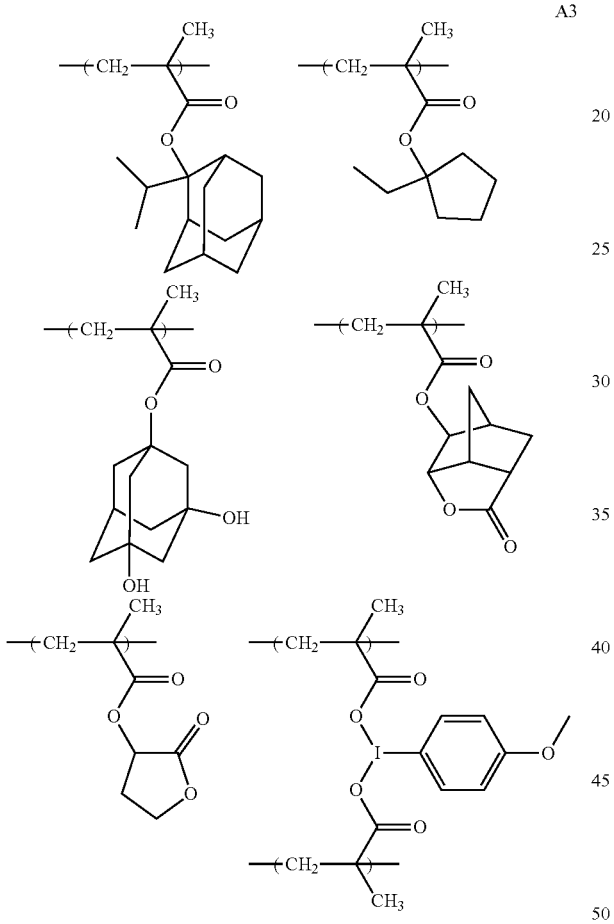

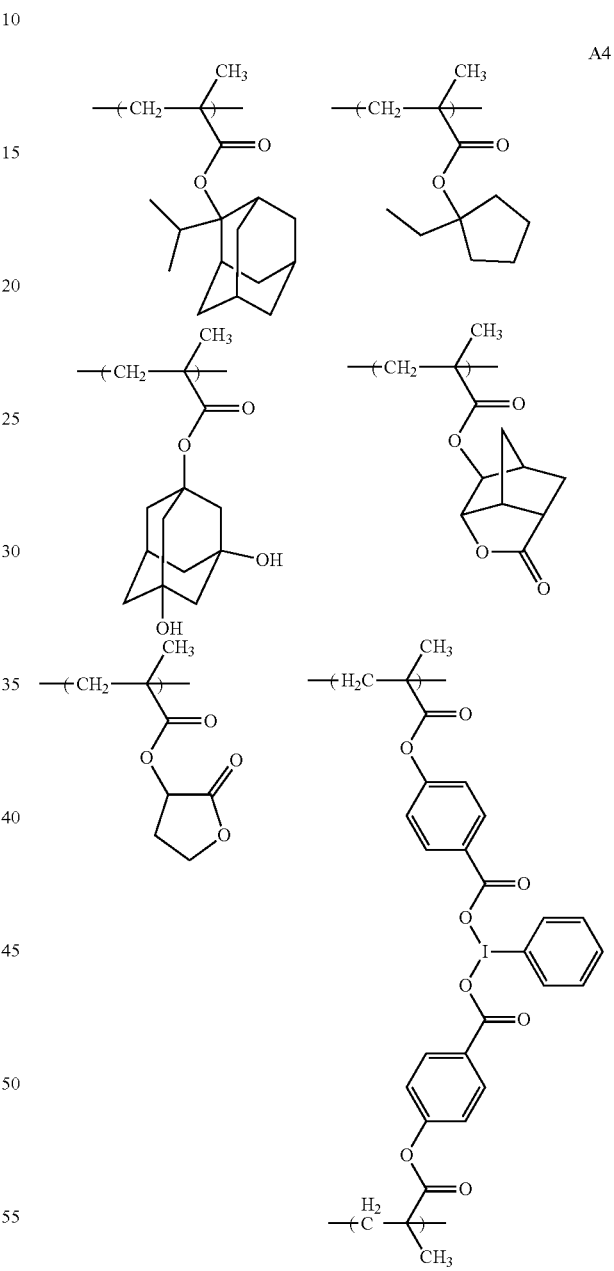

Example 4 [Synthesis of Resin A4]

Using a monomer (a1-1-3), a monomer (a1-2-9), a monomer (a2-1-3), a monomer (a3-2-1), a monomer (a3-1-1) and a monomer (I-10) as monomers, and these monomers were mixed in a molar ratio of 28:25:3:10:31:3 [monomer (a1-1-3):monomer (a1-2-9):monomer (a2-1-3):monomer (a3-2-1):monomer (a3-1-1):monomer (I-10)], and kethyl ethyl ketone was added in the amount of 1.5 mass times the total mass of all monomers to obtain a solution. To the solution thus obtained, azobisisobutyronitrile and azobis(2,4-dimethyl-valeronitrile) as initiators were added in the amounts of 1.5 mol % and 4.5 mol % based on the total molar number of all monomers, and then the mixture was heated at 75° C. for about 5 hours. The reaction mixture thus obtained was Synthesis Example 4 [Synthesis of Resin AX1]

Using a monomer (a1-1-3), a monomer (a1-2-9), a monomer (a2-1-3), a monomer (a3-2-1), a monomer (a3-1-1) and a monomer (IX-1) as monomers, and these monomers were mixed in a molar ratio of 28:25:3:10:31:3 [monomer (a1-1-3):monomer (a1-2-9):monomer (a2-1-3):monomer (a3-2-1):monomer (a3-1-1):monomer (IX-1)], and kethyl ethyl ketone was added in the amount of 1.5 mass times the total mass of all monomers to obtain a solution. To the solution thus obtained, azobisisobutyronitrile and azobis(2,4-dimethylvaleronitrile) as initiators were added in the amounts of 1.5 mol % and 4.5 mol % based on the total molar number of all monomers, and then the mixture was heated at 75° C. for about 5 hours. The reaction mixture thus obtained was poured into a large amount of a methanol/water mixed solvent to precipitate a resin, and this resin was filtered. After performing a purification operation in which the resin thus obtained is added to a methanol/water mixed solvent, followed by repulping and further filtration, twice, a copolymer having a weight-average molecular weight of $8.8 \times 10^3$ was obtained in a yield of 62%. This copolymer includes the following structural unit, and this is called a resin AX1.

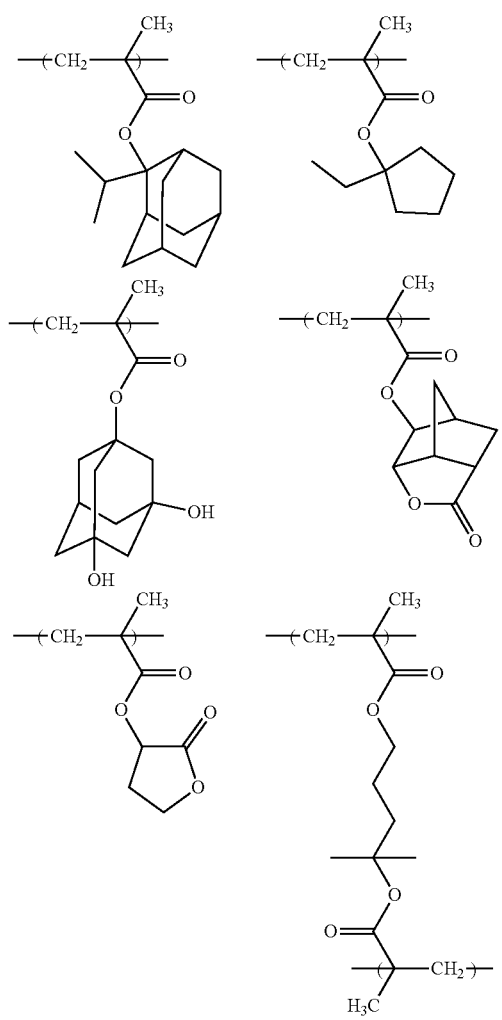

Synthesis Example 5 [Synthesis of Resin AX2]

Using a monomer (a5-x1), a monomer (a5-x2) and a monomer (IX-1) as monomers, and these monomers were mixed in a molar ratio of 65:35:5 [monomer (a5-x1):monomer (a5-x2):monomer (IX-1)], and propylene glycol monomethyl ether acetate was added in the amount of 1.5 mass times the total mass of all monomers to obtain a solution. To the solution thus obtained, azobisisobutyronitrile as an initiator was added in the amounts of 8 mol % based on the total molar number of all monomers, and then the mixture was heated at 75° C. for about 5 hours. The reaction mixture thus obtained was poured into a large amount of a methanol/water mixed solvent to precipitate a resin, and this resin was filtered. The resin thus obtained was poured into methanol again and, after repulping, this resin was filtered to obtain a resin AX2 (copolymer) having a weight-average molecular weight of $1.4 \times 10^4$ in a yield of 55%. This resin AX2 has the following structural unit.

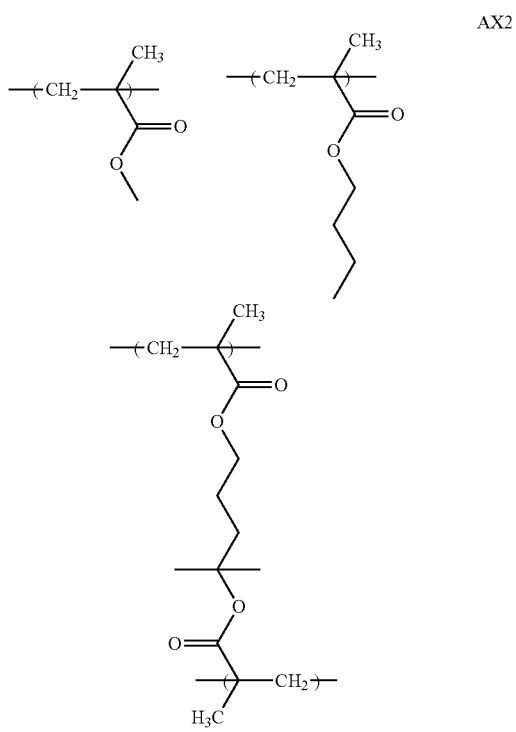

Synthesis Example 6 [Synthesis of Resin AX3]

Using a monomer (a1-1-3), a monomer (a1-2-9), a monomer (a2-1-3), a monomer (a3-2-1) and a monomer (a3-1-1) as monomers, and these monomers were mixed in a molar ratio of 28:25:3:10:34 [monomer (a1-1-3):monomer (a1-2-9):monomer (a2-1-3):monomer (a3-2-1):monomer (a3-1-1)], and kethyl ethyl ketone was added in the amount of 1.5 mass times the total mass of all monomers to obtain a solution. To the solution thus obtained, azobisisobutyronitrile and azobis(2,4-dimethylvaleronitrile) as initiators were added in the amounts of 1 mol % and 3 mol % based on the total molar number of all monomers, and then the mixture was heated at 75° C. for about 5 hours. The reaction mixture thus obtained was poured into a large amount of a methanol/water mixed solvent to precipitate a resin, and this resin was filtered. After performing a purification operation in which the resin thus obtained is added to a methanol/water mixed solvent, followed by repulping and further filtration, twice, a copolymer having a weight-average molecular weight of $7.5 \times 10^3$ was obtained in a yield of 65%. This copolymer includes the following structural unit, and this is called a resin AX3.

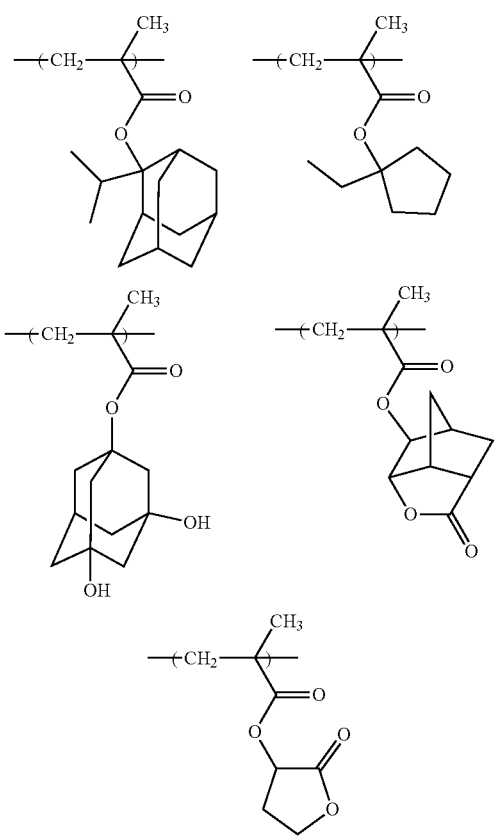

<Preparation of Resist Composition>

The following respective components were mixed in each amount (parts by mass) shown in Table 1 and dissolved in a solvent, and then the mixture was filtered through a fluororesin filter having a pore diameter of 0.2 μm to prepare resist compositions.

TABLE 1

| Resist composition | Resin | Acid generator | Quencher | PB/PEB |
|---|---|---|---|---|
| Composition 1 | A1 = 10 parts | B1-25 = 3.0 parts | C1 = 0.3 part | 100° C./110° C. |
| Composition 2 | A1 = 10 parts | B1-25 = 3.0 parts | D1 = 0.3 part | 100° C./110° C. |
| Composition 3 | A1 = 10 parts | B1-25 = 3.0 parts | D2 = 0.3 parts | 100° C./110° C. |
| Composition 4 | A2 = 10 parts | B1-25 = 1.0 part | C1 = 0.3 part | 100° C./110° C. |
| Composition 5 | A2 = 10 parts | — | C1 = 0.3 part | 100° C./110° C. |
| Composition 6 | A3 = 10 parts | B1-25 = 3.0 parts | C1 = 0.3 part | 100° C./110° C. |
| Composition 7 | A4 = 10 parts | B1-25 = 3.0 parts | C1 = 0.3 part | 100° C./110° C. |
| Comparative composition 1 | AX1 = 10 parts | B1-25= 3.0 parts | C1 = 0.3 part | 100° C./110° C. |
| Comparative composition 2 | AX2 = 10 parts | B1-25 = 3.0 parts | C1 = 0.3 part | 100° C./110° C. |
| Comparative composition 3 | AX3 = 10 parts | B1-25 = 3.0 parts | D2 = 0.3 part | 100° C./110° C. |

<Resin (A)>

A1 to A4, AX1, AX2: Resin A1 to Resin A4, Resin AX1, Resin AX2

<Acid Generator (B)>

B1-25: Salt represented by formula (B1-25); synthesized by the method mentioned in JP 2011-126869 A

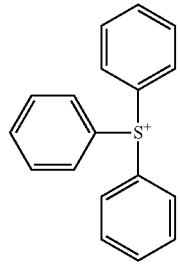

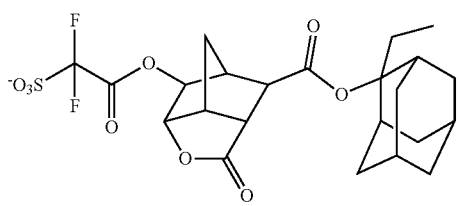

<Quencher (C)>

C1: synthesized by the method mentioned in JP 2011-39502 A

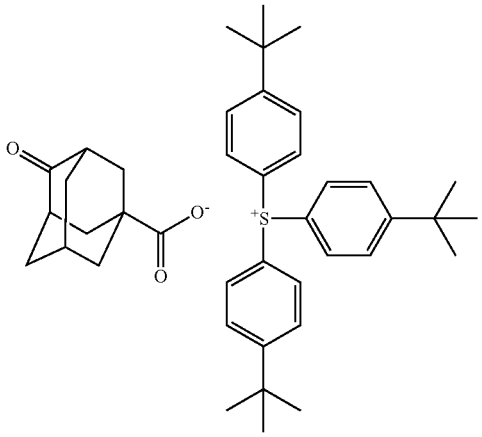 [SMILES: O=C1C2CC3CC1CC(C(=O)[O-])(C3)C2 ; CC(C)(C)c1ccc([S+](c2ccc(C(C)(C)C)cc2)c2ccc(C(C)(C)C)cc2)cc1]

D1: (manufactured by Tokyo Chemical Industry Co., Ltd.)

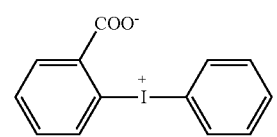

D2: synthesized in accordance with Examples of JP 2015-180928 A

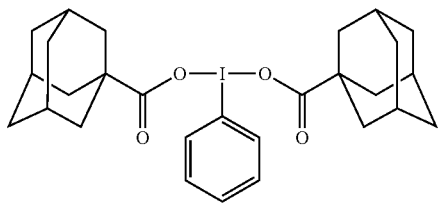 [SMILES: O=C(OI(OC(=O)C12CC3CC(CC(C3)C1)C2)c1ccccc1)C12CC3CC(CC(C3)C1)C2]

<Solvent (E)>
Propylene glycol monomethyl ether acetate 400 parts
Propylene glycol monomethyl ether 100 parts
γ-Butyrolactone 5 parts
(Evaluation of Exposure of Resist Composition with Electron Beam)

Each 6 inch-diameter silicon wafer was treated with hexamethyldisilazane on a direct hot plate at 90° C. for 60 seconds. A resist composition was spin-coated on the silicon wafer so that the thickness of the composition later became 0.04 μm. Subsequently, the coated silicon wafer was pre-baked on the direct hot plate at the temperature shown in the column "PB" of Table 1 for 60 seconds. Using an electron-beam direct-write system (HL-800D 50 keV, manufactured by Hitachi, Ltd.), line-and-space patterns were directly written on the composition layer formed on the wafer while changing the exposure dose stepwise.

After the exposure, post-exposure baking was performed on the hot plate at the temperature shown in the column "PEB" of Table 1 for 60 seconds, followed by paddle development with an aqueous 2.38% by mass tetramethylammonium hydroxide solution for 60 seconds to obtain a resist pattern.

The resist pattern (line-and-space pattern) thus obtained was observed by a scanning electron microscope and effective sensitivity was defined as the exposure dose at which the resist pattern with 60 nm-1:1 line and space patterns was obtained.

Evaluation of Line Edge Roughness (LER): Line edge roughness was determined by measuring a roughness width of the irregularity in wall surface of the resist pattern produced by the effective sensitivity using a scanning electron microscope. The results are shown in Table 2.

TABLE 2

|  | Resist composition | LER |
|---|---|---|
| Example 5 | Composition 1 | 3.96 |
| Example 6 | Composition 2 | 4.01 |
| Example 7 | Composition 3 | 4.00 |
| Example 8 | Composition 4 | 4.06 |
| Example 9 | Composition 5 | 4.18 |
| Example 10 | Composition 6 | 3.88 |
| Example 11 | Composition 7 | 4.02 |
| Comparative Example 1 | Comparative composition 1 | 4.74 |
| Comparative Example 2 | Comparative composition 2 | Not resolved |
| Comparative Example 3 | Comparative composition 3 | 4.43 |

INDUSTRIAL APPLICABILITY

A resin and a resist composition including the resin of the present invention exhibit satisfactory line edge roughness and are useful for fine processing of semiconductors.

The invention claimed is:

1. A resin comprising a structural unit derived from a compound represented by formula (I'):

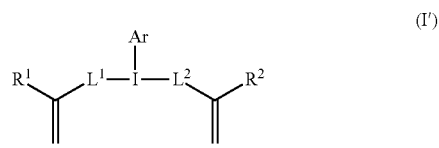

wherein, in formula (I'), $R^1$ and $R^2$ each independently represent an alkyl group having 1 to 6 carbon atoms which may have a halogen atom, a hydrogen atom or a halogen atom, Ar represents an aromatic hydrocarbon group having 6 to 24 carbon atoms which may have a substituent, and $L^1$ and $L^2$ each independently represent a group represented by any one of formula ($X^1$-1) to formula ($X^1$-8):

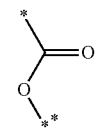

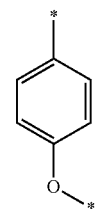

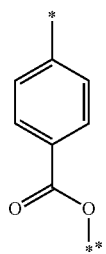

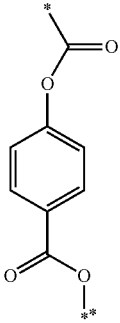

-continued (X¹-5)
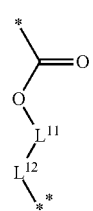

(X¹-6)
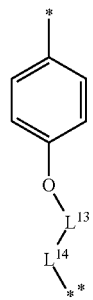

(X¹-7)
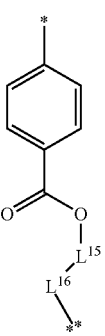

(X¹-8)
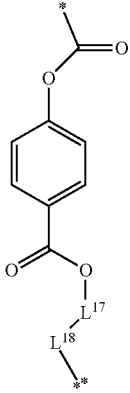

wherein, in formula (X¹-5) to formula (X¹-8),
$L^{11}$, $L^{13}$, $L^{15}$ and $L^{17}$ each independently represent an alkanediyl group having 1 to 6 carbon atoms,
$L^{12}$, $L^{14}$, $L^{16}$ and $L^{18}$ each independently represent —O—, —CO—, —CO—O—, —O—CO— or —O—CO—O—, and
* and  are bonds, and  represents a bond to an iodine atom.

2. The resin according to claim 1, further comprising a structural unit having an acid-labile group.

3. The resin according to claim 2, further comprising a structural unit which is decomposed upon exposure to radiation to generate an acid.

4. The resin according to claim 2, wherein the structural unit having an acid-labile group comprises at least one selected from the group consisting of a structural unit represented by formula (a1-0), a structural unit represented by formula (a1-1) and a structural unit represented by formula (a1-2):

(a1-0)
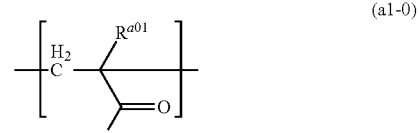

(a1-1)

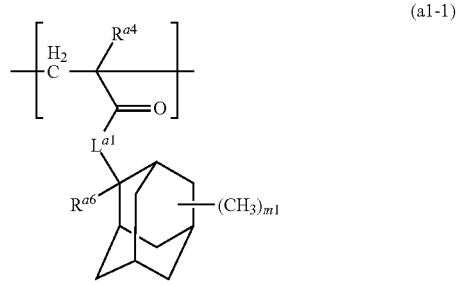

(a1-2)
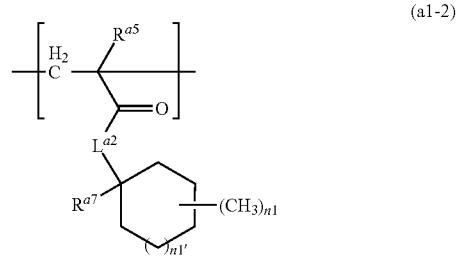

wherein, in formula (a1-0), formula (a1-1) and formula (a1-2),
$L^{a01}$, $L^{a1}$ and $L^{a2}$ each independently represent —O— or *—O—$(CH_2)_{k1}$—CO—O—, k1 represents an integer of 1 to 7, and * represents a bond to —CO—,
$R^{a01}$, $R^{a4}$ and $R^{a5}$ each independently represent a hydrogen atom or a methyl group,
$R^{a02}$, $R^{a03}$ and $R^{a04}$ each independently represent an alkyl group having 1 to 8 carbon atoms, an alicyclic hydrocarbon group having 3 to 18 carbon atoms or a group obtained by combining these groups,
$R^{a6}$ and $R^{a7}$ each independently represent an alkyl group having 1 to 8 carbon atoms, an alicyclic hydrocarbon group having 3 to 18 carbon atoms or a group obtained by combining these groups,
m1 represents an integer of 0 to 14,
n1 represents an integer of 0 to 10, and
n1' represents an integer of 0 to 3.

5. The resin according to claim 1, wherein Ar represents an aromatic hydrocarbon group having 6 to 24 carbon atoms which may have a hydroxy group, a nitro group, a halogen atom, a cyano group, an alkyl group having 1 to 12 carbon atoms, an alicyclic hydrocarbon group having 3 to 12 carbon atoms or an alkoxy group having 1 to 12 carbon atoms.

6. The resin according to claim 1, further comprising at least one selected from the group consisting of a structural unit represented by formula (a2-A) and a structural unit represented by formula (a2-1):

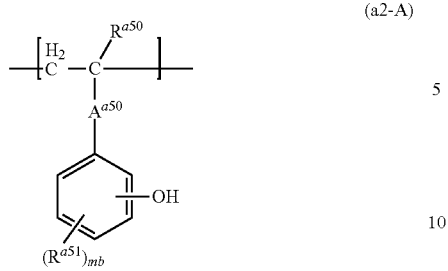

(a2-A)

wherein, in formula (a2-A),
- $R^{a50}$ represents a hydrogen atom, a halogen atom or an alkyl group having 1 to 6 carbon atoms which may have a halogen atom,
- $R^{a51}$ represents a halogen atom, a hydroxy group, an alkyl group having 1 to 6 carbon atoms, an alkoxy group having 1 to 6 carbon atoms, an acyl group having 2 to 4 carbon atoms, an acyloxy group having 2 to 4 carbon atoms, an acryloyloxy group or a methacryloyloxy group,
- $A^{a50}$ represents a single bond or *—$X^{a51}$-($A^{a52}$-$X^{a52}$)$_{na}$—, and * represents a bond to carbon atoms to which —Ra50 is bonded,
- $A^{a52}$ represents an alkanediyl group having 1 to 6 carbon atoms,
- $X^{a51}$ and $X^{a52}$ each independently represent —O—, —CO—O— or —O—CO—,
- na represents 0 or 1, and
- mb represents an integer of 0 to 4, and when mb is an integer of 2 or more, a plurality of $R^{a51}$ may be the same or different from each other,

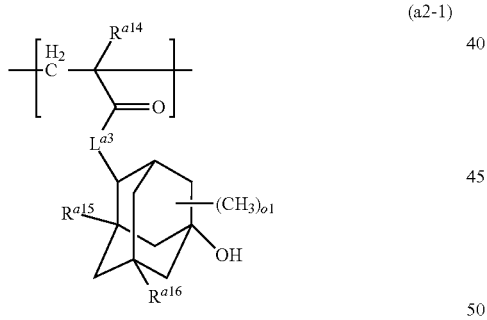

(a2-1)

wherein, in formula (a2-1),
- $L^{a3}$ represents —O— or *—O—$(CH_2)_{k2}$—CO—O—,
- k2 represents an integer of 1 to 7, and * represents a bond to —CO—,
- $R^{a14}$ represents a hydrogen atom or a methyl group,
- $R^{a15}$ and $R^{a16}$ each independently represent a hydrogen atom, a methyl group or a hydroxy group, and
- o1 represents an integer of 0 to 10.

7. The resin according to claim 1, further comprising at least one selected from the group consisting of a structural unit represented by formula (a3-1), a structural unit represented by formula (a3-2), a structural unit represented by formula (a3-3) and a structural unit represented by formula (a3-4):

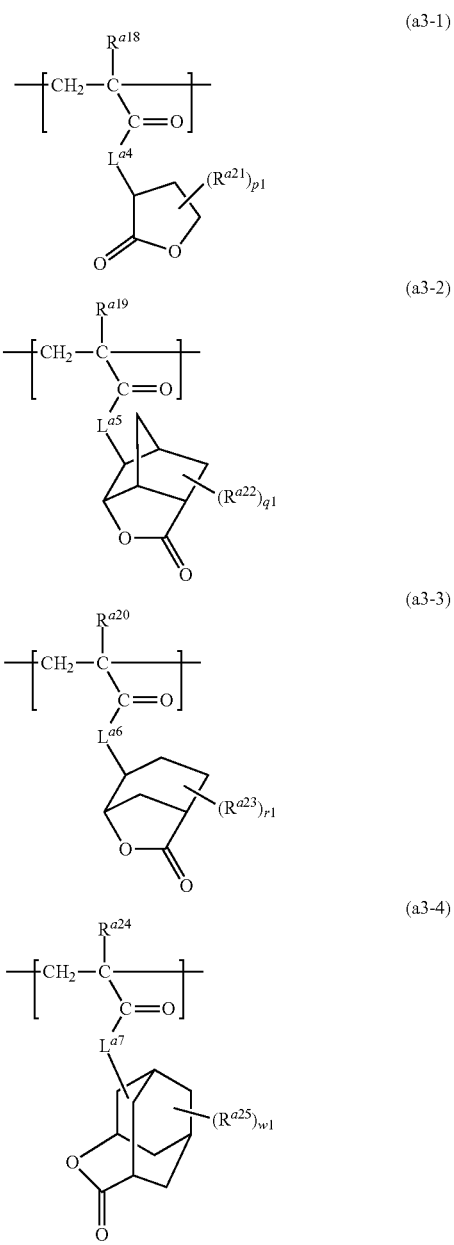

wherein, in formula (a3-1), formula (a3-2), formula (a3-3) and formula (a3-4),
- $L^{a4}$, $L^{a5}$ and $L^{a6}$ represent —O— or a group represented by *—O—$(CH_2)_{k3}$—CO—O— (k3 represents an integer of 1 to 7),
- $L^{a7}$ represents —O—, *—O-$L^{a8}$*—O-$L^{a8}$-CO—O—, *—O-$L^{a8}$-CO—O-$L^{a9}$-CO—O— or *—O-$L^{a8}$-O—CO-$L^{a9}$-O—,
- $L^{a8}$ and $L^{a9}$ each independently represent an alkanediyl group having 1 to 6 carbon atoms,
- * represents a bond to a carbonyl group,
- $R^{a18}$, $R^{a19}$ and $R^{a20}$ represent a hydrogen atom or a methyl group,
- $R^{a24}$ represents an alkyl group having 1 to 6 carbon atoms which may have a halogen atom, a hydrogen atom or a halogen atom,
- $R^{a21}$ represents an aliphatic hydrocarbon group having 1 to 4 carbon atoms, $R^{a22}$, $R^{a23}$ and $R^{a25}$ represent a carboxy group, a cyano group or an aliphatic hydrocarbon group having 1 to 4 carbon atoms, p1 represents an integer of 0 to 5, q1 represents an integer of 0 to 3, r1 represents an integer of 0 to 3, w1 represents an integer of 0 to 8, and when p1, q1, r1 and/or w1 is/are 2 or more, a plurality of $R^{a21}$, $R^{a22}$, $R^{a23}$ and/or $R^{a25}$ may be the same or different from each other.

8. A resist composition comprising the resin according to claim 1 and an acid generator.

9. The resist composition according to claim 8, further comprising a salt generating an acid having an acidity lower than that of an acid generated from the acid generator.

10. The resist composition according to claim 8, wherein the acid generator comprises a salt represented by formula (B1):

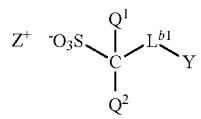
(B1)

wherein, in formula (B1), $Q^1$ and $Q^2$ each independently represent a fluorine atom or a perfluoroalkyl group having 1 to 6 carbon atoms, $L^{b1}$ represents a divalent saturated hydrocarbon group having 1 to 24 carbon atoms which may have a substituent, —$CH_2$— included in the divalent saturated hydrocarbon group may be replaced by —O— or —CO—, and a hydrogen atom included in the divalent saturated hydrocarbon group may be substituted with a fluorine atom or a hydroxyl group, Y represents a hydrogen atom or an alicyclic hydrocarbon group having 3 to 18 carbon atoms which may have a substituent, and –$CH_2$— included in the alicyclic hydrocarbon group may be replaced by —O—, —$S(O)_2$— or —CO—, and $Z^+$ represents an organic cation.

11. The resist composition comprising the resin according to claim 3.

12. A method for producing a resist pattern, which comprises:

(1) a step of applying the resist composition according to claim 8 on a substrate, (2) a step of drying the applied composition to form a composition layer, (3) a step of exposing the composition layer, (4) a step of heating the exposed composition layer, and (5) a step of developing the heated composition layer.

* * * * *